(12) United States Patent
Yamazaki et al.

(10) Patent No.: US 8,916,230 B2
(45) Date of Patent: Dec. 23, 2014

(54) METHOD FOR MANUFACTURING DISPLAY DEVICE

(75) Inventors: Shunpei Yamazaki, Tokyo (JP); Hironobu Shoji, Tokyo (JP); Ikuko Kawamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 145 days.

(21) Appl. No.: 13/284,584

(22) Filed: Oct. 28, 2011

(65) Prior Publication Data

US 2012/0045894 A1 Feb. 23, 2012

Related U.S. Application Data

(62) Division of application No. 11/823,410, filed on Jun. 27, 2007, now Pat. No. 8,048,473.

(30) Foreign Application Priority Data

Jul. 4, 2006 (JP) .................................. 2006-184713

(51) Int. Cl.
H01L 21/00 (2006.01)
H01L 27/12 (2006.01)

(52) U.S. Cl.
CPC ........ *H01L 27/1214* (2013.01); *H01L 27/1288* (2013.01)
USPC ......................................................... 427/64

(58) Field of Classification Search
CPC ................................................ H01L 21/31105
USPC .......................................................... 427/64
See application file for complete search history.

(56) References Cited

U.S. PATENT DOCUMENTS

| | | | |
|---|---|---|---|
| 4,929,995 A * | 5/1990 | Gifford | ......................... 257/530 |
| 5,968,441 A | 10/1999 | Seki | |
| 6,555,409 B2 | 4/2003 | Kim et al. | |
| 6,943,367 B2 | 9/2005 | Kim et al. | |
| 7,005,670 B2 | 2/2006 | Kim et al. | |
| 7,598,129 B2 | 10/2009 | Kanno et al. | |
| 7,834,948 B2 | 11/2010 | Takeda et al. | |
| 7,939,132 B2 | 5/2011 | Toyoda | |

(Continued)

FOREIGN PATENT DOCUMENTS

| | | |
|---|---|---|
| JP | 1-296623 | 11/1989 |
| JP | 6-349823 | 12/1994 |

(Continued)

OTHER PUBLICATIONS

Office Action re Korean application No. KR 10-2012-0072774, dated Sep. 3, 2013 (with English translation).

*Primary Examiner* — Robert Vetere
(74) *Attorney, Agent, or Firm* — Husch Blackwell LLP

(57) ABSTRACT

When a mask layer is formed, a first liquid composition containing a mask-layer-forming material is applied on an outer side of a pattern that is desired to be formed (corresponding to a contour or an edge portion of a pattern) to form a first mask layer having a frame shape. A second liquid composition containing a mask-layer-forming material is applied so as to fill a space inside the first mask layer having a frame shape to form a second mask layer. The first mask layer and the second mask layer are formed to be in contact with each other, and the first mask layer is formed to surround the second mask layer. Therefore, the first mask layer and the second mask layer can be used as one continuous mask layer.

20 Claims, 38 Drawing Sheets

(56) References Cited

U.S. PATENT DOCUMENTS

| | | |
|---|---|---|
| 2001/0006408 A1 | 7/2001 | Matsuyama et al. |
| 2005/0236975 A1* | 10/2005 | Addington et al. ........... 313/504 |
| 2006/0040435 A1 | 2/2006 | Morisue et al. |
| 2007/0077349 A1* | 4/2007 | Newman et al. ................ 427/66 |
| 2007/0145002 A1 | 6/2007 | Street |

FOREIGN PATENT DOCUMENTS

| | | |
|---|---|---|
| JP | 11-188495 | 7/1999 |
| JP | 2000-133636 | 5/2000 |
| JP | 2002-55362 | 2/2002 |
| JP | 2002-158282 | 5/2002 |
| JP | 2002-164591 | 6/2002 |
| JP | 2003-126760 | 5/2003 |
| JP | 2004-98012 | 4/2004 |
| JP | 2004-151428 | 5/2004 |
| JP | 2005-167229 | 6/2005 |
| JP | 2005-198085 | 7/2005 |
| JP | 2006-212476 | 8/2006 |
| KR | 2002-0018886 | 3/2002 |
| WO | WO 2005/048223 A1 | 5/2005 |
| WO | WO 2005/121884 A1 | 12/2005 |

* cited by examiner

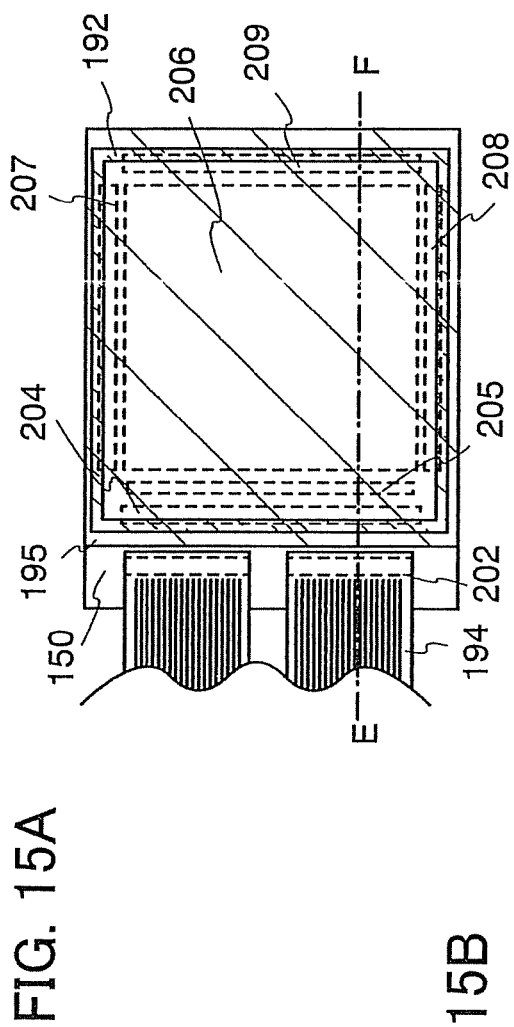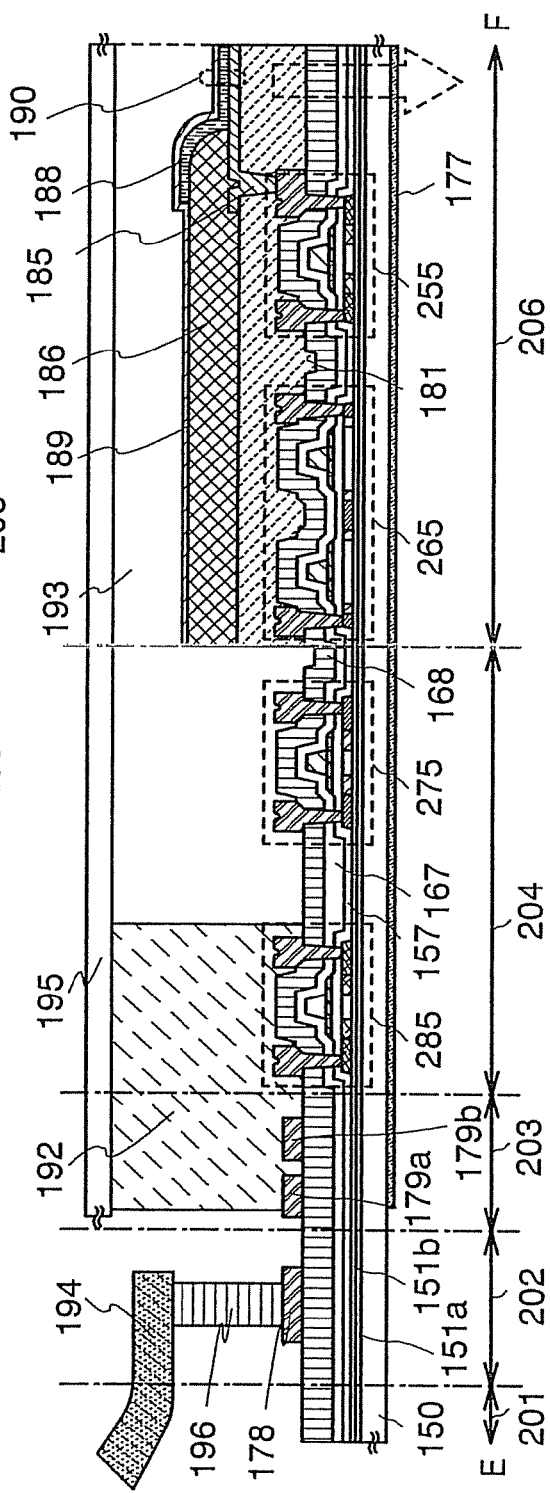
FIG. 15A
FIG. 15B 300 302 301a1 301a2 301a3 301b

METHOD FOR MANUFACTURING DISPLAY DEVICE

This application is a divisional of U.S. application Ser. No. 11/823,410, now U.S. Pat. No. 8,048,473 filed on Jun. 27, 2007.

BACKGROUND OF THE INVENTION

1. Field of the Invention

The present invention relates to a method for manufacturing a display device, using a printing method.

2. Description of the Related Art

In a thin film transistor (hereinafter also referred to as a TFT) and an electronic circuit using the thin film transistor, various thin films such as a semiconductor film, an insulating film, and a conductive film are stacked over a substrate, and they are appropriately formed into predetermined patterns by a photolithography technique. The photolithography technique is a technique in which a pattern of a circuit or the like which is formed using a material that does not transmit light over a transparent flat plate, which is referred to as a photomask, is transferred to an aimed substrate by using light. The photolithography technique is widely used in a manufacturing process of a semiconductor integrated circuit and the like.

The conventional manufacturing process using the photolithography technique requires multiple steps such as exposure, development, baking, and peeling only for treating a mask pattern formed by using a photosensitive organic resin material that is referred to as a photoresist. Therefore, the manufacturing cost is inevitably increased as the number of the photolithography steps is increased. In order to solve this problem, it has been attempted to manufacture TFTs with the lower number of photolithography steps (refer to Patent Document 1: Japanese Published Patent Application No. 2000-133636). In Patent Document 1, a resist mask formed in a photolithography step is used once, and then reused as a resist mask having a different shape by expanding its volume by swelling.

SUMMARY OF THE INVENTION

It is an object of the present invention to provide a technique for manufacturing a TFT, an electronic circuit using the TFT, and a display device formed using the TFT with a high yield at low cost, in which the number of photolithography steps is reduced and the manufacturing process is simplified, even in the case of a large substrate having a side of 1 meter or more.

Further, it is another object of the present invention to provide a technique for forming a component such as a wiring included in the display device into a desired shape with high controllability.

In the present invention, a mask layer used in processing a thin film into a desired pattern is selectively formed so as to have a desired shape without using a photolithography step. In particular, since the shape of the mask layer greatly affects the shape of a thin film processed, a defective shape and lack of controllability such as deformation or displacement in formation of a mask layer can cause a reduction in yield and reliability of a display device that is obtained.

In the present invention, a liquid composition is applied to a region where a mask layer is to be formed and solidified by baking, drying, and the like to form the mask layer. In the case of such a method, the liquid composition needs to be applied to the formation region in a minute and precise pattern to improve precision of the shape or formation region of the mask layer. In particular, when a mask layer for a wiring layer for forming a circuit is formed, displacement of a region where the wiring layer is formed adversely affects electric characteristics, and for example, a short circuit may be caused.

Therefore, in a method for forming a mask layer shown in the present invention, a mask layer is formed through at least two steps. When the mask layer is formed, a first liquid composition containing a mask-layer-forming material is applied on an outer side of a pattern that is desired to be formed (corresponding to a contour or an edge portion of a pattern), and a first mask layer having a frame shape is formed. The first mask layer is preferably a closed region like a frame. Next, a second liquid composition containing a mask-layer-forming material is applied so as to fill a space inside the first mask layer having a frame shape, and a second mask layer is formed. The first mask layer and the second mask layer are formed so as to be in contact with each other, and the first mask layer is formed so as to surround the second mask layer. Therefore, the first mask layer and the second mask layer can be used as one continuous mask layer.

When a mask layer or the like is formed using a liquid composition, a shape of a mask layer that is formed is greatly influenced by the viscosity of a composition, drying conditions in solidification (such as temperature or pressure), wettability with respect to a formation region, and the like. Therefore, with low viscosity or high wettability with respect to a formation region, a liquid composition spreads over a formation region. On the other hand, with high viscosity or low wettability with respect to a formation region, space (also referred to as pin holes) and unevenness are formed in or on the surface of the mask layer, and a level of planarity is decreased.

Therefore, in the present invention, when the first mask layer which determines the contour of the formation region of the mask layer is formed by applying a composition with relatively high viscosity and low wettability with respect to a formation region, a side edge portion which becomes a contour of a desired pattern can be formed with high controllability. When a composition with low viscosity and high wettability with respect to a formation region is applied inside a frame formed of the first mask layer, a mask layer with high planarity and uniformity, and with less space, unevenness, and the like due to bubbles and the like in or on its surface, can be formed. Therefore, by separate formation of an outer-side mask layer and an inner-side mask layer, a mask layer that has a high level of planarity, less defects, and a desired pattern can be formed with high controllability.

When conductive layers are electrically connected with an insulating layer interposed therebetween, an opening (so called contact hole) is formed in the insulating layer. In this case, a mask layer is not formed over the insulating layer, and the opening is selectively formed by laser beam irradiation. A first conductive layer is formed, an insulating layer is stacked over the first conductive layer, and a region where the opening is formed in the stacked first conductive layer and insulating layer is selectively irradiated with a laser beam from the insulating layer side. The laser beam is transmitted through the insulating layer and absorbed by the first conductive layer. The first conductive layer is heated by energy of the absorbed laser beam and evaporated, and the insulating layer that is stacked thereover is broken. Therefore, the opening is formed in the first conductive layer and the insulating layer, and part of the conductive layer below the insulating layer is exposed on the side wall and the bottom (or only on the side wall) of the opening. By formation of a second conductive layer in the opening so as to be in contact with the exposed first conductive layer, the first and second conductive layers can be electrically connected to each other with the insulating layer interposed therebetween. In other words, in the present invention, the conductive layer is irradiated with a laser beam, an irradiated region of the conductive layer with a laser beam is evaporated by laser ablation, and the opening is formed in the insulating layer that is formed over the conductive layer.

Since the opening can be selectively formed by a laser beam, a mask layer does not need to be formed, and the steps and materials can be reduced. In addition, there are advantages that a conductive layer and an insulating layer to be processed can be formed into a predetermined shape with high precision since the laser beam can be condensed into a very small spot, and the regions other than the processing region do not need to be heated substantially since heating is performed in a short time by the laser beam.

The present invention can also be applied to a display device that is a device having a display function, and the display device using the present invention includes a light-emitting display device in which a light-emitting element including a layer containing an organic material, an inorganic material, or a mixture of an organic material and an inorganic material, which exhibits light emission called electroluminescence (hereinafter also refereed to as EL) and interposed between electrodes is connected to a TFT; a liquid crystal display device using a liquid crystal element containing a liquid crystal material as a display element; and the like.

One aspect of the present invention is a method for manufacturing a display device, including the steps of forming a conductive film, forming a first mask layer having a frame shape over the conductive film by discharging a first composition containing a mask-forming material; limning a second mask layer inside a frame formed of the first mask layer by discharging a second composition containing a mask-forming material in a region surrounded by the first mask layer having a frame shape; and forming a conductive layer by processing the conductive film using the first mask layer and the second mask layer.

Another aspect of the present invention is a method for manufacturing a display device, including the steps of forming a conductive film; forming a first mask layer having a frame shape over the conductive film by discharging a first composition containing a mask-forming material; forming a second mask layer inside a frame formed of the first mask layer by discharging a second composition containing a mask-forming material in a region surrounded by the first mask layer having a frame shape; and forming a conductive layer by processing the conductive film using the first mask layer and the second mask layer. The viscosity of the first composition containing a mask-forming material is higher than the viscosity of the second composition containing a mask-forming material.

Another aspect of the present invention is a method for manufacturing a display device, including the steps of forming a conductive film; forming a first mask layer having a frame shape over the conductive film by discharging a first composition containing a mask-forming material; forming a second mask layer inside a frame formed of the first mask layer by discharging a second composition containing a mask-forming material in a region surrounded by the first mask layer having a frame shape; and forming a conductive layer by processing the conductive film using the first mask layer and the second mask layer. Wettability of the first composition containing a mask-forming material with respect to the conductive film is lower than wettability of the second composition containing a mask-forming material with respect to the conductive film.

In the above aspects, the first composition containing a mask-forming material and the second composition containing a mask-forming material may be continuously discharged or intermittently discharged in a droplet state. For example, when the first mask layer positioned on the outer side of the mask layer in a frame shape is formed, the first composition containing a mask-forming material may be continuously discharged, whereas, when the second mask layer is formed so as to fill inside the frame formed of the first mask layer, the second composition containing a mask-forming material may be intermittently discharged. In such a manner, a method for discharging a liquid composition may be varied depending on a pattern to be formed.

In addition, the first mask layer and the second mask layer formed in different steps may have almost the same thickness or different thicknesses. For example, the first mask layer formed in the first step has a frame shape, and the second composition containing a mask-forming material is discharged to have a height (thickness) lower than that of the frame of the first mask layer, and the second mask layer is formed, whereby the thickness of the first mask layer can be larger than that of the second mask layer.

The conductive layer formed as described above can be used as any conductive layer included in the display device. For example, the conductive layer can be used for a wiring layer, a gate electrode layer, a source electrode layer, a drain electrode layer, a pixel electrode layer, and the like. In addition, a method for manufacturing a mask layer, for example, for manufacturing the first mask layer having a frame shape and the second mask layer inside the frame formed of the first mask layer, can be freely used in processing into a desired shape in a display device other than processing of the conductive film. For example, the method can also be used for pattern processing of a semiconductor layer, an insulating layer functioning as a partition wall, or the like.

Another aspect of the present invention is a method for manufacturing a display device, including the steps of forming a conductive layer; forming an insulating layer over the conductive layer; forming an opening in the conductive layer and the insulating layer by selectively irradiating the conductive layer and the insulating layer with a laser beam to remove part of an irradiated region of the conductive layer and an irradiated region of the insulating layer; and forming a conductive film in the opening so as to be in contact with the conductive layer.

Another aspect of the present invention is a method for manufacturing a display device, including the steps of forming a first conductive layer; forming a second conductive layer over the first conductive layer; forming an insulating layer over the first conductive layer and the second conductive layer; forming an opening in the second conductive layer and the insulating layer by selectively irradiating the first conductive layer, the second conductive layer, and the insulating layer with a laser beam to remove an irradiated region of the second conductive layer and an irradiated region of the insulating layer; and forming a conductive film in the opening so as to be in contact with the first conductive layer and the second conductive layer.

In the above aspects, the conductive layer in which the opening is formed can be formed using at least one of chromium, molybdenum, nickel, titanium, cobalt, copper, and aluminum. Further, the insulating layer in which the opening is formed can be formed using a material which transmits the laser beam therethrough, such as a light-transmitting organic resin.

In accordance with the present invention, a component such as a wiring included in a display device or the like can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

BRIEF DESCRIPTION OF THE DRAWINGS

In the accompanying drawings:

FIGS. 1A1 to 1E2 are explanatory conceptual views of the present invention;

FIGS. 13A to 13C are explanatory views of a method for manufacturing a display device of the present invention;

FIGS. 15A and 15B are explanatory views of a display device of the present invention;

DESCRIPTION OF THE INVENTION

Figure 1:
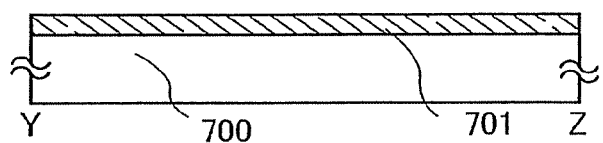
Figure 1:
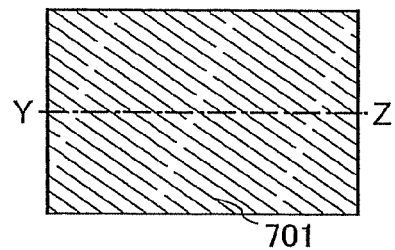
Figure 1:
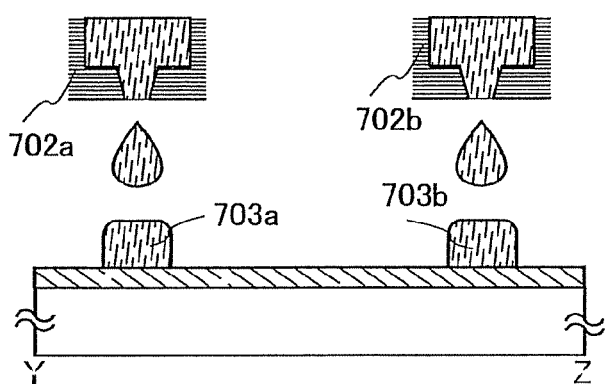
Figure 1:
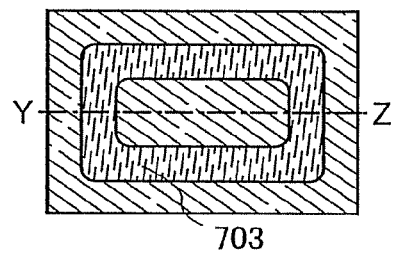
Figure 1:
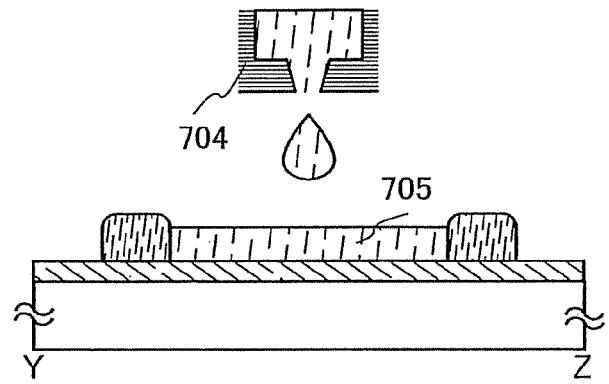
Figure 1:
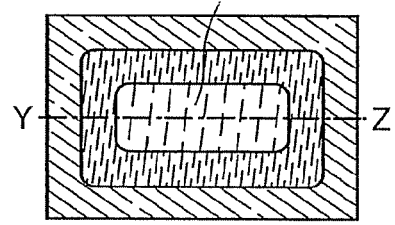
Figure 1:
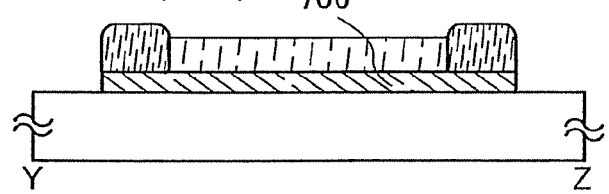
Figure 1:
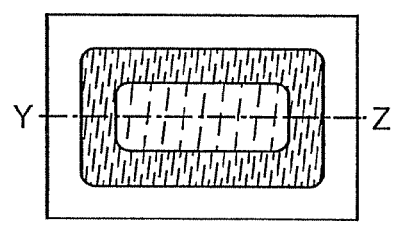
Figure 1:
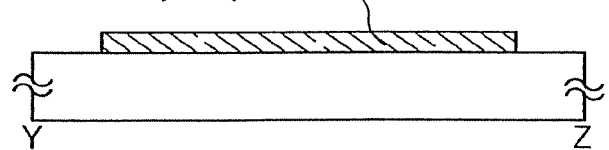
Figure 1:
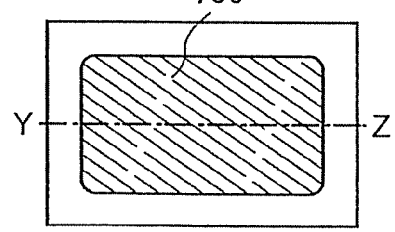

Embodiment modes of the present invention will be described in detail with reference to the accompanying drawings. It is to be noted that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. In a structure of the present invention to be given below, the same portions or portions having similar functions are denoted by the same reference numerals in different drawings, and explanation thereof will be omitted.

Embodiment Mode 1

In this embodiment mode, a method for manufacturing a highly reliable display device through a simplified process at low cost will be described with reference to FIGS. 1A1 to 1E2, and 2A to 2C.

In accordance with the present invention, a display device is manufactured in such a way that at least one of components necessary for forming a display device or the like, such as a conductive layer for forming a wiring layer or an electrode or a mask layer for formation into a desired pattern is formed by a method by which the components can be selectively formed into a desired shape. In the present invention, the components (also called patterns) are a conductive layer such as a wiring layer, a gate electrode layer, a source electrode layer, or a drain electrode layer, a semiconductor layer, a mask layer, an insulating layer, and the like included in a thin film transistor or a display device and include all the components formed to have a predetermined shape. As the method by which an object can be selectively formed into a desired pattern, a droplet discharging (jetting) method (also called an ink jet method depending on its system) by which a conductive layer, an insulating layer, or the like can be formed into a predetermined pattern by selectively discharging (jetting) a droplet of a composition which is mixed for a particular purpose is used. In addition, a method by which a component can be formed into a desired pattern by transferring or drawing, for example, various printing methods (a method for forming a component into a desired pattern, such as screen (mimeograph) printing, offset (planograph) printing, relief printing, or gravure (intaglio) printing), a dispenser method, a selective-coating method, or the like can also be used.

In this embodiment mode, a method for forming a component into a desired pattern by discharging (jetting) a composition containing a component-forming material which is a fluid as a droplet is used. In a region where the component is to be formed, the droplet containing the component-forming material is discharged, and solidified by baking, drying, or the like, whereby the component is formed into a desired pattern.

Figure 30:
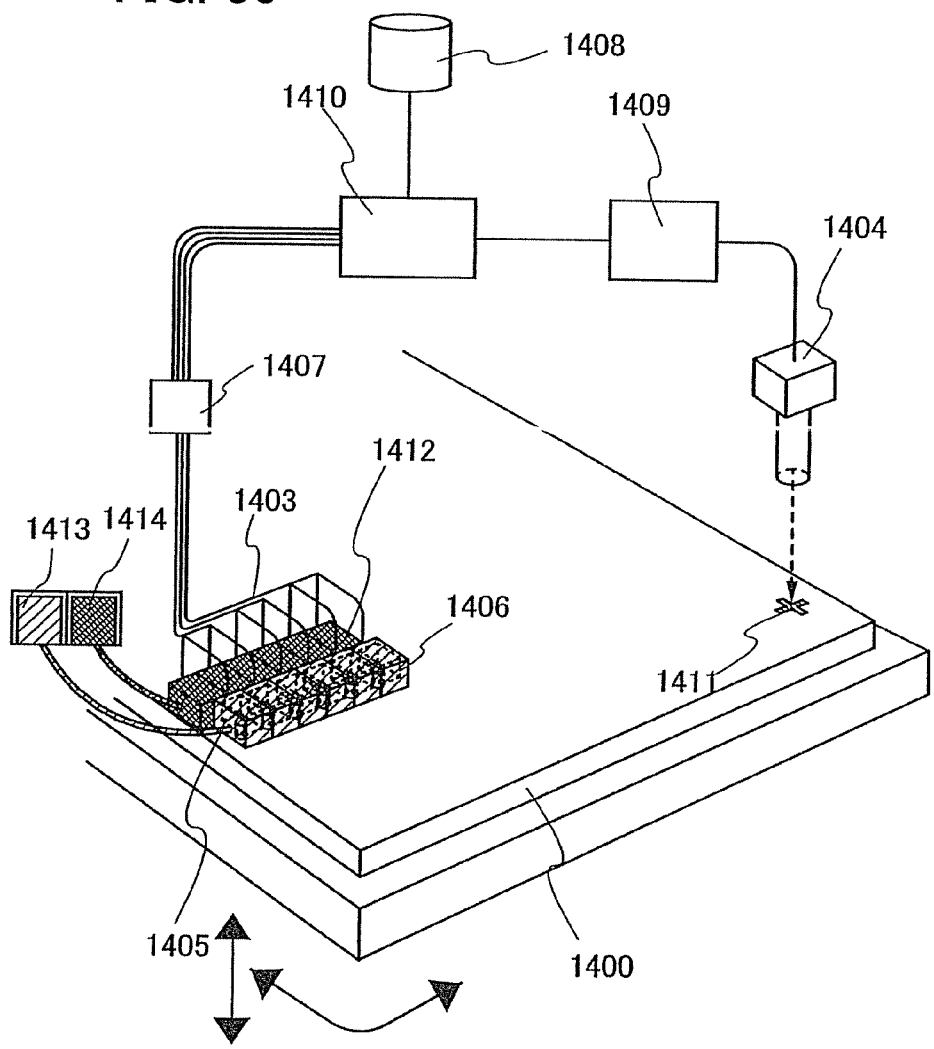
FIG. 30 is an explanatory view of a structure of a droplet discharging apparatus which can be applied to the present invention.

One mode of a droplet discharging apparatus used for a droplet discharging method is shown in FIG. 30. Each of heads 1405 and 1412 of a droplet discharging unit 1403 is connected to a control device 1407, and this control device 1407 is controlled by a computer 1410, whereby a preprogrammed pattern can be drawn. The formation position may be determined, for example, based on a marker 1411 that is formed over a substrate 1400. Alternatively, a reference point may be fixed based on the edge of the substrate 1400. The reference point is detected by an imaging device 1404, and changed into a digital signal using an image processing unit 1409. Then, the digital signal is recognized by the computer 1410, the computer 1410 generates a control signal, and the control signal is transmitted to the control device 1407. An image sensor or the like using a charge coupled device (CCD) or a complementary metal oxide semiconductor can be used for the imaging device 1404. Data about a pattern to be formed over the substrate 1400 is stored in a storage medium 1408, and the control signal is transmitted to the control device 1407 based on the data, so that each of the heads 1405 and 1412 of the droplet discharging unit 1403 can be individually controlled. A material to be discharged is supplied to the heads 1405 and 1412 from material supply sources 1413 and 1414 through pipes, respectively.

The head 1405 has an inside structure which has a space to be filled with a liquid material as shown by dotted lines 1406 and a nozzle which is a discharging outlet. Although it is not shown, the inside structure of the head 1412 is similar to that of the head 1405. When the nozzle sizes of the heads 1405 and 1412 are different from each other, different materials can be discharged concurrently to have different widths. A conductive material, an organic material, an inorganic material, and the like can be each discharged from one head to be drawn. In a case of drawing over a large area such as an interlayer film, one material can be concurrently discharged from a plurality of nozzles for drawing to improve throughput. When a large substrate is used, the heads 1405 and 1412 can freely scan over the substrate in directions indicated by arrows, and a region in which drawing is performed can be freely set. Thus, a plurality of the same patterns can be drawn over one substrate.

In the case where a conductive layer is formed by a droplet discharging method, a composition containing particles of a conductive material is discharged, and fused or welded by baking to be solidified, so that a conductive layer is formed. A conductive layer (or an insulating layer) formed by discharging and baking a composition containing a conductive material has, in many cases, a polycrystalline state with many grain boundaries whereas a conductive layer (or an insulating layer) formed by a sputtering method or the like has, in many cases, a columnar structure.

Figure 2A:
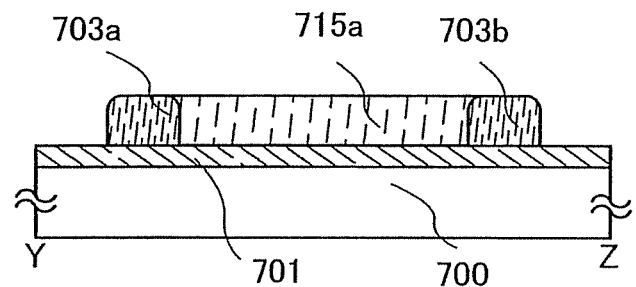
FIGS. 2A to 2C are explanatory conceptual views of the present invention.
Figure 2B:
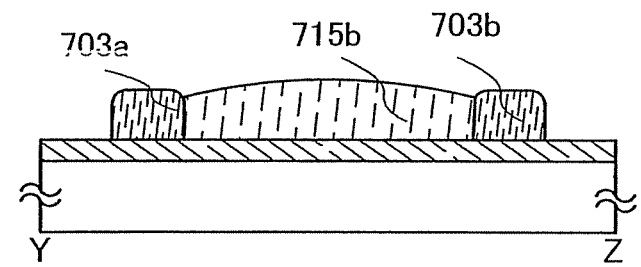
Figure 2C:
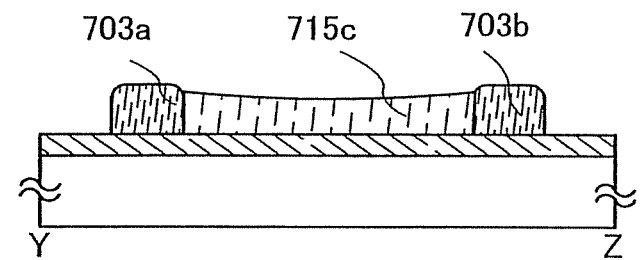

The general idea of the embodiment mode of the present invention will be described using a method for forming a conductive layer with reference to FIGS. 1A1 to 1E2, and 2A to 2C. FIGS. 1A2 to 1E2 are top views of a conductive layer, and FIGS. 1A1 to 1E1 are cross-sectional views taken along lines Y-Z in FIGS. 1A2 to 1E2.

As shown in FIGS. 1A1 and 1A2, a conductive film 701 is formed over a substrate 700.

In the present invention, a mask layer used in processing a thin film into a desired pattern is selectively formed to have a desired shape without using a photolithography step. In particular, since the shape of the mask layer greatly affects the shape of a thin film processed, a defective shape and lack of controllability such as deformation and displacement in formation can cause a reduction in yield and reliability of a display device which is obtained.

In the present invention, a liquid composition is applied to a region where a mask layer is to be formed and then solidified by baking, drying, and the like to form the mask layer. In such a method, the liquid composition needs to be applied to the formation region in a minute and precise pattern to improve precision of the shape and formation region of the mask layer. In particular, when a mask layer for a wiring layer for forming a circuit is formed, displacement of a region where the wiring layer is formed adversely affects electric characteristics, and for example, a short circuit may be caused.

Therefore, in a method for forming a mask layer shown in the present invention, a mask layer is formed through at least two steps. When the mask layer is formed, a first liquid composition containing a mask-layer-forming material is applied on an outer side of a pattern that is desired to be formed (corresponding to a contour or an edge portion of a pattern), and a first mask layer having a frame shape is formed. The first mask layer is preferably a closed region like a frame. In this embodiment mode, a liquid composition containing a mask-layer-forming material is discharged with the use of droplet discharging apparatuses 702a and 702b to the conductive film 701, whereby a first mask layer 703 (703a and 703b) is formed. The first mask layer 703 is formed so as to have a closed frame shape along a contour or an edge portion of a pattern of a conductive layer to be processed (refer to FIGS. 1B1 and 1B2).

Next, a second liquid composition containing a mask-layer-forming material is applied so as to fill the space inside the first mask layer having a frame shape, whereby a second mask layer is formed. In this embodiment mode, the second liquid composition containing a mask-layer-forming material is discharged with the use of a droplet discharging apparatus 704 so as to fill the space inside the first mask layer 703 having a ring shape, whereby a second mask layer 705 is formed (refer to FIGS. 1C1 and 1C2). The first mask layer 703 and the second mask layer 705 are formed so as to be in contact with each other, and the first mask layer 703 is formed so as to surround the second mask layer 705. Therefore, the first mask layer 703 and the second mask layer 705 can be used as one continuous mask layer.

When a mask layer or the like is formed using a liquid composition, a shape of a mask layer to be formed is greatly influenced by the viscosity of a composition, drying conditions in solidification (such as temperature or pressure), wettability with respect to a formation region, and the like. Therefore, with low viscosity or high wettability with respect to a formation region, a liquid composition spreads over a formation region. On the other hand, with high viscosity or low wettability with respect to a formation region, there is a problem in that space (also referred to as pin holes) and unevenness are formed in or on the surface of the mask layer, and a level of planarity is decreased. Since the shape of the mask layer is reflected in a pattern shape of a thin film processed, poor planarity of the mask layer surface may cause a defect in planarity of a formation such as a conductive layer or an insulating layer obtained. When the mask layer has a defect such as a pin hole, an etching gas, an etchant, or the like at the time of etching processing enters the defect and etches a region other than an etching region of the conductive film. As a result, a formation having a defective shape is obtained.

Therefore, in the present invention, when the first mask layer 703 which determines a contour of a formation region of the mask layer is formed by applying a composition with relatively high viscosity and low wettability with respect to the formation region, a side edge portion which becomes a contour of a desired pattern can be formed with high controllability. When a liquid composition with low viscosity and high wettability with respect to the formation region is applied inside a frame formed of the first mask layer 703, the second mask layer 705 with high planarity and uniformity and with less space, unevenness, and the like due to bubbles and the like formed in or on its surface, can be formed. Therefore, by separate formation of an outer-side mask layer (the first mask layer 703) and an inner-side mask layer (the second mask layer 705), a mask layer that has a high level of planarity, less defects, and a desired pattern can be formed with high controllability.

A conductive layer 706 is formed by processing the conductive film 701 using the first mask layer 703 and the second mask layer 705 (refer to FIGS. 1D1 and 1D2). The first mask layer 703 and the second mask layer 705 are removed to expose the conductive layer 706 that is processed into a desired shape (refer to FIGS. 1E1 and 1E2).

In this embodiment mode, the mask layer for processing is formed by selectively discharging a composition. Selective formation of the mask layer in this manner has the effect of simplifying a processing step.

Figure 6A:
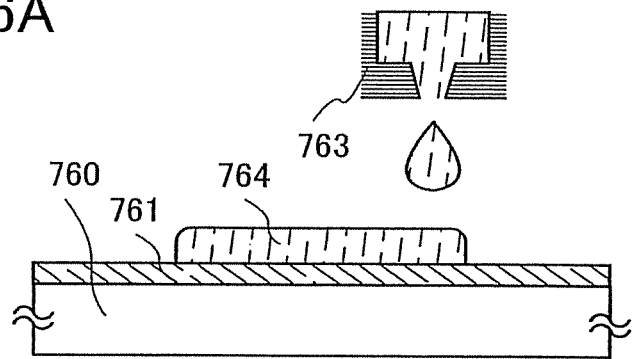
FIGS. 6A to 6C are explanatory conceptual views of the present invention.
Figure 6B:
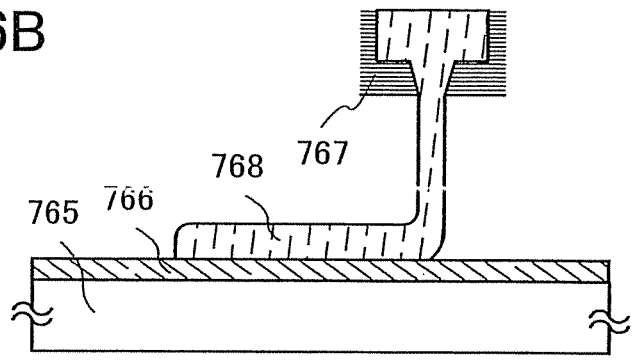
Figure 6C:
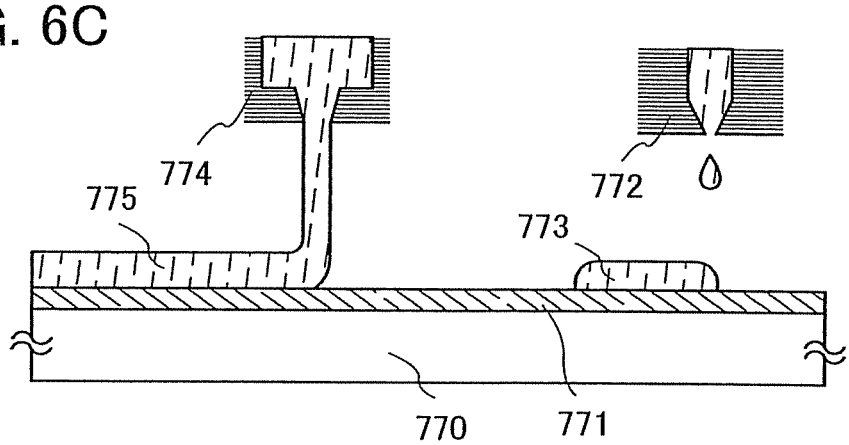

The first composition containing a mask-layer-forming material and the second composition containing a mask-layer-forming material may be discharged continuously or may be discharged intermittently in a droplet state. For example, when the first mask layer which is positioned on the outer side of the mask layer in a frame shape is formed, the first composition containing a mask-layer-forming material may be discharged continuously. On the other hand, when the second mask layer which is formed to fill the space inside the first mask layer having a frame shape is formed, the second composition containing a mask-layer-forming material may be discharged intermittently. In such a manner, a method for discharging a liquid composition may be varied depending on a pattern to be formed. FIGS. 6A to 6C each show an example of a method for discharging a liquid composition.

In FIG. 6A, a conductive film 761 is formed over a substrate 760, and a composition containing a mask-layer-forming material is discharged from a droplet discharging apparatus 763, whereby a mask layer 764 is formed. In FIG. 6A, the composition containing a mask-layer-forming material is discharged intermittently.

In FIG. 6B, a conductive film 766 is formed over a substrate 765, and a composition containing a mask-layer-forming material is discharged from a droplet discharging apparatus 767, whereby a mask layer 768 is formed. In FIG. 6B, the composition containing a mask-layer-forming material is discharged continuously.

FIG. 6C shows an example in which, over a conductive film 771 provided over a substrate 770, a region where a composition containing a mask-layer-forming material is discharged intermittently and a region where a composition containing a mask-layer-forming material is discharged continuously are separately formed depending on a shape of a mask layer to be formed. In FIG. 6C, a composition containing a mask-layer-forming material is discharged continuously from a droplet discharging apparatus 774, whereby a mask layer 775 is formed, and a composition containing a mask-layer-forming material is discharged intermittently from a droplet discharging apparatus 772, whereby a mask layer 773 is formed. In such a manner, a method for discharging a liquid composition can be appropriately set depending on a shape of a mask layer to be formed.

As the mask layer, a resin material such as an epoxy resin, a phenol resin, a novolac resin, an acrylic resin, a melamine resin, or a urethane resin is used. Moreover, the mask layer is formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing a photosensitizer may be used. For example, a positive type resist or a negative type resist may be used. In using any material, the surface tension and the viscosity of a material are appropriately adjusted by adjusting the concentration of a solvent or by adding a surfactant or the like.

The conductive film 701 may be processed by etching by dry etching or wet etching. A parallel-plate RIE method or an ICP (Inductively Coupled Plasma) etching method may be used, and etching conditions (the amount of electric power applied to a coil-shaped electrode, the amount of electric power applied to an electrode on a substrate side, the electrode temperature on the substrate side, and the like) may be appropriately adjusted, and the conductive layer may be etched into a tapered shape. It is to be noted that, as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be appropriately used.

Since the first mask layer 703 and the second mask layer 705 with planarity and reduced defects are used, the conductive layer 706 can also be formed into a desired shape with high controllability, and a defective shape and the like are not generated.

This embodiment mode shows the example in which a mask layer is formed through two steps: forming a first mask layer which forms a peripheral edge portion along a contour of a pattern and forming a second mask layer which fills the space inside the frame formed of the first mask layer. Further, the first mask layer in an outer frame may be formed through a plurality of steps, or the second mask layer which fills the space inside the frame formed of the first mask layer may be formed through a plurality of steps.

FIGS. 2A to 2C show examples of the first mask layer and the second mask layer having other shapes. FIGS. 2A to 2C correspond to FIG. 1D1. FIG. 1D1 is an example in which the second mask layer is formed so that the second composition containing a mask-layer-forming material fills a space inside the frame formed of the first mask layer so as not to extend beyond the frame, and the thickness of the second mask layer is smaller than that of the first mask layer. In FIG. 2A, a second mask layer 715a fills up to the height which is roughly the same as that of first mask layers 703a and 703b, and the thickness of the second mask layer 715a is roughly the same as that of the first mask layers 703a and 703b. In the present invention, since the mask layer is formed by applying a liquid composition to a formation region and thereafter solidifying the composition, as shown in FIGS. 2A to 2C, a mask layer that is obtained is influenced by a shape of a liquid (droplet) and can be formed into a round shape having a curvature in the edge portions (a so-called dome shape like the first mask layer 703a in FIGS. 2A to 2C).

In FIG. 2B, a thickness of a second mask layer 715b increases toward the center. Although the thickness of the side edge portions of the second mask layer 715b that are in contact with first mask layers 703a and 703b is smaller than that of the first mask layers 703a and 703b, the thickness of the second mask layer 715b in the center portion is larger than that of the first mask layers 703a and 703b. In FIG. 2C, a thickness of a second mask layer 715c decreases toward the center. The thickness of the side edge portions of the second mask layer 715c that are in contact with first mask layers 703a and 703b is smaller than that of the first mask layers 703a and 703b, and the thickness of the second mask layer 715c in the center portion is still smaller than that of the first mask layers 703a and 703b. In such a manner, the shape of the second mask layer can vary depending on wettability or the viscosity of the first and second mask layers. Further, the shape of the mask layer may be changed due to a condition of a liquid composition that has been just discharged or solidification by drying (or heating). Such deformation of a formation after solidification is caused due to a material, a solvent, solidification conditions (pressure, temperature, and time), and the like; therefore, conditions may be appropriately set to obtain a desired shape.

Figure 3A:
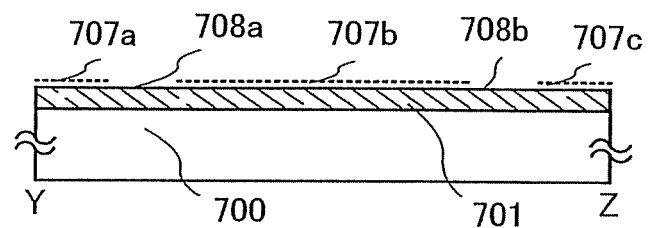
FIGS. 3A to 3C are explanatory conceptual views of the present invention.
Figure 3B:
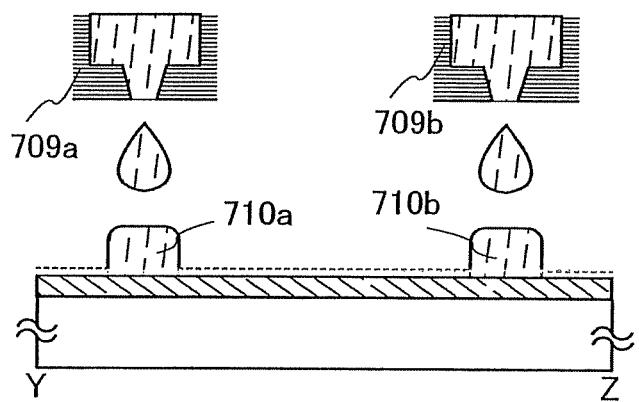
Figure 3C:
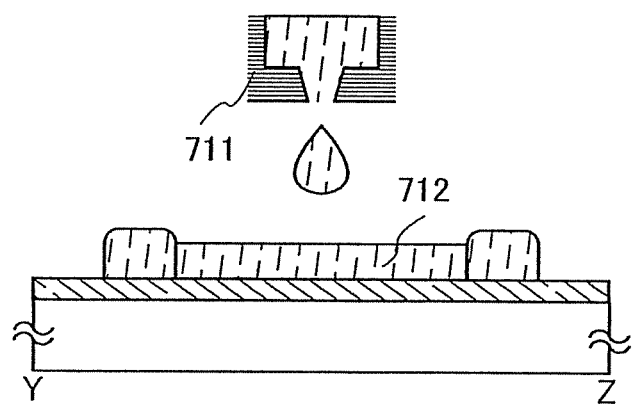

Wettability of a formation region may be controlled so that the first mask layer and the second mask layer are selectively formed. FIGS. 3A to 3C show an example in which modification treatment is performed to a region where a mask layer is formed and a region where a mask layer is not formed so that the regions have a difference in wettability, and a first mask layer is formed with high controllability.

Similarly to FIG. 1A, a conductive film 701 that is an object to be processed into a desired shape is formed over a substrate 700. As shown in FIG. 3A, wettability of a surface of the conductive film is controlled so as to be varied selectively. In this embodiment mode, a low-wettability substance is selectively formed over the conductive film 701, so that low-wettability regions 707a, 707b, and 707c which have lower wettability (higher liquid repellent property) than the peripheral portions are formed. Since the low-wettability regions 707a, 707b, and 707c which have low wettability (high liquid repellent property) are formed, the peripheral regions are high-wettability regions 708a and 708b which have high wettability (high lyophilic property).

A first liquid composition containing a mask-layer-forming material is discharged from droplet discharging apparatuses 709a and 709b, and first mask layers 710a and 710b are selectively formed in the high-wettability regions 708a and 708b. In such a manner, when a region other than a region where the first mask layer is formed is to be a liquid repellent region with respect to the first composition containing a mask-layer-forming material, the first liquid composition containing a mask-layer-forming material does not spread beyond the formation region and is applied to only the high-wettability regions 708a and 708b with high controllability, whereby the first mask layer can be formed.

Thereafter, the low-wettability substance is removed by asking, ultraviolet (UV) light irradiation, and the like, a second composition containing a mask-layer-forming material is discharged from a droplet discharging apparatus 711 to fill a space inside the frame formed of the first mask layers 710a and 710b, and a second mask layer 712 is formed.

The liquid composition containing a mask-layer-forming material is in a liquid state, and thus, is greatly influenced by the surface state of the formation region. In the present invention, treatment for controlling wettability of a region where the liquid composition is applied may be performed.

Wettability of a solid surface is influenced by chemical properties of the surface and the physical surface shape (surface roughness). If a substance having low wettability with respect to a liquid composition is formed, the solid surface is a region having low wettability with respect to the liquid composition (hereinafter also referred to as a low-wettability region). On the other hand, if a substance having high wettability with respect to a liquid composition is formed, the solid surface is a region having high wettability with respect to the liquid composition (hereinafter also referred to as a high-wettability region). In the treatment for controlling surface wettability of the present invention, regions with different wettabilities with respect to a liquid composition are formed in a region where the liquid composition is applied.

The regions having different wettabilities have a difference in wettability with respect to a liquid composition, where contact angles of a composition containing a conductive material are different from each other. A region where a contact angle of the composition containing a conductive material is large is a region having low wettability (hereinafter also referred to as a low-wettability region) and a region where a contact angle is small is a region having high wettability (hereinafter also referred to as a high-wettability region). With a large contact angle, a liquid composition having fluidity does not spread over a region surface, and the surface repels the composition and is not wetted thereby. With a small contact angle, a composition having fluidity spreads over a surface, and the surface is wetted well thereby. Therefore, the regions having different wettabilities have different surface energy. The region having low wettability has low surface energy, and the region having high wettability has high surface energy.

The difference in wettability is relative in the both regions. Two kinds of regions with different wettabilities can be formed over a layer having a rough surface by selective formation of a low-wettability region. As a method for selectively forming the low-wettability region, a method in which a low-wettability substance is selectively formed by forming and using a mask layer, a method in which surface treatment is performed to lower wettability selectively with the use of a mask layer, or the like can be used. Alternatively, a method in which a low-wettability effect is selectively eliminated (removal or decomposition of a low-wettability substance) after formation of a low-wettability region, or the like can be used.

As a method for changing and controlling surface wettability, there is a method in which wettability is changed by decomposing a surface substance and modifying a region surface with the use of light irradiation energy. As the low-wettability substance, a substance containing a fluorocarbon group (or fluorocarbon chain) or a substance containing a silane coupling agent can be used. The silane coupling agent can form a monomolecular film; therefore, decomposition and modification can be efficiently carried out and wettability can be changed in a short time. The monomolecular film can also be referred to as a self-assembled film. In addition, not only a silane coupling agent having a fluorocarbon group (or fluorocarbon chain) but also that having an alkyl group can be used, because the silane coupling agent having an alkyl group exhibits low wettability when arranged over a substrate. Further, as the low-wettability substance, a titanate coupling agent or an aluminate coupling agent may also be used.

In accordance with the present invention, regions with significantly different wettabilities (regions having a large difference in wettability) can be formed. Thus, a liquid mask-layer-forming material is applied only to a formation region with high precision. Accordingly, a mask layer can be precisely formed into a desired pattern.

As the low-wettability substance, a substance containing a fluorocarbon group (fluorocarbon chain) or a substance containing a silane coupling agent can be used. The silane coupling agent is expressed by the chemical formula: $R_n$—Si—$X_{4-n}$ (n=1, 2, 3). In this chemical formula, R represents a material containing a relatively inactive group such as an alkyl group. X represents a hydrolytic group such as halogen, a methoxy group, an ethoxy group, or an acetoxy group that is bondable by a condensation of a hydroxyl group or adsorbed water on a base material surface.

When a fluorine-based silane coupling agent which has a fluoroalkyl group for R (such as fluoroalkylsilane (FAS)) is used as a typical example of the silane coupling agent, the wettability can be further lowered. R in FAS has a structure expressed by $(CF_3)(CF_2)_x(CH_2)_y$ (x is an integer that is greater than or equal to 0 and less than or equal to 10, and y is an integer that is greater than or equal to 0 and less than or equal to 4). When a plurality of Rs or Xs are bonded to Si, the Rs or Xs may be all the same or different from one another. Typically, the following can be given as typical FAS: heptadecafluoro tetrahydrodecyl triethoxysilane, heptadecafluoro tetrahydrodecyl trichlorosilane, tridecafluoro tetrahydrooctyl trichlorosilane, trifluoropropyl trimethoxysilane, or tridecafluoro octyl trimethoxysilane. Further, a coupling agent in which a hydrolytic group of tridecafluoro octyl trichlorosilane or the like is halogen can also be used. Of course, the present invention is not limited to the above compounds.

Further, as the low-wettability substance, a titanate coupling agent or an aluminate coupling agent may be used. For example, isopropyltriisooctanoyl titanate, isopropyl(dioctylpyrophosphate) titanate, isopropyltristearoyl titanate, isopropyl tris(dioctylphosphate) titanate, isopropyldimethacrylisostearoyl titanate, acetoalkoxy aluminumdiisopropylate, or the like can be used.

When the above low-wettability substance is formed as a film in a formation region, a vapor deposition method for evaporating and forming a liquid substance in the formation region (such as a substrate) or the like can be used. Further, the low-wettability substance may be formed by a spin coating method, a dipping method, a droplet discharging method, and a printing method (such as screen printing or offset printing) and may also be dissolved in a solvent to be a solution.

For a solvent of a solution containing the low-wettability substance, water, alcohol, ketone, a hydrocarbon-based solvent (such as aliphatic hydrocarbon, aromatic hydrocarbon, and halogenated hydrocarbon), an ether-based compound, and a mixture thereof can be used. For example, methanol, ethanol, propanol, acetone, butanone, n-pentane, n-hexane, n-heptane, n-octane, n-decane, dicyclopentane, benzene, toluene, xylene, durene, indene, tetrahydronaphthalene, decahydronaphthalene, squalane, carbon tetrachloride, chloroform, methylene chloride, trichloroethane, diethyl ether, dioxane, dimethoxyethane, tetrahydrofran, or the like is used. The concentration of the above solution is not particularly limited, and the concentration may be in a range of 0.001 to 20 wt %.

Further, amine such as pyridine, triethylamine, or dimethylaniline may be mixed in the above low-wettability substance. Furthermore, carboxylic acid such as formic acid or acetic acid may be added as a catalyst.

Treatment for forming a monomolecular film by a spin coating method or the like in which a low-wettability substance is applied to a formation region in a liquid state as described above may be carried out at room temperature (about 25° C.) to 150° C. for several minutes to 12 hours. Treatment conditions may be appropriately set depending on a characteristic of the low-wettability substance, the concentration of a solution, treatment temperature, and treatment time.

Further, as an example of a solution composition for forming a low-wettability region, a material having a fluorocarbon chain (a fluorine-based resin) can be used. As the fluorine-based resin, polytetrafluoroethylene (PTFE; a tetrafluoroethylene resin), perfluoroalkoxyalkane (PFA; a tetrafluoroethylene perfluoroalkylvinylether copolymer resin), perfluoroethylene propene copolymer (PFEP; a tetrafluoroethylene-hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

Further, with the use of an organic material not having low wettability (that is, having high wettability), treatment by $CF_4$ plasma or the like may be performed to form a low-wettability region. For example, a material in which a water-soluble resin such as polyvinyl alcohol (PVA) is mixed in a solvent such as $H_2O$ can be used. In addition, a combination of PVA and another water-soluble resin can be used. An organic material (organic resin material) (such as polyimide or acrylic) or a siloxane material may also be used. It is to be noted that a siloxane material corresponds to a resin including a Si—O—Si bond. Siloxane has a skeleton structure of a bond of silicon (Si) and oxygen (O). As for a substituent, an organic group containing at least hydrogen (such as an alkyl group or an aryl group) is used. As for a substituent, a fluoro group may also be used. Further, as for a substituent, a fluoro group and an organic group containing at least hydrogen may also be used. Further, in a case of using a material having a low-wettability surface, wettability can further be lowered by plasma treatment or the like.

In this embodiment mode, the mask layer is formed with the use of a droplet discharging unit. The droplet discharging unit is a generic term for a unit for discharging a droplet, such as a nozzle having a discharging outlet for discharging the composition or a head equipped with one or more nozzles. The nozzle of the droplet discharging unit has a diameter of 0.02 to 100 μm (preferably less than or equal to 30 μm), and the amount of the composition to be discharged from the nozzle is in the range of 0.001 to 100 pl (preferably greater than or equal to 0.1 pl and less than or equal to 40 pl, much preferably less than or equal to 10 pl). The amount of the discharged composition increases in proportion to the diameter of the nozzle. The distance between an object to be processed and the droplet discharging outlet of the nozzle is preferably as small as possible in order to drop the composition at a desired position, for example, about 0.1 to 3 mm (preferably less than or equal to 1 mm).

As the composition to be discharged from the droplet discharging outlet, one in which a material is dissolved or dispersed in a solvent is used. As for the solvent, esters such as butyl acetate or ethyl acetate, alcohols such as isopropyl alcohol or ethyl alcohol, an organic solvent such as methyl ethyl ketone or acetone, or water is used. The viscosity of the composition is preferably less than or equal to 20 mPa·s, which prevents the composition from drying when being discharged and enables the composition to be discharged smoothly from the discharging outlet. The surface tension of the composition is preferably less than or equal to 40 mN/m. It is to be noted that the viscosity of the composition and the like may be appropriately controlled depending on a solvent to be used or an intended purpose. For example, the viscosity of a composition in which ITO, organic indium, or organic tin is dissolved or dispersed in a solvent may be set to be 5 to 20 mPa·s, the viscosity of a composition in which silver is dissolved or dispersed in a solvent may be set to be 5 to 20 mPa·s, and the viscosity of a composition in which gold is dissolved or dispersed in a solvent may be set to be 5 to 20 mPa·s.

The diameter of a particle of the conductive material is preferably small for the purpose of preventing nozzles from being clogged and for manufacturing a minute pattern, although it depends on the diameter of each nozzle, a desired shape of a pattern, or the like. Preferably, the diameter of the particle of the conductive material is less than or equal to 0.1 μm. The composition is formed by various methods such as an electrolyzing method, an atomizing method, and a wet reduction method, and the particle size is generally about 0.01 to 10 μm. When a gas evaporation method is employed, the size of nanoparticles protected by a dispersant is as minute as about 7 nm, and when the surface of each particle is covered with a coating, the nanoparticles do not aggregate in the solvent and are stably dispersed in the solvent at room temperature, and behave similarly to liquid. Accordingly, it is preferable to use a coating.

In addition, the step of discharging the composition may be performed under reduced pressure. After the composition is discharged, either drying or baking or both of them is/are performed. Both the drying step and baking step are heat treatment, and for example, drying is performed at 100° C. for 3 minutes and baking is performed at 200 to 550° C. for 15 to 60 minutes, and they are different in purpose, temperature, and time period. The steps of drying and baking are performed under normal pressure or reduced pressure by laser beam irradiation, rapid thermal annealing, heating using a heating furnace, or the like. It is to be noted that the timing and the number of times of such heat treatment is not particularly limited. The substrate may be heated in advance to favorably perform the steps of drying and baking, and the temperature at that time is, although it depends on the material of the substrate or the like, generally 100 to 800° C. (preferably, 200 to 550° C.). Through these steps, the solvent in the composition is volatilized or the dispersant is chemically removed, and furthermore, nanoparticles are made in contact with each other and fusion and welding are accelerated since a peripheral resin is hardened and shrunk.

A continuous wave or pulsed gas laser or solid-state laser may be used for laser beam irradiation. An excimer laser, a YAG laser, or the like can be used as the former gas laser. A laser using a crystal of YAG, YVO$_4$, GdVO$_4$, or the like which is doped with Cr, Nd, or the like can be used as the latter solid-state laser. It is preferable to use a continuous wave laser in consideration of the absorptance of a laser beam. Moreover, a laser beam irradiation method in which pulsed and continuous wave lasers are combined may be used. It is preferable that the heat treatment by laser beam irradiation be instantaneously performed within several microseconds to several tens of seconds so as not to damage the substrate, depending on heat resistance of the substrate. Rapid thermal annealing (RTA) is carried out by raising the temperature rapidly and heating the substrate instantaneously for several microseconds to several minutes with the use of an infrared lamp or a halogen lamp which emits ultraviolet to infrared light in an inert gas atmosphere. Since this treatment is performed instantaneously, only an outermost thin film can be heated and the film in the lower layer is not adversely affected. In other words, even a substrate having low heat resistance such as a plastic substrate is not adversely affected.

After the mask layer or the like is formed by discharging a composition by a droplet discharging method, the surface thereof may be planarized by pressing with pressure to enhance a level of planarity. As a pressing method, concavity and convexity may be planarized and reduced by scanning the surface with a roller-shaped object, or the surface may be pressed perpendicularly by a flat plate-shaped object. A heating step may be performed at the time of pressing. Alternatively, the concavity and convexity of the surface may be removed with an air knife after the surface is softened or melted with a solvent or the like. A CMP method may also be used for polishing the surface. This step can be employed in planarizing a surface when concavity and convexity are generated by a droplet discharging method.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 2

In this embodiment mode, a method for forming a contact hole through a more simplified process at low cost will be described with reference to FIGS. 4A to 4D.

When conductive layers are electrically connected with an insulating layer interposed therebetween, an opening (so-called contact hole) is formed in the insulating layer. In this case, a mask layer is not formed over the insulating layer, and the opening is selectively formed by laser beam irradiation. A first conductive layer is formed, an insulating layer is stacked over the first conductive layer, and a region where the opening is formed in the stacked first conductive layer and insulating layer is selectively irradiated with a laser beam from the insulating layer side. The laser beam is transmitted through the insulating layer and absorbed by the first conductive layer. The first conductive layer is heated by energy of the absorbed laser beam and evaporated, and the insulating layer that is stacked thereover is broken. Therefore, the opening is formed in the first conductive layer and the insulating layer, and part of the conductive layer below the insulating layer is exposed on the side wall and the bottom (or only on the side wall) of the opening. By formation of a second conductive layer in the opening so as to be in contact with the exposed first conductive layer, the first and second conductive layers can be electrically connected to each other with the insulating layer interposed therebetween. In other words, in the present invention, the conductive layer is irradiated with a laser beam, an irradiated region of the conductive layer with a laser beam is evaporated by laser ablation, and the opening is formed in the insulating layer that is formed over the conductive layer.

The above method for forming a contact hole will be specifically described with reference to FIGS. 4A to 4D. In this embodiment mode, as shown in FIGS. 4A to 4D, conductive layers 721a and 721b, and an insulating layer 722 are formed over a substrate 720.

The conductive layers 721a and 721b are formed to have a stacked structure. In this embodiment mode, low-melting point metal (chromium in this embodiment mode) that is relatively easily evaporated is used for the conductive layer 721b, and refractory metal (tungsten in this embodiment mode) that is not easily evaporated compared to the conductive layer 721b is used for the conductive layer 721a.

Figure 4A:
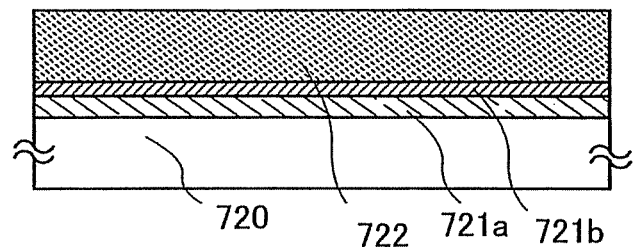
FIGS. 4A to 4D are explanatory conceptual views of the present invention.
Figure 4B:
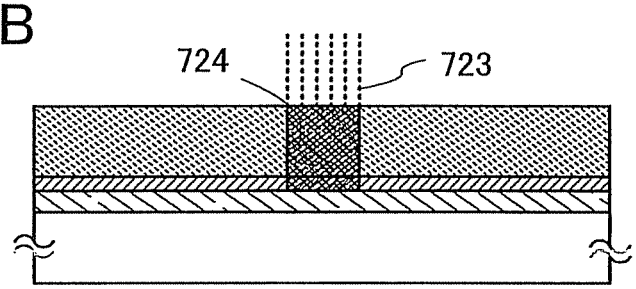
Figure 4C:
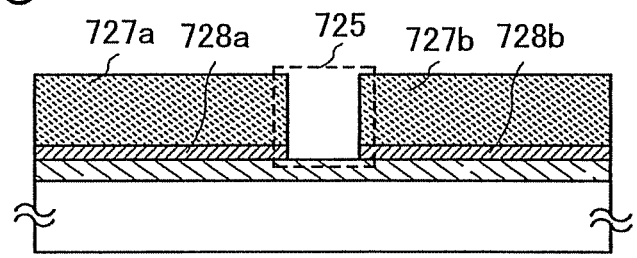
Figure 4D:
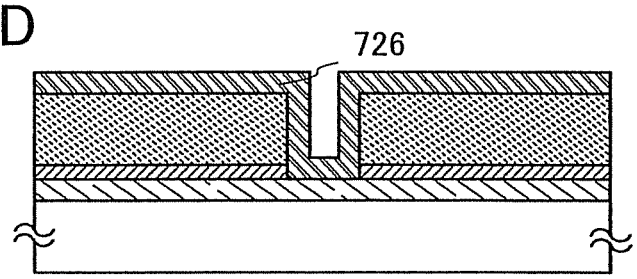

As shown in FIG. 4B, the conductive layers 721a and 721b (an irradiated region 724) are selectively irradiated with a laser beam 723 from the insulating layer 722 side, and the irradiated region of the conductive layer 721b is evaporated by irradiation energy. The insulating layer 722 over the irradiated region of the conductive layer 721b is removed, and an opening 725 can be formed. The conductive layer 721b is separated into conductive layers 728a and 728b, and the insulating layer 722 is separated into insulating layers 727a and 727b (refer to FIG. 4C). A conductive layer 726 is formed in the opening 725 where the conductive layers 721a and 721b are exposed; therefore, the conductive layer 721a, the conductive layer 721b, and the conductive layer 726 can be electrically connected (refer to FIG. 4D).

Figure 31:
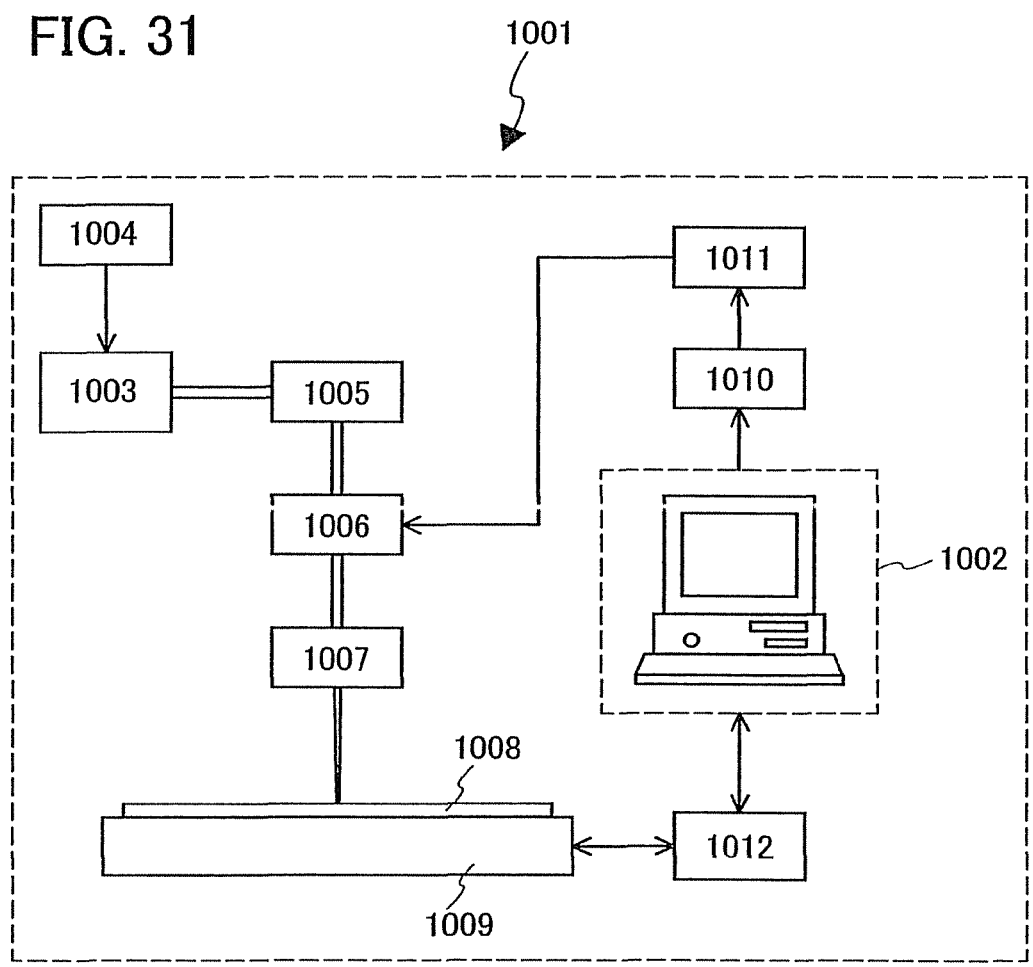
FIG. 31 is an explanatory diagram of a structure of a laser beam direct writing system which can be applied to the present invention.

A laser beam writing system for irradiating a processing region with a laser beam will be described with reference to FIG. 31. A laser beam direct writing system is used in this embodiment mode, and a processing region is directly irradiated with a laser beam. As shown in FIG. 31, a laser beam direct writing system 1001 includes: a personal computer (hereinafter, referred to as a PC) 1002 for carrying out various kinds of controls upon irradiation with a laser beam; a laser oscillator 1003 for outputting a laser beam; a power source 1004 of the laser oscillator 1003; an optical system (an ND filter) 1005 for attenuating a laser beam; an acousto-optic modulator (AOM) 1006 for modulating the intensity of a laser beam; an optical system 1007 including a lens for enlarging or reducing a cross section of a laser beam, a mirror for changing a light path, and the like; a substrate moving unit 1009 having an X stage and a Y stage; a D/A converter 1010 for converting control data output from the PC from digital to analog data; a driver 1011 for controlling the acousto-optic modulator 1006 depending on an analog voltage output from the D/A converter; and a driver 1012 outputting a driving signal for driving the substrate moving unit 1009.

As the laser oscillator 1003, a laser oscillator that is capable of emitting ultraviolet light, visible light, or infrared light can be used. The following laser oscillators can be used: an excimer laser oscillator such as KrF, ArF, XeCl, or Xe; a gas laser oscillator such as He, He—Cd, Ar, He—Ne, or HF; a solid-state laser oscillator using a crystal such as YAG, GdVO$_4$, YVO$_4$, YLF, or YAlO$_3$ doped with Cr, Nd, Er, Ho, Ce, Co, Ti, or Tm; and a semiconductor laser oscillator such as GaN, GaAs, GaAlAs, or InGaAsP. In the case of the solid-state laser oscillator, first to fifth harmonics of fundamental waves are preferably used. In order to adjust the shape or path of a laser beam emitted from the laser oscillator, an optical system including a shutter, a reflector such as a mirror or a half mirror, a cylindrical lens, a convex lens, and the like may be provided.

Next, treatment for modifying film quality using the laser beam direct writing system will be described. When a substrate 1008 is put on the substrate moving unit 1009, the PC 1002 detects a position of a marker that is marked on the substrate with the use of a camera (not shown). The PC 1002 generates data for moving the substrate moving unit 1009 based on the positional data of the detected marker and data for a writing pattern that has been previously input in the PC.

When the amount of output light for the acousto-optic modulator 1006 is controlled through the driver 1011 by the PC 1002, laser beam output from the laser oscillator 1003 is attenuated by the optical system 1005, so that the amount of light is adjusted to a predetermined amount in the acousto-optic modulator 1006. The light path and beam shape of the laser beam output from the acousto-optic modulator 1006 are changed in the optical system 1007. The laser beam is condensed by the lens, and a base film formed over the substrate is irradiated with the condensed laser beam, whereby the treatment for modifying quality of the base film is performed. At this time, the substrate moving unit 1009 is controlled to move in an X direction and a Y direction in accordance with the data for moving the substrate moving unit that is generated by the PC 1002. As a result, a predetermined portion is irradiated with the laser beam, so that treatment for modifying the quality of the film is performed.

A laser beam having a shorter frequency can be condensed to be shorter in diameter. Therefore, in order to process a region with a minute width, a short wavelength laser beam is preferably used.

The spot shape of the laser beam on the film surface is processed to have a dotted, circular, elliptic, rectangular, or linear (exactly, a narrow rectangular) shape by the optical system.

FIG. 31 shows an example of the system in which a front surface of the substrate is irradiated with a laser beam to be exposed. Alternatively, another laser beam writing system in which a back surface of the substrate is irradiated with a laser beam to be exposed may be used by arbitrarily changing the optical system and the substrate moving unit.

Here, the substrate is selectively irradiated with the laser beam by being moved; however, the present invention is not limited thereto. Irradiation with the laser beam can be performed by scanning of the laser beam in the X axis and Y axis directions. In this case, a polygon mirror or a galvanometer mirror is preferably used for the optical system 1007.

The conductive layers 721a and 721b can be formed by an evaporation method, a sputtering method, a PVD (Physical Vapor Deposition) method, a CVD method such as a low-pressure CVD (LPCVD) method or a plasma CVD method, or the like. In addition, a method by which a component can be formed into a desired pattern by transferring or drawing, for example, various printing methods (a method for forming a component into a desired pattern, such as screen (mimeograph) printing, offset (planograph) printing, relief printing, gravure (intaglio) printing, and the like), a dispenser method, a selective-coating method, or the like can also be used. As the conductive layers 721a and 721b, one or a plurality of chromium, molybdenum, nickel, titanium, cobalt, copper, tungsten, and aluminum can be used.

In FIGS. 4A to 4D, an example is shown, in which the conductive layer 721b is evaporated by irradiation with the laser beam 723, the opening 725 is formed in the insulating layer 722, and the stacked conductive layer 721a remains. FIGS. 5A to 5D show other examples in which an opening is formed to reach a conductive layer formed below an insulating layer.

Figure 5A:
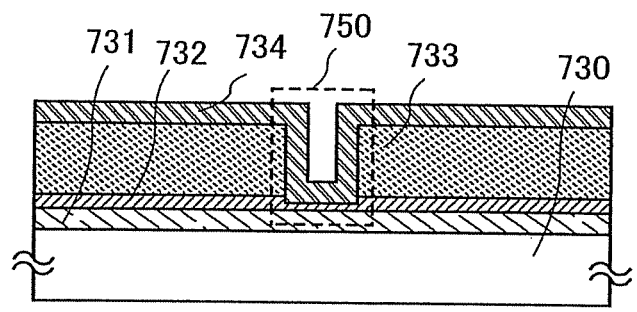
FIGS. 5A to 5D are explanatory conceptual views of the present invention.

FIG. 5A shows an example in which only an upper portion of an upper conductive layer of conductive layers which are stacked below an insulating layer is removed by laser ablation. Conductive layers 731 and 732, and an insulating layer 733 are provided over a substrate 730, and a conductive layer 734 is provided in an opening 750 formed in the conductive layer 732 and the insulating layer 733. In the opening 750, the conductive layer 732 is exposed and electrically connected to and in contact with the conductive layer 734.

Figure 5B:
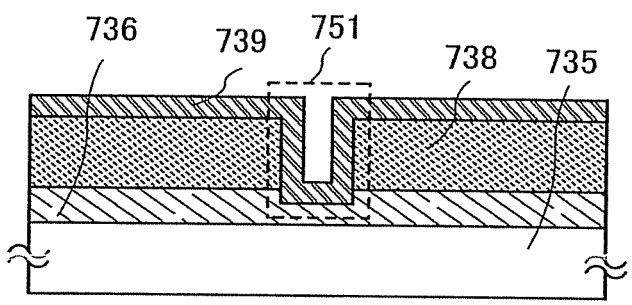
Figure 5C:
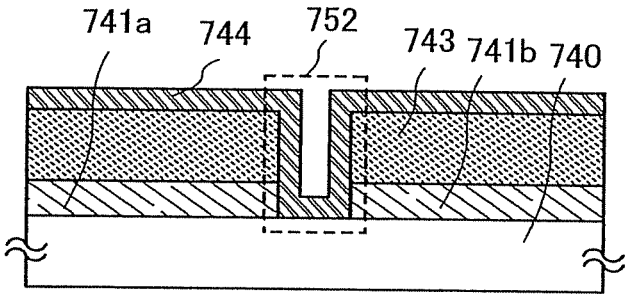

The conductive layer below the insulating layer may be a stacked layer including a plurality of kinds of conductive layers with different melting points, or of course, may be a single layer. FIGS. 5B and 5C show examples in which a conductive layer below an insulating layer is a single layer. FIG. 5B is an example in which only an upper portion of a conductive layer below an insulating layer is removed by laser ablation. FIG. 5C is an example in which a conductive layer in a portion below an insulating layer is removed by laser ablation until a substrate 740 is exposed.

In FIG. 5B, a conductive layer 736 and an insulating layer 738 are provided over a substrate 735, and a conductive layer 739 is provided in an opening 751 formed in the conductive layer 736 and the insulating layer 738. In the opening 751, the conductive layer 736 is exposed and is electrically connected to and in contact with the conductive layer 739. As shown in FIG. 5B, when only the upper portion of the conductive layer is partially removed in a thickness direction, laser beam irradiation conditions (such as energy or irradiation time) may be controlled, or the conductive layer 736 may be formed thickly.

In FIG. 5C, conductive layers 741a and 741b, and an insulating layer 743 are provided over a substrate 740, and a conductive layer 744 is provided in an opening 752 formed between the conductive layers 741 and 741b and in the insulating layer 743. In the opening 752, the conductive layers 741a and 741b are exposed and electrically connected to and in contact with the conductive layer 744. It is not always necessary that the upper conductive layer and the lower conductive layer are in contact with each other at the bottom of the opening as shown in FIG. 5B, and a structure in which the upper conductive layer is formed to be in contact with and electrically connected to the lower conductive layer exposed on the side surface of the opening may be employed.

Figure 5D:
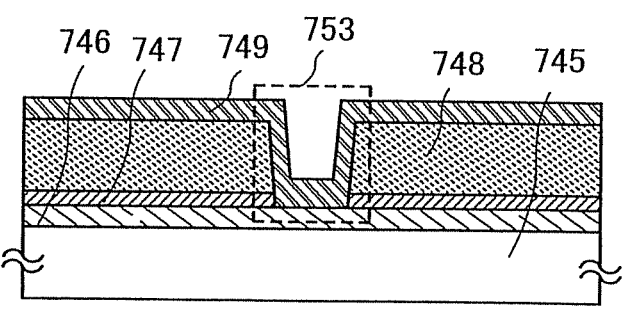

Further, as for the shape of the opening functioning as a contact hole, the side surface does not need to be perpendicular to the bottom surface, and the side of the opening may be tapered as shown in FIG. 5D. In FIG. 5D, conductive layers 746 and 747, and an insulating layer 748 are formed over a substrate 745, and an opening 753 is formed in the insulating layer 748 and the conductive layer 747. The opening 753 has a mortar shape and the side surface of the opening 753 is tapered with respect to the bottom surface. A conductive layer 749 is provided in an opening 753.

As described above, in the opening provided in the insulating layer, the lower conductive layer below the insulating layer and the upper conductive layer over the insulating layer are electrically connected to each other. In this embodiment mode, a second conductive layer is formed of metal with a high sublimation property over a first conductive layer, and the second conductive layer is evaporated by a laser beam, whereby an opening is formed in an insulating layer formed over the first and second conductive layers. The size and shape of the opening formed in the insulating layer and the conductive layer can be controlled by laser beam irradiation conditions (such as laser intensity and irradiation time) and characteristics of materials for the insulating layer and the conductive layer (such as thermal conductivity, melting point, and boiling point). FIGS. 35A to 35D show an example of the size of the laser beam spot and the size of the formed opening.

Over a substrate 300, a first conductive layer 301a (301a1, 301a2, and 301a3) and a second conductive layer 301b are stacked, and an insulating layer 302 is formed so as to cover the first conductive layer 301a (301a1, 301a2, and 301a3) and the second conductive layer 301b. In FIGS. 35A to 35D, the first conductive layer 301a (301a1, 301a2, and 301a3) has a stacked layer structure including a plurality of thin films. For example, titanium can be used for the first conductive layer 301a1, aluminum can be used for the first conductive layer 301a2, titanium can be used for the first conductive layer 301a3, and chromium can be used for the second conductive layer 301b. In addition, tungsten, molybdenum, or the like may also be used for the first conductive layer 301a3. Of course, the second conductive layer 301b can also have a stacked layer structure, and a stacked layer including copper and chromium or the like can be used.

Figure 35A:
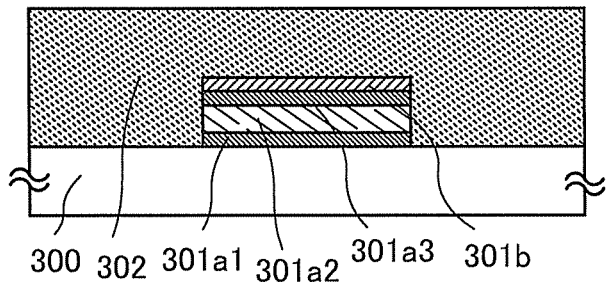
FIGS. 35A to 35D are explanatory conceptual views of the present invention.
Figure 35B:
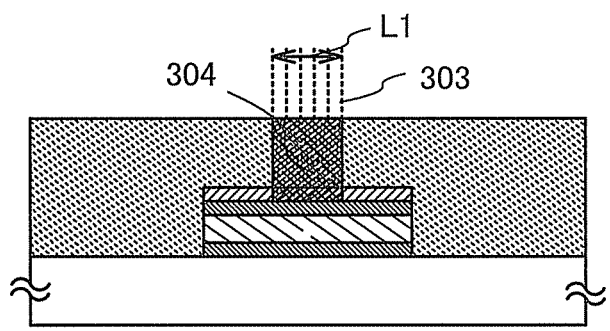
Figure 35C:
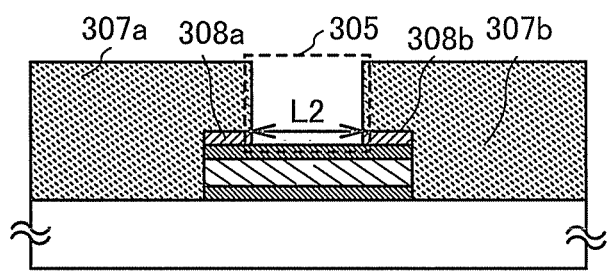
Figure 35D:
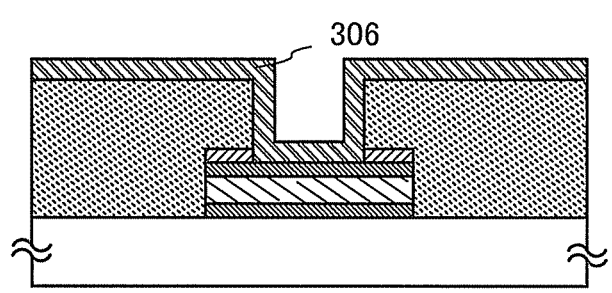

The insulating layer 302 and the second conductive layer 301b are irradiated with a laser beam 303 having a diameter L1, so that an irradiated region 304 is selectively formed in the insulating layer 302 and the second conductive layer 301b. As the energy of the laser beam 303 is higher, the second conductive layer 301b receives higher energy and heat is transmitted to the irradiated region and also to the peripheral portion in the second conductive layer 301b as shown in FIG. 35C. Therefore, in the second conductive layer 301b, an opening having a diameter L2 that is larger than the diameter L1 of the laser beam 303 is formed, and the opening is also formed in the insulating layer 302 formed over the conductive layer 301b. As described above, the second conductive layer 301b is separated into second conductive layers 308a and 308b, and the insulating layer 302 is separated into insulating layers 307a and 307b, and an opening 305 is formed. A conductive film 306 is formed in the opening 305 where the first conductive layer 301a3 is exposed and electrically connected to the first conductive layer 301a (301a1, 301a2, and 301a3) and the second conductive layers 308a and 308b (refer to FIG. 35D).

The size of the opening with respect to the size of the irradiated region determined by the diameter of the laser beam depends on an energy level of the laser beam, and when the energy of the laser beam is high enough to evaporate the second conductive layer, the energy is transmitted also to the periphery of the irradiated region and the second conductive layer is evaporated; therefore, the opening that is larger than the irradiated region with the laser beam is formed in the second conductive layer. On the other hand, when the energy of the laser beam is low, an opening with almost the same size as that of the irradiated region is formed in the second conductive layer. In addition, when the second conductive layer is formed using a sublimation metal material with high thermal conductivity, energy of a laser beam can be easily transmitted; therefore, an opening that is larger than the irradiated region can be formed.

As described above, by control of the energy of the laser beam, the evaporation range of the second conductive layer which is irradiated with a laser beam can be controlled; thus, the size of the opening formed in the second conductive layer and the insulating layer can be appropriately controlled.

After the opening is formed by laser beam irradiation, a conductive material and an insulating material remaining around the opening (a residue in a portion where the conductive layer and the insulating layer are removed) can be washed with a liquid so that the residue is removed. In this case, a non-reactive substance such as water may be used for washing, or a chemical solution such as an etchant which reacts with (dissolves) the insulating layer may be used. With an etchant, the opening is over-etched, and dusts and the like are removed, so that the surface is more planarized. Further, the opening can also be widened.

Since the opening can be selectively formed by a laser beam, a mask layer does not need to be formed, and the steps and the materials can be reduced. In addition, there are advantages that a conductive layer and an insulating layer to be processed can be formed into a predetermined shape with high precision since the laser beam can be condensed into a very small spot, and the regions other than the processing region do not need to be heated substantially since heating is performed in a short time by the laser beam.

As described above, an opening (contact hole) which electrically connects conductive layers can be formed in an insulating layer by laser beam irradiation without implementing a complicated photolithography step and forming a mask layer.

Accordingly, when a display device is manufactured in accordance with the present invention, the process can be simplified, and loss of materials and the cost can be reduced. Therefore, a display device can be manufactured with a high yield.

Embodiment Mode 3

Figure 25A:
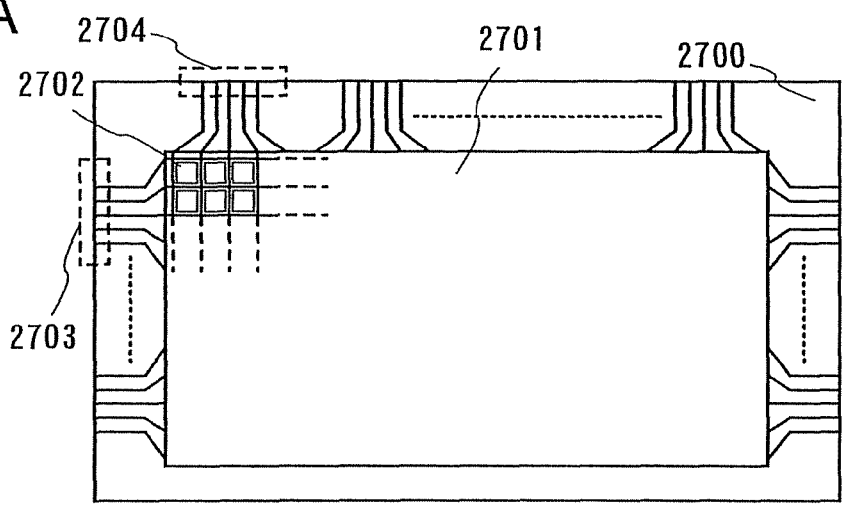
FIGS. 25A to 25C are top views of a display device of the present invention.

FIG. 25A is a top view showing a structure of a display panel in accordance with the present invention. A pixel portion 2701 in which pixels 2702 are arranged in a matrix, a scanning line input terminal 2703, and a signal line input terminal 2704 are formed over a substrate 2700 having an insulating surface. The number of pixels may be determined in accordance with various standards. In the case of XGA of RGB full color display, the number of pixels may be 1024× 768×3 (RGB). In the case of UXGA of RGB full color display, the number of pixels may be 1600×1200×3 (RGB), and in the case of full-spec high-definition RGB full color display, the number of pixels may be 1920×1080×3 (RGB).

The pixels 2702 are arranged in a matrix by intersection of scanning lines extended from the scanning line input terminal 2703 and signal lines extended from the signal line input terminal 2704. Each pixel 2702 is provided with a switching element and a pixel electrode connected to the switching element. A typical example of the switching element is a TFT. The gate electrode side of the TFT is connected to a scanning line, and a source or drain side of the TFT is connected to a signal line, which enables each pixel to be independently controlled by a signal input from an external portion.

Figure 26A:
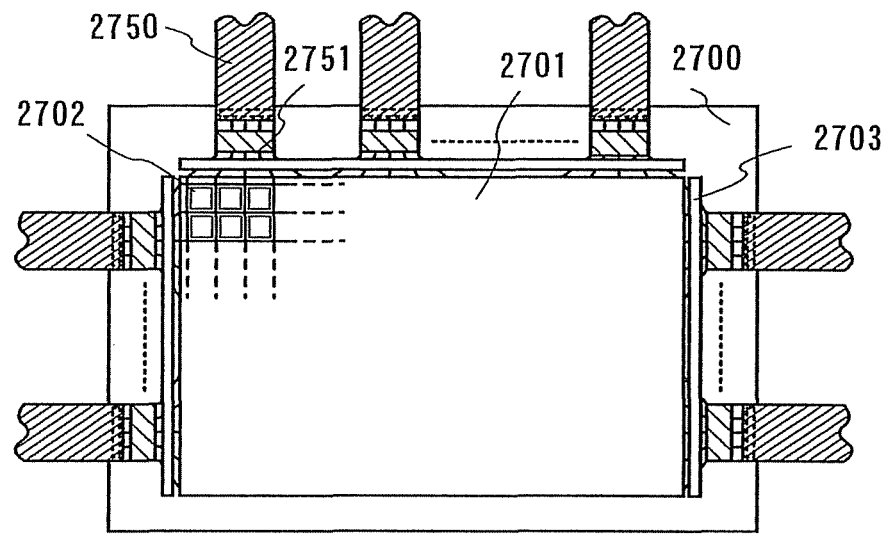
FIGS. 26A and 26B are top views of a display device of the present invention.
Figure 26B:
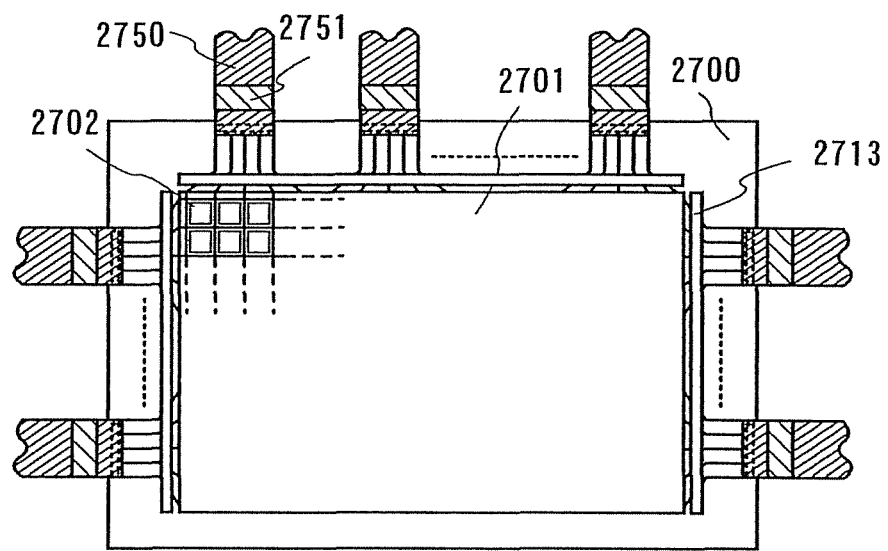

FIG. 25A shows a structure of a display panel in which a signal to be input to a scanning line and a signal line is controlled by an external driver circuit. Alternatively, a driver IC 2751 may be mounted on a substrate 2700 by a COG (Chip on Glass) method as shown in FIG. 26A. As another mounting mode, a TAB (Tape Automated Bonding) method may also be used as shown in FIG. 26B. The driver IC may be formed over a single crystal semiconductor substrate or may be formed over a glass substrate with a TFT. In FIGS. 26A and 26B, the driver IC 2751 is connected to an FPC 2750.

Figure 25B:
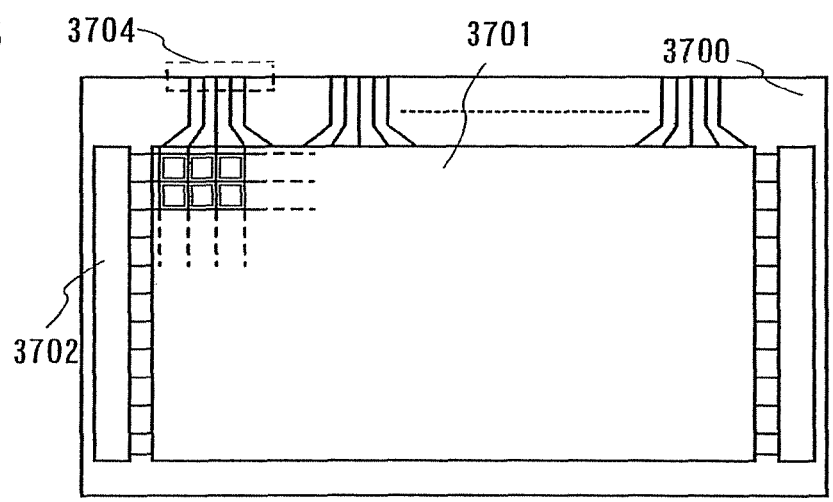
Figure 25C:
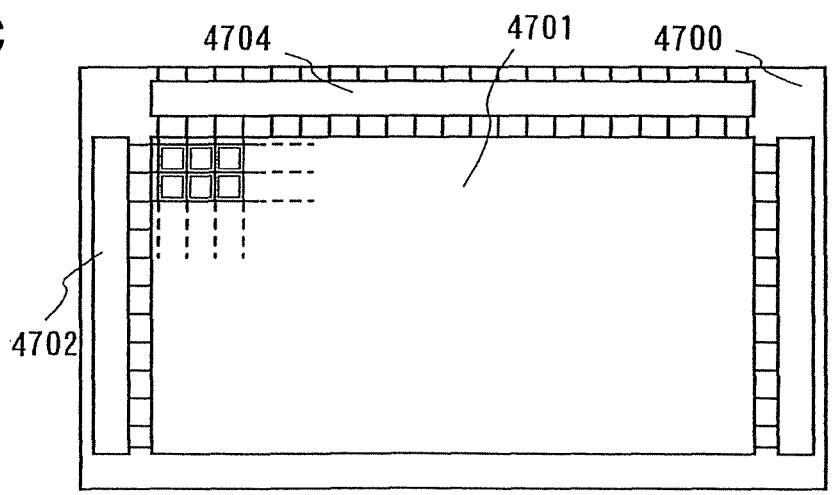

When a TFT provided in a pixel is formed of a polycrystalline (microcrystalline) semiconductor having high crystallinity, a scanning line driver circuit 3702 can also be formed over a substrate 3700 as shown in FIG. 25B. In FIG. 25B, reference numeral 3701 denotes a pixel portion, reference numeral 3704 denotes a signal line input terminal, and a signal line driver circuit is controlled by an external driver circuit as in FIG. 25A. When a TFT in a pixel portion 4701 is formed of a polycrystalline (microcrystalline) semiconductor or a single crystal semiconductor having high mobility like a TFT formed in the present invention, the pixel portion 4701, a scanning line driver circuit 4702, and a signal line driver circuit 4704 can all be formed over a glass substrate 4700 as shown in FIG. 25C.

Figure 14A:
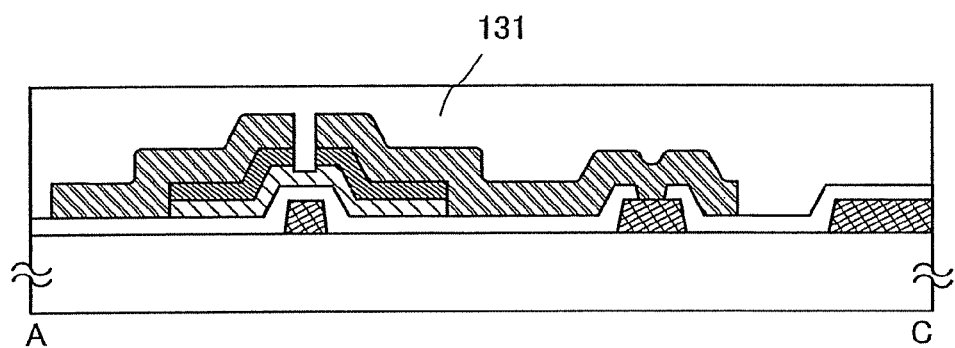
FIGS. 14A and 14B are explanatory views of a method for manufacturing a display device of the present invention.
Figure 14B:
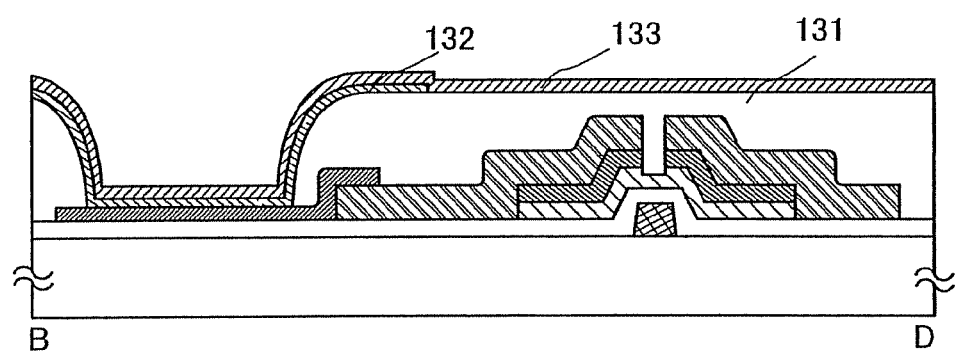

An embodiment mode of the present invention will be described with reference to FIGS. 7A to 14B. More specifically, a method for manufacturing a display device including a reverse staggered thin film transistor to which the present invention is applied will be described. FIGS. 7A, 8A, 9A, 10A, 11A, 12A, and 13A are top views of a pixel portion of a display device, FIGS. 7B, 8B, 9B, 10B, 11B, 12B, and 13B are cross-sectional views taken along lines A-C in FIGS. 7A, 8A, 9A, 10A, 11A, 12A, and 13A, and FIGS. 7C, 8C, 9C, 10C, 11C, 12C, and 13C are cross-sectional views taken along lines B-D in FIGS. 7A, 8A, 9A, 10A, 11A, 12A, and 13A. FIGS. 14A and 14B are also cross-sectional views of a display device.

As a substrate 100, a glass substrate made of barium borosilicate glass, aluminoborosilicate glass, or the like; a quartz substrate; a metal substrate; or a plastic substrate having heat resistance that can withstand process temperature of the present manufacturing process is used. The surface of the substrate 100 may be polished by a CMP method or the like so as to be planarized. An insulating layer may be formed over the substrate 100. The insulating layer may be formed to have a single layer or stacked layer structure using an oxide material containing silicon or a nitride material containing silicon by various methods such as a CVD method, a plasma CVD method, a sputtering method, and a spin coating method. This insulating layer is not necessarily formed; however, this insulating layer has an advantageous effect of blocking contamination substances and the like from the substrate 100.

A conductive film 101 is formed over the substrate 100. The conductive film 101 can be formed by a sputtering method, a PVD (Physical Vapor Deposition) method, a CVD (Chemical Vapor Deposition) method such as a low-pressure CVD (LPCVD) method or a plasma CVD method, or the like. The conductive film 101 may be formed using an element such as Ag, Au, Ni, Pt, Pd, Ir, Rh, Ta, W, Ti, Mo, Al, or Cu, or an alloy material or compound material containing the above element as its main component. In addition, a semiconductor film typified by a polycrystalline silicon film doped with an impurity element such as phosphorus, or an AgPdCu alloy may be used. In addition, a single layer structure or a structure including a plurality of layers may be used, and for example, a two-layer structure of a tungsten nitride (WN) film and a molybdenum (Mo) film or a three-layer structure in which a tungsten film with a thickness of 50 nm, an alloy film of aluminum and silicon (Al—Si) with a thickness of 500 nm, and a titanium nitride film with a thickness of 30 nm are sequentially stacked may be used. In the case of the three-layer structure, tungsten nitride may be used in place of tungsten of a first conductive film, an alloy film of aluminum and titanium (Al—Ti) may be used in place of the alloy film of aluminum and silicon (Al—Si) of a second conductive film, and a titanium film may be used in place of the titanium nitride film of a third conductive film.

In this embodiment mode, a gate electrode layer is formed by forming the conductive film 101 and processing the conductive film 101 into a desired shape with a mask layer.

In this embodiment mode, the mask layer for processing is formed by selectively discharging a composition. By such selective formation of the mask layer, the process can be simplified.

Figure 7A:
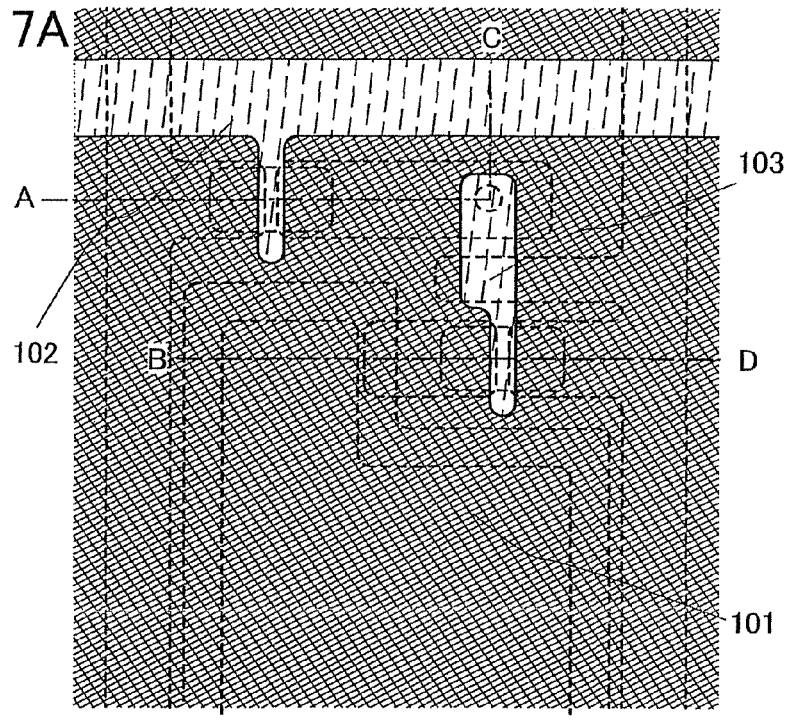
FIGS. 7A to 7C are explanatory views of a method for manufacturing a display device of the present invention.
Figure 7B:
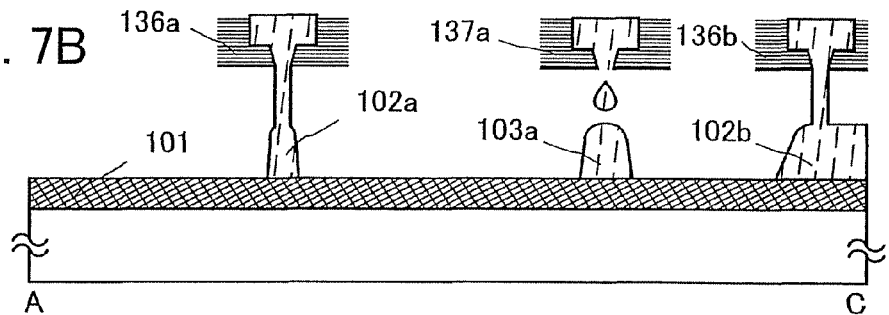
Figure 7C:
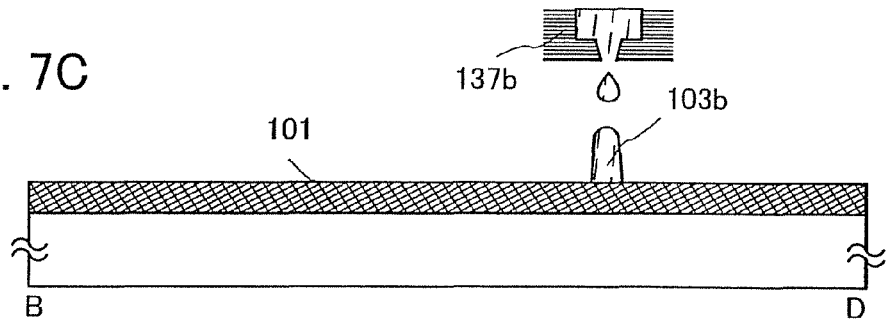
Figure 8A:
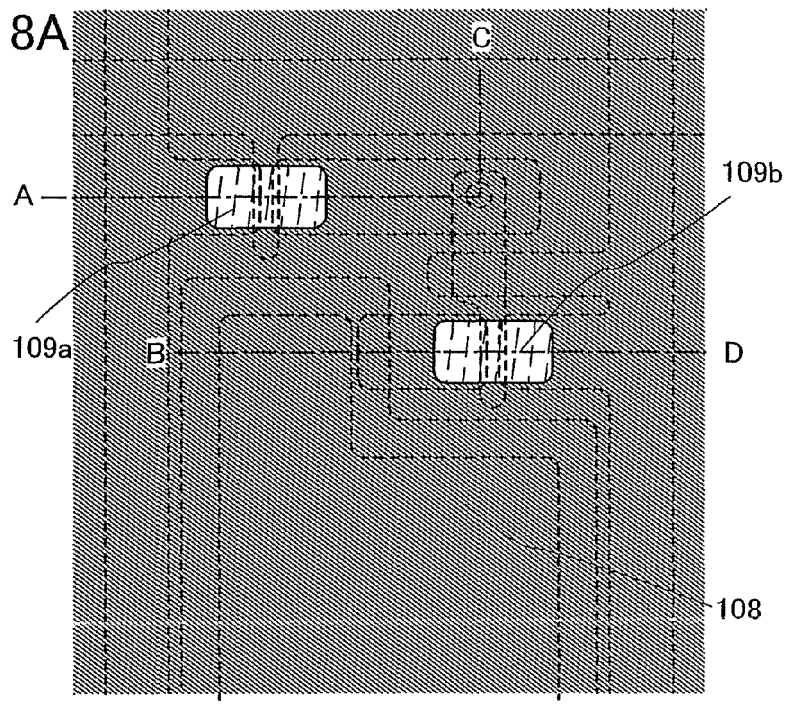
FIGS. 8A to 8C are explanatory views of a method for manufacturing a display device of the present invention.
Figure 8B:
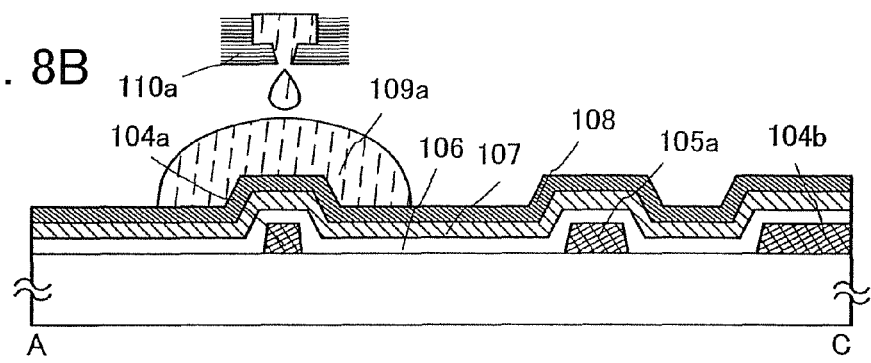
Figure 8C:
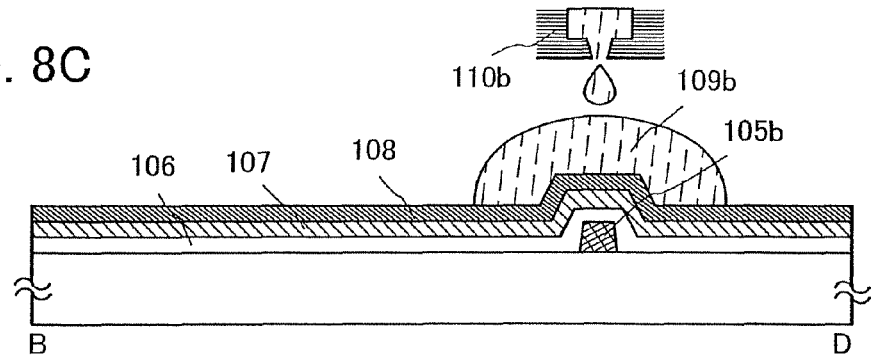

This embodiment mode has a feature that a method for discharging a composition from a discharging outlet of a droplet discharging apparatus is varied depending on the size and shape of a region where a mask layer is formed. A mask layer 102 (102*a* and 102*b*) for forming the gate electrode layer corresponding to a gate wiring which is formed in a relatively wide area is formed by continuously discharging compositions from droplet discharging apparatuses 136*a* and 136*b* without stop as shown in FIG. 7B. On the other hand, a mask layer 103 (103*a* and 103*b*) corresponding a gate electrode layer which is formed in a relatively small area is formed by dripping compositions from droplet discharging apparatuses 137a and 137b as shown in FIGS. 7B and 7C. In such a manner, a method for discharging a liquid composition may be varied depending on a pattern to be formed.

As the mask layer, a resin material such as an epoxy resin, a phenol resin, a novolac resin, an acrylic resin, a melamine resin, or a urethane resin is used. Moreover, the mask layer is formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing a photosensitizer may be used. For example, a positive type resist or a negative type resist may be used. In using any material, the surface tension and the viscosity of a material are appropriately adjusted by adjusting the concentration of a solvent or by adding a surfactant or the like.

The conductive film 101 is processed using the mask layers 102 (102a, 102b) and 103 (103a and 103b) to form gate electrode layers 104a, 104b, 105a, and 105b.

The conductive film 101 may be processed by etching by dry etching or wet etching. An ICP (Inductively Coupled Plasma) etching method may be used, and etching conditions (the amount of electric power applied to a coil-shaped electrode, the amount of electric power applied to an electrode on a substrate side, the electrode temperature on the substrate side, and the like) may be appropriately adjusted, and the conductive film may be etched into a tapered shape. It is to be noted that, as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be appropriately used.

Next, a gate insulating layer 106 is formed over the gate electrode layers 104a, 104b, 105a, and 105b. The gate insulating layer 106 may be formed of an oxide material of silicon, a nitride material of silicon, or the like, and a single-layer or stacked layer structure may be used. In this embodiment mode, a two-layer structure of a silicon nitride film and a silicon oxide film is used. In addition, a single layer of a silicon oxynitride film or a stacked layer including three or more layers may be used. Preferably, a silicon nitride film having dense film quality is used. When silver, copper, or the like is used for a conductive layer formed by a droplet discharging method, by formation of a silicon nitride film or an NiB film as a barrier film thereover, an effect that diffusion of an impurity is prevented and the surface is planarized can be obtained. In order to form a dense insulating film with less gate leak current at low deposition temperature, a reaction gas containing a rare gas element such as argon may be mixed into an insulating film to be formed.

Next, a semiconductor layer is formed. A semiconductor layer having one conductivity type may be formed as needed. In addition, an NMOS structure of an n-channel TFT in which a semiconductor layer having n-type conductivity is formed, a PMOS structure of a p-channel TFT in which a semiconductor layer having p-type conductivity is formed, or a CMOS structure of an n-channel TFT and a p-channel can be manufactured. In order to impart conductivity, an element imparting conductivity may be added to the semiconductor layer by doping to form an impurity region in the semiconductor layer, so that an n-channel TFT and a p-channel 1141 can be formed. Instead of formation of the semiconductor layer having n-type conductivity, plasma treatment with a $PH_3$ gas may be performed, so that conductivity is imparted to the semiconductor layer.

A material for forming the semiconductor layer can be an amorphous semiconductor (hereinafter also referred to as "AS") formed by a vapor deposition method using a semiconductor material gas typified by silane or germane or a sputtering method, a polycrystalline semiconductor formed by crystallizing the amorphous semiconductor using light energy or thermal energy, a semi-amorphous semiconductor (also referred to as microcrystal and hereinafter also referred to as "SAS"), or the like. The semiconductor layer can be formed by various methods (a sputtering method, an LPCVD method, a plasma CVD method, and the like).

An SAS is a semiconductor having an intermediate structure between, amorphous and crystalline (including single crystal and polycrystalline) structures and a third state which is stable in free energy. Moreover, an SAS includes a crystalline region with a short-distance order and lattice distortion. A crystal grain having a diameter of 0.5 to 20 nm can be observed at least in a portion of a film. In a case where silicon is contained as a main component, Raman spectrum is shifted to the low wave number side that is lower than 520 cm$^{-1}$. The diffraction peaks of (111) and (220), which are believed to be derived from silicon crystal lattice, are observed by X-ray diffraction. An SAS contains hydrogen or halogen by at least 1 atomic % or more for terminating dangling bonds. An SAS is formed by glow discharge decomposition (plasma CVD) of a gas containing silicon. As the gas containing silicon, $SiH_4$ can be used, and in addition, $Si_2H_6$, $SiH_2Cl_2$, $SiHCl_3$, $SiCl_4$, $SiF_4$, and the like can also be used. Further, $F_2$ and $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, pressure is approximately 0.1 to 133 Pa, and a power source frequency is 1 to 120 MHz, preferably, 13 to 60 MHz. A temperature for heating the substrate is preferably less than or equal to 300° C., and an SAS can also be formed at 100 to 200° C. It is preferable that the concentration of impurities of atmospheric components such as oxygen, nitrogen, and carbon as impurity elements in the film be less than or equal to $1 \times 10^{20}$ cm$^{-3}$. In particular, an oxygen concentration is preferably less than or equal to $5 \times 10^{19}$ cm$^{-3}$, and much preferably, less than or equal to $1 \times 10^{19}$ cm$^{-3}$. Further, when a rare gas element such as helium, argon, krypton, or neon is contained to further increase the lattice distortion, stability can be enhanced, and a favorable SAS can be obtained. Further, as the semiconductor layer, an SAS layer formed by using a hydrogen-based gas may be stacked over an SAS layer formed by using a fluorine-based gas.

As an example of a typical amorphous semiconductor, hydrogenated amorphous silicon can be given while polysilicon or the like can be given as an example of a typical crystalline semiconductor. Polysilicon (polycrystalline silicon) includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon crystallized by adding an element which promotes crystallization, and the like. Of course, as described above, a semi-amorphous semiconductor or a semiconductor which includes a crystalline phase in a portion thereof can also be used.

When a crystalline semiconductor layer is used for the semiconductor layer, the crystalline semiconductor layer may be formed by various methods such as a laser crystallization method, a thermal crystallization method, and a thermal crystallization method using an element such as nickel which promotes crystallization. Further, a microcrystalline semiconductor that is an SAS may be crystallized by laser irradiation to enhance crystallinity. In a case where an element which promotes crystallization is not used, before the amorphous silicon film is irradiated with a laser beam, the amorphous silicon film is heated at 500° C. for one hour in a nitrogen atmosphere to discharge hydrogen so that a hydrogen concentration in the amorphous silicon film becomes less than or equal to $1 \times 10^{20}$ atoms/cm$^3$. This is because, if the amorphous silicon film contains much hydrogen, the amorphous silicon film may be broken by laser beam irradiation.

A method for introducing a metal element into the amorphous semiconductor layer is not particularly limited as long as it is a method for introducing the metal element to a surface of or inside the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like to improve wettability of the surface of the amorphous semiconductor layer so that an aqueous solution is diffused on the entire surface of the amorphous semiconductor layer.

In order to crystallize the amorphous semiconductor layer, heat treatment may be combined with crystallization by laser beam irradiation, or one of heat treatment and laser beam irradiation may be carried out multiple times.

Moreover, the crystalline semiconductor layer may be directly formed over the substrate by a plasma method. Furthermore, the crystalline semiconductor layer may be selectively formed over the substrate by a linear plasma method.

The semiconductor layer may be formed of an organic semiconductor material by a printing method, a dispenser method, a spray method, a spin coating method, a droplet discharging method, or the like. In this case, since the etching step is not necessary, the number of steps can be reduced. As the organic semiconductor, a low-molecular material such as pentacene, a high-molecular material, or the like can be used. In addition, an organic dye, a conductive high-molecular material, or the like can also be used. As the organic semiconductor material used in the present invention, a π-electron conjugated high-molecular material of which skeleton includes a conjugated double bond is desirable. Typically, a soluble high-molecular material such as polythiophene, polyfluorene, poly(3-alkylthiophene), or a polythiophene derivative can be used.

In addition, as the organic semiconductor material which can be used in the present invention, there is a material which can be formed by forming a soluble precursor of the material and then performing a process thereon. The organic semiconductor material through a precursor includes polythienylenevinylene, poly(2,5-thienylenevinylene), polyacetylene, polyacetylene derivatives, polyallylenevinylene, and the like.

The precursor is changed into the organic semiconductor not only by heat treatment but also by addition of a reaction catalyst such as a hydrogen chloride gas. Moreover, as a typical solvent for dissolving the soluble organic semiconductor material, toluene, xylene, chlorobenzene, dichlorobenzene, anisole, chloroform, dichloromethane, γbutyllactone, butylcellosolve, cyclohexane, N-methyl-2-pyrrolidone (NMP), cyclohexanone, 2-butanon, dioxane, dimethylformamide (DMF), tetrahydrofuran (THF), and the like can be used.

A semiconductor film 107 and a semiconductor film 108 having one conductivity type are formed over the gate insulating layer 106. In this embodiment mode, amorphous semiconductor layers are formed as the semiconductor film 107 and the semiconductor film 108 having one conductivity type. In this embodiment mode, a semiconductor film having n-type conductivity containing phosphorus (P) that is an n-type impurity element imparting n-type conductivity is formed as the semiconductor film having one conductivity type. The semiconductor film having one conductivity type functions as a source region and a drain region. The semiconductor film having one conductivity type may be formed as needed, and a semiconductor film having n-type conductivity containing an impurity element imparting n-type conductivity (P, As) or a semiconductor film having p-type conductivity containing an impurity element imparting p-type conductivity (B) can be formed.

Similarly to the gate electrode layers 104 and 105, the semiconductor film 107 and the semiconductor film 108 having one conductivity type are formed into a desired shape with the use of a mask layer. A composition containing a material for forming the mask layer is discharged to the semiconductor film 107 and the semiconductor film 108 having one conductivity type by droplet discharging apparatuses 110a and 110b, whereby mask layers 109a and 109b are selectively formed (refer to FIGS. 8A to 8C).

The semiconductor film 107 and the semiconductor film 108 having one conductivity type are processed with the use of the mask layers 109a and 109b, whereby semiconductor layers 111a and 111b, and semiconductor layers 112a and 112b having one conductivity type are formed.

A mask layer is formed of an insulator such as resist or polyimide by a droplet discharging method. An opening 114 is formed in part of the gate insulating layer 106 by etching with the use of the mask layer, and part of the gate electrode layer 105 provided below the gate insulating layer 106 is exposed. Either plasma etching (dry etching) or wet etching may be employed to etch the gate insulating layer 106; however, plasma etching is suitable to process a large substrate. As the etching gas, a fluorine-based gas such as CF$_4$ or NF$_3$ or a chlorine-based gas such as Cl$_2$ or BCl$_3$ is used. An inert gas such as He or Ar may be added to the etching gas appropriately. When an etching process using atmospheric discharge plasma is employed, a local discharging process is also possible, and the mask layer does not need to be formed over the entire surface of the substrate.

Further, as shown in Embodiment Mode 2, the opening 114 may be formed by a laser beam. The gate electrode layer 105 is selectively irradiated with a laser beam from the gate insulating layer 106 side, whereby part of an irradiated region of the gate electrode layer 105 is evaporated by irradiation energy. The gate insulating layer 106 over the irradiated region of the gate electrode layer 105 is removed, and the opening 114 can be formed. A conductive film 113 for forming a source electrode or drain electrode layer is formed in the opening 114 where the gate electrode layer 105 is exposed, and the gate electrode layer 105 and the source electrode or drain electrode layer can be electrically connected to each other.

In this embodiment mode, the source electrode or drain electrode layer is formed by forming the conductive film 113 and processing the conductive film 113 into a desired shape with the mask layer.

The conductive film 113 is formed by a sputtering method, a PVD (Physical Vapor Deposition) method, a CVD (Chemical Vapor Deposition) method such as a low-pressure CVD (LPCVD) method or a plasma CVD method, or the like. The conductive film 113 can be formed using a conductive material such as a composition which mainly contains metal particles of Ag (silver), Au (gold), Cu (copper), W (tungsten), Al (Aluminum), or the like. Alternatively, indium tin oxide (ITO), indium tin oxide containing silicon oxide (ITSO), indium oxide, tin oxide, zinc oxide, titanium oxide, or the like which has a light-transmitting property may be combined.

In this embodiment mode, the mask layer for processing is formed by selectively discharging a composition. When the mask layer is selectively formed in this manner, the process can be simplified.

Figure 9A:
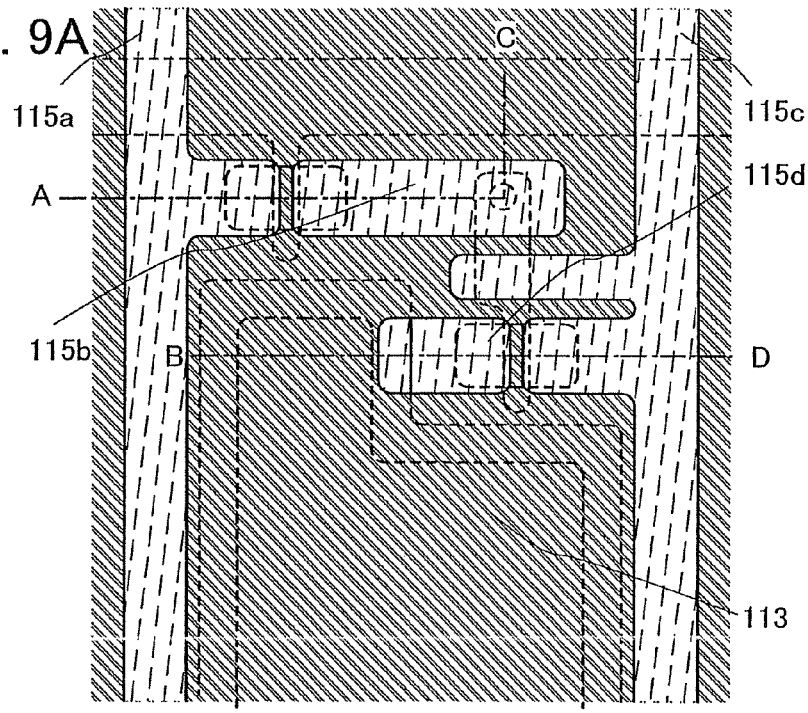
FIGS. 9A to 9C are explanatory views of a method for manufacturing a display device of the present invention.
Figure 9B:
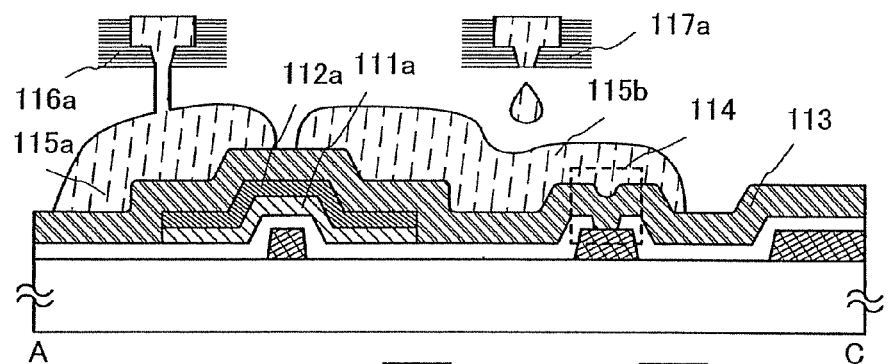
Figure 9C:
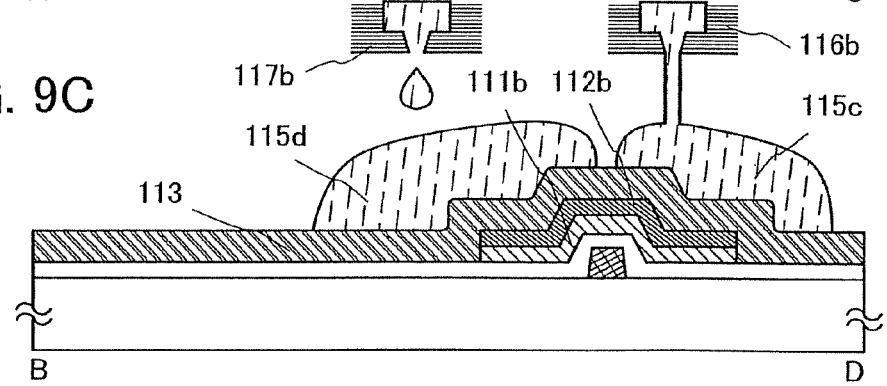

This embodiment mode has a feature that a method for discharging a composition from a discharging outlet of a droplet discharging apparatus is varied depending on the size and shape of a region where the mask layer is formed. Mask layers 115a and 115c for manufacturing source electrode or drain electrode layers 120 and 122 corresponding to source wirings or drain wirings formed in a relatively wide area are formed by continuously discharging compositions without stop from droplet discharging apparatuses 116a and 116b as shown in FIGS. 9B and 9C. On the other hand, mask layers 115b and 115d corresponding to source electrode layers or drain electrode layers formed in a relatively small area are formed by dripping compositions intermittently from droplet discharging apparatuses 117a and 117b as shown in FIGS. 9B and 9C. As described above, a method for discharging a liquid composition may be varied depending on the pattern to be formed.

As the mask layer, a resin material such as an epoxy resin, a phenol resin, a novolac resin, an acrylic resin, a melamine resin, or a urethane resin is used. Moreover, the mask layer is formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing photosensitizer may be used. For example, a positive type resist or a negative type resist may be used. In using any material, the surface tension and the viscosity of a material are appropriately adjusted by adjusting the concentration of a solvent or by adding a surfactant or the like.

The conductive film 113 is processed using the mask layers 115a, 115b, 115c, and 115d to form source electrode or drain electrode layers 120, 121, 122, and 123.

The conductive film 113 may be processed by etching by dry etching or wet etching. An ICP (Inductively Coupled Plasma) etching method may be used, and etching conditions (the amount of electric power applied to a coil-shaped electrode, the amount of electric power applied to an electrode on a substrate side, the electrode temperature on the substrate side, and the like) may be appropriately adjusted, and the electrode layer may be etched into a tapered shape. It is to be noted that, as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be appropriately used.

Further, in this embodiment mode, when the mask layer for performing processing into a desired shape is formed by a droplet discharging method, regions having different wettabilities may be formed in a region where the source electrode or drain electrode layer is formed and a peripheral portion thereof as pre-treatment. In the present invention, when components such as a conductive layer, an insulating layer, and a mask layer are formed by discharging a droplet by a droplet discharging method, a region having low wettability and a region having high wettability with respect to a material for forming the components are formed in the formation region of the components, whereby the shape of the components can be controlled. By such treatment, there are regions with different wettabilities in the formation region; therefore, droplets remain only in the region having high wettability, and the components with a desired pattern can be formed with high controllability. This step can be used as pre-treatment for any component (such as an insulating layer, a conductive layer, a mask layer, or a wiring layer) when a liquid material is used.

The source electrode or drain electrode layer 120 also functions as a source wiring layer, and the source electrode or drain electrode layer 122 also functions as a power source line. After the source electrode layers or drain electrode layers 120, 121, 122, and 123 are formed, the semiconductor layers 111a and 111b, and the semiconductor layers 112a and 112b having one conductivity type are formed into a desired shape. In this embodiment mode, the semiconductor layers 111a and 111b, and the semiconductor layers 112a and 112b having one conductivity type are processed by etching using the source electrode layers or drain electrode layers 120, 121, 122, and 123 as masks, whereby semiconductor layers 118a and 118b, and semiconductor layers 119a, 119b, 119c and 119d having one conductivity type are formed.

In the opening 114 formed in the gate insulating layer 106, the source electrode or drain electrode layer 121 and the gate electrode layer 105 are electrically connected to each other. A part of the source electrode or drain electrode layer 122 forms a capacitor.

In addition, by combination with a droplet discharging method, loss of materials and the cost can be reduced, as compared to formation over the entire surface by a spin coating method or the like.

Figure 10A:
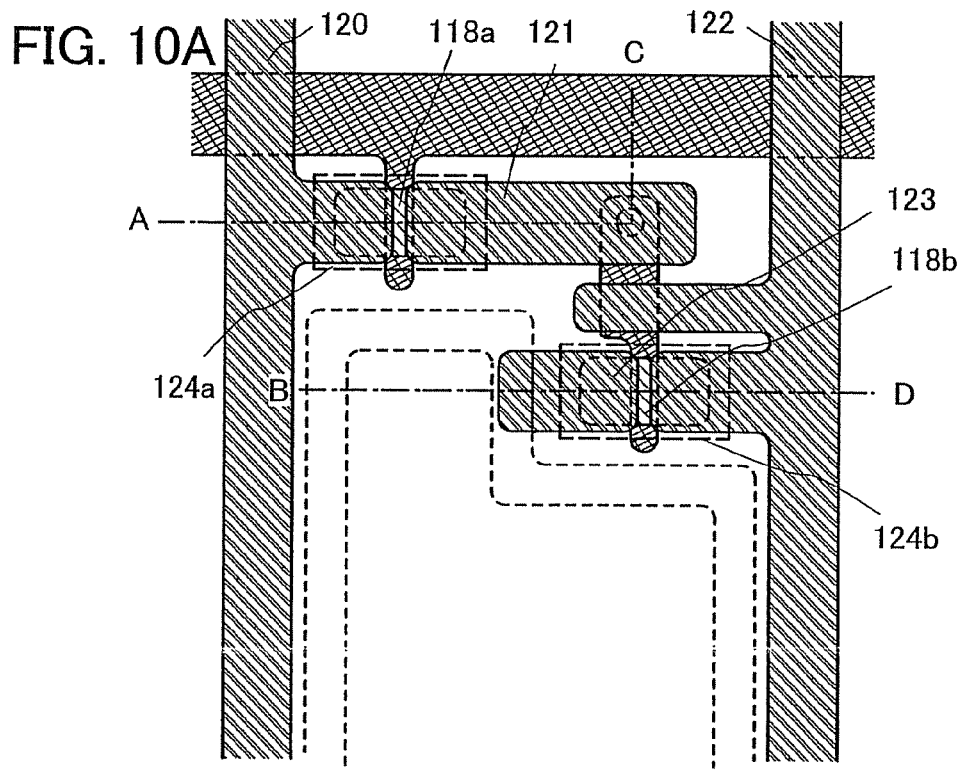
FIGS. 10A to 10C are explanatory views of a method for manufacturing a display device of the present invention.
Figure 10B:
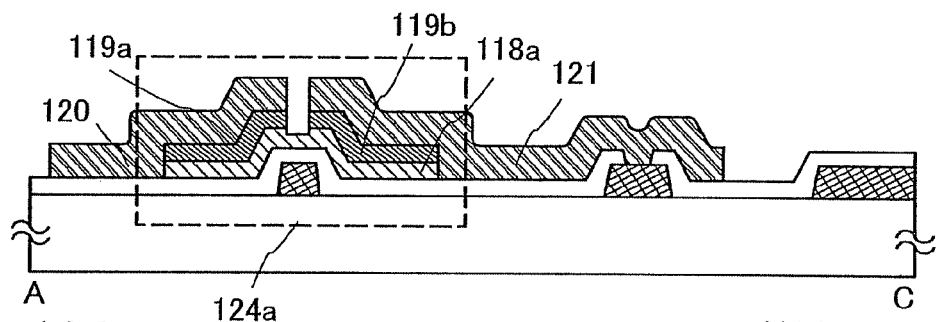
Figure 10C:
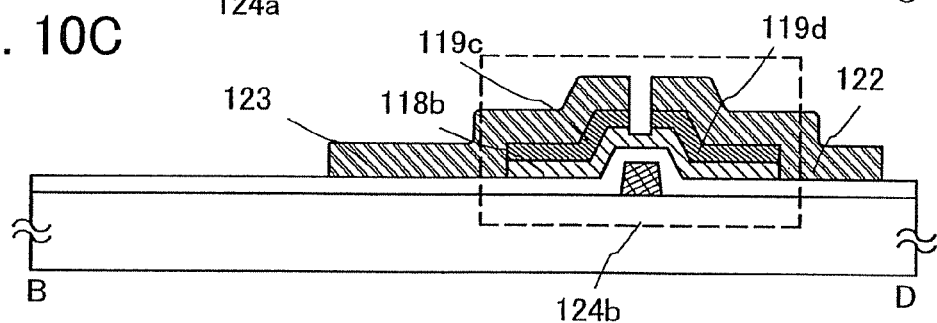

Through the above process, transistors 124a and 124b which are reverse staggered transistors are formed (refer to FIGS. 10A to 10C).

Next, a first electrode layer of a light emitting element is formed over the gate insulating layer 106. In this embodiment mode, the first electrode layer is formed by forming a conductive film 126 and processing the conductive film 126 into a desired shape with a mask layer.

The conductive film 126 can be formed by a sputtering method, a PVD (Physical Vapor Deposition) method, a CVD (Chemical Vapor Deposition) method such as a low-pressure CVD (LPCVD) method or a plasma CVD method, or the like. The conductive film 126 can be formed using indium tin oxide (ITO), indium tin oxide containing silicon oxide (ITSO), tin oxide (ZnO), or the like. Preferably, the conductive film is formed using indium tin oxide containing silicon oxide by a sputtering method using a target in which silicon oxide of 2 to 10 wt % is contained in ITO. Alternatively, it may be formed using a conductive material in which ZnO is doped with gallium (Ga), or indium zinc oxide (IZO) that is an oxide conductive material formed using a target in which indium oxide containing silicon oxide is mixed with zinc oxide (ZnO) of 2 to 20 wt %.

In this embodiment mode, the mask layer for processing is formed by selectively discharging a composition. When the mask layer is selectively formed, the process can be simplified.

Figure 11A:
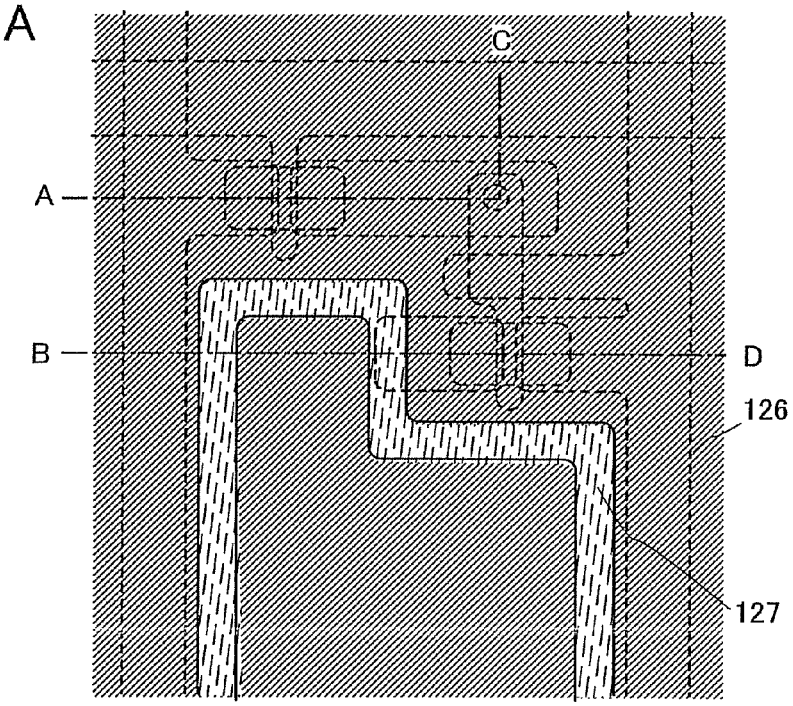
FIGS. 11A to 11C are explanatory views of a method for manufacturing a display device of the present invention.
Figure 11B:
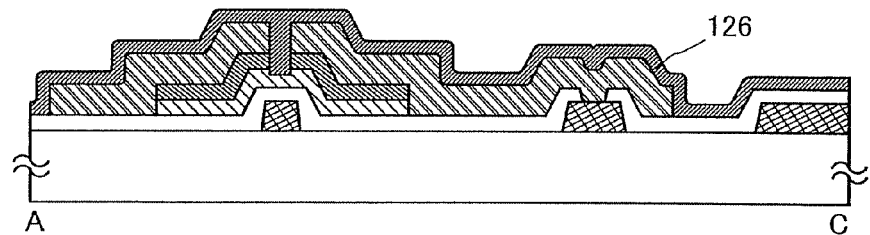
Figure 11C:
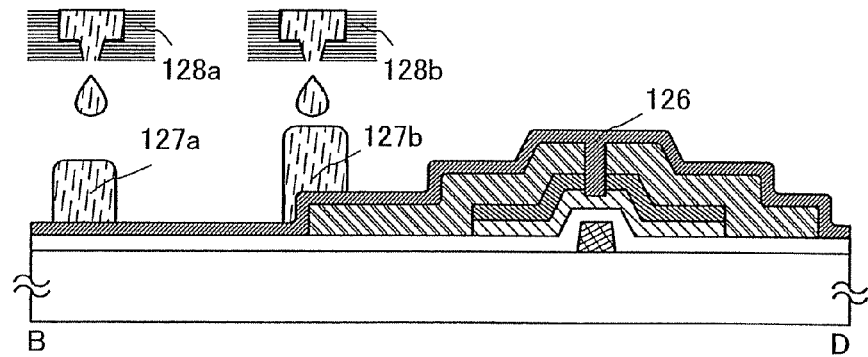

In this embodiment mode, the mask layer used for the first electrode layer is formed through at least two steps. When the mask layer is formed, a first liquid composition containing a mask-layer-forming material is applied on the outer side of a pattern that is desired to be formed (corresponding to a contour or an edge portion of the pattern), and a first mask layer having a frame shape is formed. As shown in FIGS. 11A to 11C, a first mask layer 127 (127a and 127b) having a frame shape is formed over the conductive film 126 by droplet discharging apparatuses 128a and 128b.

Figure 12A:
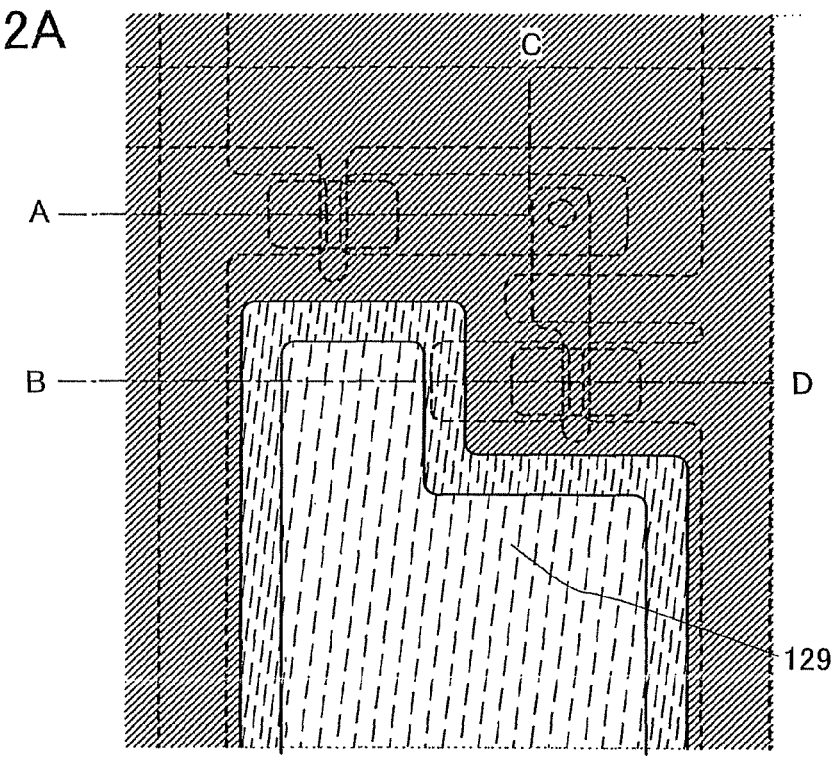
FIGS. 12A to 12C are explanatory views of a method for manufacturing a display device of the present invention.
Figure 12B:
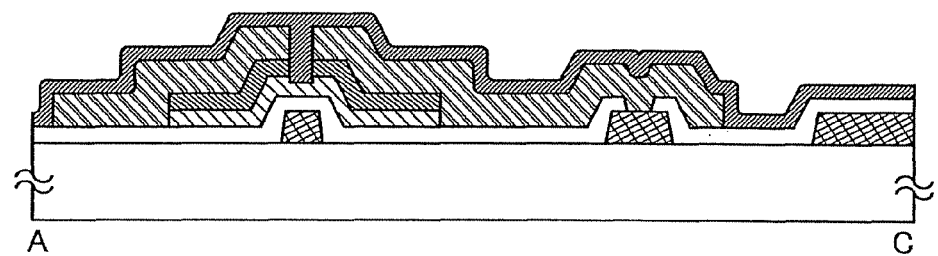
Figure 12C:
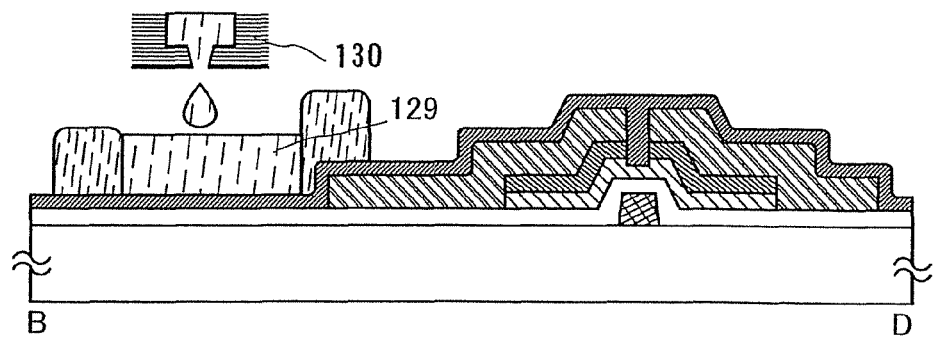
Figure 13A:
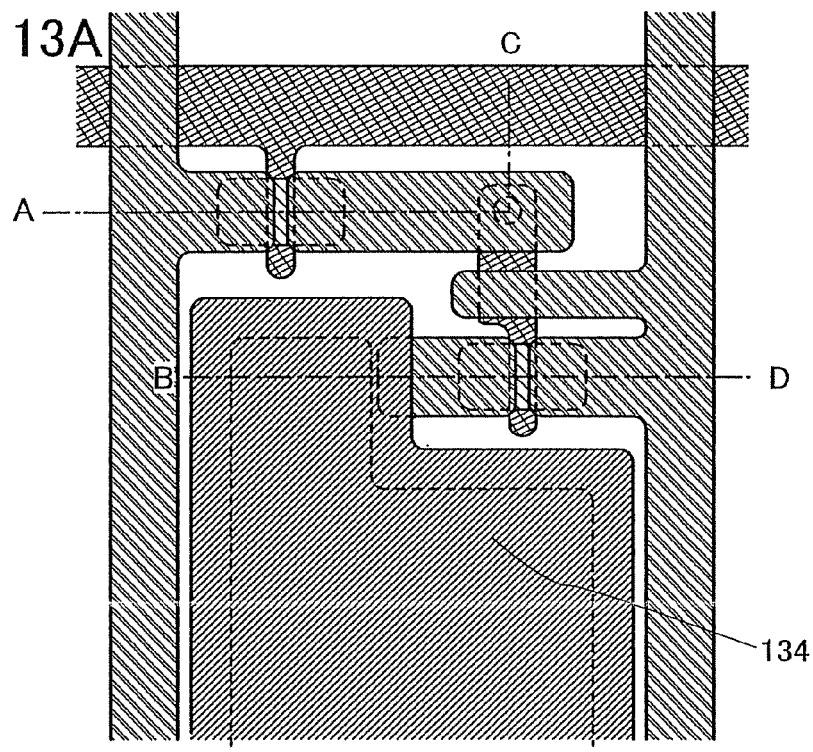
Figure 13B:
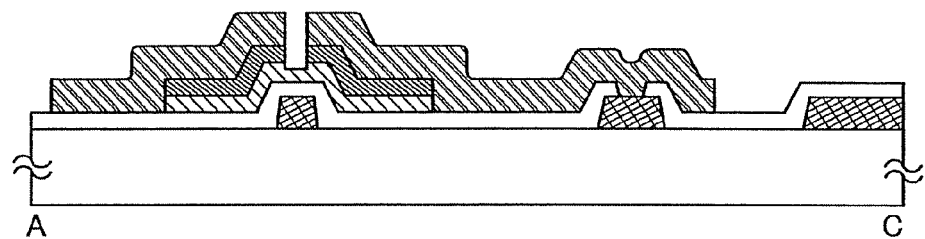
Figure 13B:
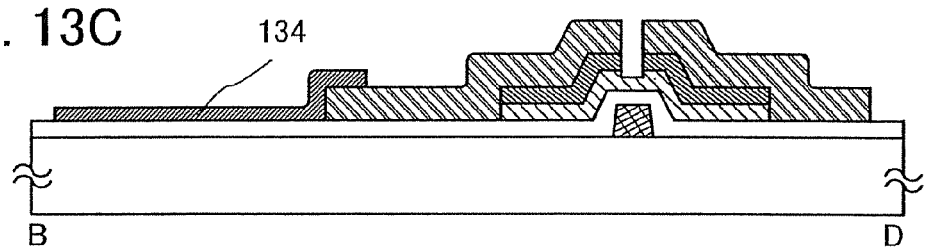

It is preferable that the first mask layer be a closed region like a frame. Next, a second liquid composition containing a mask-layer-forming material is applied so as to fill the space inside the first mask layer having a frame shape, whereby a second mask layer is formed. As shown in FIGS. 12A to 12C, a second mask layer 129 is formed by a droplet discharging apparatus 130 inside the frame formed of the first mask layer 127 over the conductive film 126. The first mask layer 127 and the second mask layer 129 are formed to be in contact with each other, and the first mask layer 127 is formed to surround the second mask layer 129; therefore, the first mask layer 127 and the second mask layer 129 can be used as one continuous mask layer.

When a mask layer or the like is formed using a liquid composition, a shape of a mask layer to be formed is greatly influenced by the viscosity of a composition, drying conditions in solidification (such as temperature or pressure), wettability with respect to a formation region, and the like. Therefore, with low viscosity or high wettability with respect to a formation region, a liquid composition spreads over a region where a conductive layer or the like is formed. On the other hand, with high viscosity or low wettability with respect to a formation region, there is a problem in that space (also referred to as pin holes) and unevenness are formed in or on the surface of the mask layer and a level of planarity is decreased.

Therefore, in the present invention, when the first mask layer which determines a contour of a region where the mask layer is formed is formed by applying a composition with relatively high viscosity and low wettability with respect to a formation region, a side edge portion which becomes a contour of a desired pattern can be formed with high controllability. When a liquid composition with low viscosity and high wettability with respect to a formation region is applied inside a frame formed of the first mask layer, and the mask layer with high planarity and uniformity and with less space, unevenness, and the like due to bubbles and the like formed in or on its surface, can be formed. Therefore, by separate formation of an outer-side mask layer and an inner-side mask layer, a mask layer that has a high level of planarity, less defects, and a desired pattern can be formed with high controllability.

The conductive film 126 is processed using the first mask layer 127 and the second mask layer 129 to form a first electrode layer 134. Since the first mask layer 127 and the second mask layer 129 with planarity and less defects are used, the first electrode layer 134 can be formed into a desired shape with high controllability, and a defective shape and the like are not generated.

As the mask layer, a resin material such as an epoxy resin, a phenol resin, a novolac resin, an acrylic resin, a melamine resin, or a urethane resin is used. Moreover, the mask layer is formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing photosensitizer may be used. For example, a positive type resist or a negative type resist may be used. In using any material, the surface tension and the viscosity of a material are appropriately adjusted by adjusting the concentration of a solvent or by adding a surfactant or the like.

The conductive film 126 may be processed by etching by dry etching or wet etching. An ICP (Inductively Coupled Plasma) etching method may be used, and etching conditions (the amount of electric power applied to a coil-shaped electrode, the amount of electric power applied to an electrode on a substrate side, the electrode temperature on the substrate side, and the like) may be appropriately adjusted, and the electrode layer may be etched into a tapered shape. It is to be noted that, as an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be appropriately used.

The first electrode layer 134 may be cleaned or polished by a CMP method or with the use of a polyvinyl alcohol based porous material, so that the surface thereof is planarized. In addition, after polishing using a CMP method, ultraviolet light irradiation, oxygen plasma treatment, or the like may be performed on the surface of the first electrode layer 134.

Through the above process, a TNT substrate for a display panel in which a bottom-gate TFT and the first electrode layer 134 are connected to each other over the substrate 100 is completed. The TFT in this embodiment mode is reverse staggered type.

Next, an insulating layer 131 (also called a partition wall) is selectively formed. The insulating layer 131 is formed so as to have an opening over the first electrode layer 134. In this embodiment mode, the insulating layer 131 is formed over the entire surface and patterned by etching with the use of a mask such as resist. When the insulating layer 131 is formed by a droplet discharging method, a printing method, a dispenser method, or the like by which the pattern can be formed directly and selectively, the patterning by etching does not need to be carried out.

The insulating layer 131 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular material such as polyimide, aromatic polyamide, or polybenzimidazole; an insulating material of inorganic siloxane which includes a Si—O—Si bond among compounds which are formed using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may also be used. It is preferable that the insulating layer 131 be formed to have a continuously-changing radius of curvature, because the coverage by an electroluminescent layer 132 and a second electrode layer 133 to be formed over the insulating layer 131 improves.

After the insulating layer 131 is formed by discharging a composition by a droplet-discharging method, a surface thereof may be planarized by pressing with pressure to enhance a level of planarity. As a pressing method, concavity and convexity of the surface may be reduced by scanning the surface by a roller-shaped object, or the surface may be pressed perpendicularly by a flat plate-shaped object. Alternatively, concavity and convexity of the surface may be removed with an air knife after the surface is softened or melted with a solvent or the like. A CMP method may also be used for polishing the surface. This step can be employed in planarizing the surface when the surface becomes uneven by a droplet-discharging method. When a level of planarity is enhanced by this step, irregular display of the display panel can be prevented, and thus, a high precision image can be displayed.

A light-emitting element is formed over the substrate 100 that is a TFT substrate for the display panel (refer to FIGS. 14A and 14B).

Before an electroluminescent layer 132 is formed, heat treatment is carried out at 200° C. in the atmospheric pressure to remove moisture in the first electrode layer 134 and the insulating layer 131 or moisture adsorbed on their surfaces. It is preferable to carry out the heat treatment at 200 to 400° C., much preferably 250 to 350° C., under low pressure and to form the electroluminescent layer 132 successively without exposing the substrate to the air by a vacuum evaporation method or a droplet discharging method under low pressure.

As the electroluminescent layer 132, materials emitting light of red (R), green (G), and blue (B) are selectively formed by an evaporation method or the like using evaporation masks. The materials emitting light of red (R), green (G), and blue (B) can also be formed by a droplet discharging method similarly to a color filter (such as a low-molecular material or a high-molecular material), and thus, materials for R, G, and B can be selectively formed without using masks, which is preferable. A second electrode layer 133 is formed over the electroluminescent layer 132, and a display device having a display function using a light-emitting element is completed.

Although not shown in the drawings, it is effective to provide a passivation film so as to cover the second electrode layer 133. A passivation (protection) film provided in manufacturing a display device may have a single layer structure or a multilayer structure. The passivation film can be formed using an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide containing more nitrogen than oxygen (AlNO), aluminum oxide, diamond-like carbon (DLC), or carbon-containing nitrogen ($CN_x$) with a single-layer structure or a stacked layer structure. For example, a stacked layer such as a carbon-containing nitrogen ($CN_x$) film and silicon nitride (SiN) film, or an organic material can also be used, and a stacked layer of a high molecular material such as styrene polymer may also be used. Alternatively, a siloxane material may also be used.

At this time, it is preferable to use a film by which favorable coverage is provided as the passivation film, and it is effective to use a carbon film, particularly, a DLC film for the passivation film. A DLC film can be formed in the temperature range from room temperature to less than or equal to 100° C.; therefore, it can also be formed easily over the electroluminescent layer with low heat resistance. A DLC film can be formed by a plasma CVD method (typically, an RF plasma CVD method, a microwave CVD method, an electron cyclotron resonance (ECR) CVD method, a heat filament CVD method, or the like), a combustion method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge, and the ions are accelerated to impact against a cathode to which negative self-bias voltage is applied. Further, a CN film may be formed with the use of a $C_2H_4$ gas and a $N_2$ gas as a reaction gas. A DLC film has high blocking effect against oxygen; therefore, oxidization of the electroluminescent layer can be suppressed. Accordingly, a problem such as oxidation of the electroluminescent layer during a sealing step that is performed later can be prevented.

A sealing material is formed over the substrate 100 having an element, and the substrate 100 having the element is sealed using a sealing substrate. Thereafter, a flexible wiring board may be connected to a gate wiring layer that is formed to be electrically connected to the gate electrode layer 104, so that electrical connection to an external portion is obtained. This is also applied to a source wiring layer that is formed to be electrically connected to the source electrode layer or drain electrode layer 120 that is also a source wiring layer.

A space between the substrate 100 having the element and the sealing substrate is filled with a filler and is then sealed. A dripping method can also be used for filling with the filler and the sealing. Instead of the filler, the space may be filled with an inert gas such as nitrogen. In addition, when a drying agent is provided in the display device, deterioration due to moisture in the light-emitting element can be prevented. The drying agent may be provided on the sealing substrate side or the substrate 100 side having the element. Alternatively, a concave portion may be formed in a region where the sealing material is formed in the substrate, and the drying agent may be provided there. Further, when the drying agent is provided in a place corresponding to a region which does not contribute to display such as a driver circuit region or a wiring region of the sealing substrate, an aperture ratio is not decreased even if the drying agent is an opaque substance. The filler may contain a hygroscopic material so as to have a function as a drying agent. As described above, a display device having a display function using a light-emitting element is completed.

In this embodiment mode, the switching TFT has a single gate structure, but may have a multi-gate structure such as a double gate structure. When the semiconductor layer is formed of SAS or a crystalline semiconductor, an impurity region can be formed by addition of an impurity imparting one conductivity type. In this case, the semiconductor layer may have impurity regions with different concentrations. For example, a low-concentration impurity region may be provided in the semiconductor layer around a channel region and a region overlapping with the gate electrode layer, and a high-concentration impurity region may be provided in a region on the outer side of the low-concentration impurity region.

This embodiment mode can be appropriately combined with Embodiment Mode 1 or 2.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 4

In this embodiment mode, an example of a highly reliable display device which is manufactured through a simplified process at low cost will be described. More specifically, a light-emitting display device using a light-emitting element as a display element will be described. A method for manufacturing a display device of this embodiment mode will be described with reference to FIGS. 15A and 15B.

As a base film over a substrate 150 having an insulating surface, a base film 151a is formed using a silicon nitride oxide film with a thickness of 10 to 200 nm (preferably, 50 to 150 nm), and a base film 151b is formed using a silicon oxynitride film with a thickness of 50 to 200 nm (preferably, 100 to 150 nm) by a sputtering method, a PVD (Physical Vapor Deposition) method, or a CVD (Chemical Vapor Deposition) method such as a low pressure CVD (LPCVD) method or a plasma CVD method. Alternatively, it is also possible to use an acrylic acid, a methacrylic acid, or a derivative thereof;

a heat-resistant high-molecular material such as polyimide, aromatic polyamide, or polybenzimidazole; or a siloxane resin. Further, other resin materials such as a vinyl resin, e.g. polyvinyl alcohol or polyvinyl butyral, an epoxy rein, a phenol resin, a novolac resin, an acrylic rein, a melamine resin, and a urethane resin can be used. In addition, it is also possible to use an organic material such as benzocyclobutene, parylene, fluorinated arylene ether, or polyimide, or a composition material containing water-soluble homopolymers and water-soluble copolymers. Further, an oxazole resin such as photo-curing polybenzoxazole can also be used.

Further, a droplet discharging method, a printing method (a method by which a pattern can be formed, such as screen printing or offset printing), a coating method such as a spin coating method, a dipping method, a dispenser method, or the like can also be used. In this embodiment mode, the base films 151a and 151b are formed by a plasma CVD method. As the substrate 150, a glass substrate, a quartz substrate, a silicon substrate, a metal substrate, or a stainless steel substrate having an insulating film formed on its surface may be used. Alternatively, a plastic substrate having heat resistance which can withstand the processing temperature in this embodiment mode, or a flexible substrate such as a film may also be used. As a plastic substrate, a substrate made of PET (polyethylene terephthalate), PEN (polyethylene naphthalate), or PES (polyethersulfone) can be used. As a flexible substrate, a synthetic resin such as acrylic can be used. Since a display device manufactured in this embodiment mode has a structure in which light is extracted from the light-emitting element through the substrate 150, the substrate 150 needs to have a light-transmitting property.

As the base film, silicon oxide, silicon nitride, silicon oxynitride, silicon nitride oxide, or the like can be used, and either a single layer structure or a stacked layer structure including two or three layers can be employed.

Next, a semiconductor film is formed over the base film. The semiconductor film may be formed with a thickness of 25 to 200 nm (preferably, 30 to 150 nm) by various methods (such as a sputtering method, an LPCVD method, and a plasma CVD method). In this embodiment mode, it is preferable to use a crystalline semiconductor layer which is obtained by crystallizing an amorphous semiconductor film by laser irradiation.

The semiconductor film obtained as described above may be doped with a small amount of an impurity element (boron or phosphorus) in order to control the threshold voltage of thin film transistors. Such doping with the impurity element may be performed before the crystallization step of the amorphous semiconductor film. When the amorphous semiconductor film is doped with an impurity element and then subjected to heat treatment to be crystallized, activation of the impurity element can also be performed. In addition, defects caused in doping can be recovered.

Then, the crystalline semiconductor film is patterned by etching into a desired shape, whereby a semiconductor layer is formed.

An etching process for patterning the semiconductor film into a desired shape may employ either plasma etching (dry etching) or wet etching. In a case of processing a large substrate, plasma etching is suitable. As an etching gas, a fluorine-based gas such as $CF_4$ or $NF_3$ or a chlorine-based gas such as $Cl_2$ or $BCl_3$ is used, to which an inert gas such as He or Ar may be appropriately added. When an etching process using atmospheric discharge plasma is employed, local discharging process is also possible, and the mask layer does not need to be formed over the entire surface of the substrate.

In the present invention, a conductive layer for forming a wiring layer or an electrode layer, a mask layer for forming a predetermined pattern, or the like may also be formed by a method by which a pattern can be selectively formed, such as a droplet discharging method. By a droplet discharging (jetting) method (also called an ink jet method depending on its system), a predetermined pattern (such as a conductive layer or an insulating layer) can be formed by selectively discharging (jetting) a droplet of a composition which is mixed for a particular purpose. At this time, treatment to control wettability or adhesion may be carried out to a formation region. In addition, a method by which a pattern can be transferred or drawn, for example, a printing method (a method for forming a pattern, such as screen printing or offset printing), a dispenser method, or the like can also be used. In this embodiment mode, a gate electrode layer, a semiconductor layer, a source electrode layer, a drain electrode layer, and the like can be formed using a mask layer which is formed selectively and precisely in a plurality of steps by a droplet discharging method or the like as in Embodiment Mode 1. Therefore, the process can be simplified, and loss of materials can be prevented; therefore, the cost can be reduced.

In this embodiment mode, as a mask, a resin material such as an epoxy resin, an acrylic resin, a phenol resin, a novolac resin, a melamine resin, or a urethane resin is used. Alternatively, an organic material such as benzocyclobutene, parylene, fluorinated arylene ether, or polyimide having a light transmitting property; a compound material formed by polymerization of siloxane-based polymers or the like; a composition material containing a water-soluble homopolymer and a water-soluble copolymer; and the like can also be used. Further alternatively, a commercially available resist material containing a photosensitiser may also be used. For example, a novolac resin and a naphthoquinonediazide compound that is a photosensitizer, which are typical positive type resists; a base resin, diphenylsilanediol, and an acid generation agent, which are negative type resists; or the like may be used. A droplet discharging method is used with any material, and the surface tension and the viscosity of a material are appropriately adjusted by adjusting the concentration of a solvent or by adding a surfactant or the like.

A gate insulating layer 157 covering the semiconductor layer is formed. The gate insulating layer is formed using an insulating film containing silicon with a thickness of 10 to 150 nm by a plasma CVD method, a sputtering method, or the like. The gate insulating layer may be formed using a known material such as an oxide material or a nitride material of silicon, typified by silicon nitride, silicon oxide, silicon oxynitride, and silicon nitride oxide, and may be a stacked layer or a single layer. For example, the insulating layer may be a stacked layer of three layers including a silicon nitride film, a silicon oxide film, and a silicon nitride film, or a single layer or a stacked layer of two layers of a silicon oxynitride film.

Next, a gate electrode layer is formed over the gate insulating layer. The gate electrode layer can be formed by a sputtering method, an evaporation method, a CVD method, or the like. The gate electrode layer may be formed using an element such as tantalum (Ta), tungsten (W), titanium (Ti), molybdenum (Mo), aluminum (Al), copper (Cu), chromium (Cr), or neodymium (Nd), or an alloy material or a compound material containing these elements as its main component. Further, as the gate electrode layer, a semiconductor film typified by a polycrystalline silicon film doped with an impurity element such as phosphorus, or AgPdCu alloy may be used. In addition, the gate electrode layer may be a single layer or a stacked layer.

In this embodiment mode, the gate electrode layer is formed into a tapered shape; however, the present invention is not limited thereto. The gate electrode layer may have a stacked layer structure, where only one layer has a tapered shape while the other has a perpendicular side surface by anisotropic etching. The taper angles may be different between the stacked gate electrode layers as in this embodiment mode, or the taper angles may be the same. With the tapered shape, coverage by a film that is stacked thereover is improved and defects are reduced, whereby reliability is enhanced.

The gate insulating layer may be etched to some extent and reduced in thickness (so-called film decrease) by the etching step for forming the gate electrode layer.

An impurity element is added to the semiconductor layer to form an impurity region. The impurity region can be formed as a high-concentration impurity region and a low-concentration impurity region through the control of the concentration of the impurity element. A thin film transistor having a low-concentration impurity region is referred to as a thin film transistor having an LDD (Light doped drain) structure. In addition, the low-concentration impurity region can be formed so as to overlap with the gate electrode. Such a thin film transistor is referred to as a thin film transistor having a GOLD (Gate Overlapped LDD) structure. The polarity of the thin film transistor is made n-type through addition of phosphorus (P) or the like to an impurity region thereof. In a case where a p-type thin film transistor is formed, boron (B) or the like may be added.

In this embodiment mode, a region of the impurity region, which overlaps with the gate electrode layer with the gate insulating layer interposed therebetween, is denoted as a Lov region. Further, a region of the impurity region, which does not overlap with the gate electrode layer with the gate insulating layer interposed therebetween, is denoted as a Loff region. In FIG. 15B, the impurity regions are shown by hatching and a blank space. This does not mean that the blank space is not doped with an impurity element, but makes it easy to understand that the concentration distribution of the impurity element in these regions reflects the mask and the doping condition. It is to be noted that this is the same in other drawings of this specification.

In order to activate the impurity element, heat treatment, strong light irradiation, or laser beam irradiation may be performed. At the same time as the activation, plasma damage to the gate insulating layer and plasma damage to the interface between the gate insulating layer and the semiconductor layer can be recovered.

Next, a first interlayer insulating layer which covers the gate electrode layer and the gate insulating layer 157 is formed. In this embodiment mode, a stacked layer structure of insulating films 167 and 168 is employed. As the insulating films 167 and 168, a silicon nitride film, a silicon nitride oxide film, a silicon oxynitride film, a silicon oxide film, or the like can be formed by a sputtering method or a plasma CVD method. Alternatively, other insulating films containing silicon may also be used as a single layer or a stacked layer structure including three or more layers.

Further, heat treatment is performed at 300 to 550° C. for 1 to 12 hours in a nitrogen atmosphere, and the semiconductor layer is hydrogenated. Preferably, this heat treatment is performed at 400 to 500° C. Through this step, dangling bonds in the semiconductor layer are terminated by hydrogen contained in the insulating film 167 that is an interlayer insulating layer. In this embodiment mode, heat treatment is performed at 410° C.

The insulating films 167 and 168 can also be formed using a material of aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, or other substances containing an inorganic insulating material. A material containing siloxane may also be used. Further, an organic insulating material such as polyimide, acrylic, polyamide, polyimide amide, resist, or benzocyclobutene may also be used. In addition, an oxazole resin can be used, and for example, photo-curable type polybenzoxazole or the like can be used.

Next, a contact hole (opening), which reaches the semiconductor layer, is formed in the insulating films 167 and 168, and the gate insulating layer with the use of a mask formed of a resist. A conductive film is formed so as to cover the opening, and the conductive film is etched, whereby a source electrode layer or drain electrode layer is formed, which is electrically connected to part of a source region or drain region. In order to form the source electrode layer or drain electrode layer, a conductive film is formed by a PVD method, a CVD method, an evaporation method, or the like, and the conductive film is etched into a desired shape. Further, the conductive film can be selectively formed in a predetermined place by a droplet discharging method, a printing method, a dispenser method, an electrolytic plating method, or the like. A reflow method or a damascene method may also be used. The source electrode layer or drain electrode layer is formed using a metal such as Ag, Au, Cu, Ni, Pt, Pd, Ir, Rh, W, Al, Ta, Mo, Cd, Zn, Fe, Ti, Si, Ge, Zr, or Ba, or alloy or nitride thereof. In addition, a stacked layer structure of these materials may also be used.

Through the above steps, an active matrix substrate can be manufactured, in which a p-channel thin film transistor 285 having a p-type impurity region in a Lov region and an n-channel thin film transistor 275 having an n-channel impurity region in a Lov region are provided in a peripheral driver circuit region 204; and a multi-channel type n-channel thin film transistor 265 having an n-type impurity region in a Loff region and a p-channel thin film transistor 255 having a p-type impurity region in a Lov region are provided in a pixel region 206.

The structure of the thin film transistor in the pixel region is not limited to this embodiment mode, and a single gate structure in which one channel formation region is formed, a double gate structure in which two channel formation regions are formed, or a triple gate structure in which three channel formation regions are formed may be employed. Further, the thin film transistor in the peripheral driver circuit region may also employ a single gate structure, a double gate structure, or a triple gate structure.

Next, an insulating film 181 is formed as a second interlayer insulating layer. In FIGS. 15A and 15B, a separation region 201 for separation by scribing, an external terminal connection region 202 to which an FPC is attached, a wiring region 203 that is a lead wiring region for the peripheral portion, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed using a material of silicon oxide, silicone nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminium oxide, diamond-like carbon (DLC), nitrogen-containing carbon (CN), PSG (phosphorus glass), BPSG (boron phosphorus glass), alumina, or other substances containing an inorganic insulating material. In addition, a siloxane resin may also be used. Further, a photosensitive or non-photosensitive organic insulating material such as polyimide, acrylic, polyamide, polyimide amide, resist, benzocyclobutene, polysilazane, or a low-dielectric constant material (Low-k material) can also be used. In addition, an oxazole resin can be used, and for example, photo-curable type polybenzoxazole or the like can be used. An interlayer insulating layer provided for planarization is required to have high heat resistance, a high insulating property, and a high level of planarity. Thus, the insulating film 181 is preferably formed by a coating method typified by a spin coating method.

The insulating film 181 can be formed by a dipping method, spray coating, a doctor knife, a roll coater, a curtain coater, a knife coater, a CVD method, evaporation method, or the like. The insulating film 181 may also be formed by a droplet discharging method. In the case of a droplet discharging method, a material solution can be saved. In addition, a method by which a pattern can be transferred or drawn, like a droplet discharging method, for example, a printing method (a method for forming a pattern, such as screen printing or offset printing), a dispenser method, or the like can also be used.

A minute opening, that is, a contact hole is formed in the insulating film 181 in the pixel region 206. The source electrode layer or drain electrode layer is electrically connected to a first electrode layer 185 through the opening formed in the insulating film 181. The opening formed in the insulating film 181 can be formed by irradiation with a laser beam as shown in Embodiment Mode 2. In this embodiment mode, the source electrode layer or drain electrode layer is formed using a low-melting point metal that is relatively easily evaporated (chromium in this embodiment mode). The source electrode layer or drain electrode layer is selectively irradiated with a laser beam from the insulating film 181 side, whereby part of an irradiated region of the source electrode layer or drain electrode layer is evaporated by irradiation energy. The insulating film 181 over the irradiated region of the source electrode layer or drain electrode layer is removed, and the opening can be formed. The first electrode layer 185 is formed in the opening where the source electrode layer or drain electrode layer is exposed, and the source electrode layer or drain electrode layer and the first electrode layer 185 can be electrically connected to each other.

The first electrode layer 185 functions as an anode or a cathode, and may be formed using an element such as Ti, Ni, W, Cr, Pt, Zn, Sn, In, or Mo; an alloy material or a compound material containing the above elements as its main component such as TiN, $TiSi_xN_y$, $WSi_x$, $WN_x$, $WSi_xN_y$, or NbN; or a stacked film thereof with a total thickness of 100 to 800 nm.

In this embodiment mode, a light-emitting element is used as a display element, and the first electrode layer 185 has a light-transmitting property because light from the light-emitting element is extracted from the first electrode layer 185 side. The first electrode layer 185 is formed using a transparent conductive film which is etched into a desired shape.

In the present invention, the first electrode layer 185 that is a light-transmitting electrode layer may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide doped with silicon oxide (ITSO), or the like can also be used.

In addition, even in the case of a non-light-transmitting material such as a metal film, when the thickness is made thin (preferably, about 5 to 30 nm) so as to be able to transmit light, light can be emitted from the first electrode layer 185. As a metal thin film that can be used for the first electrode layer 185, a conductive film formed of titanium, tungsten, nickel, gold, platinum, silver, aluminum, magnesium, calcium, lithium, or alloy thereof, or the like can be used.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 is preferably formed with a total thickness of 100 to 800 nm.

The first electrode layer 185 may be cleaned or polished by a CMP method or with the use of a polyvinyl alcohol based porous material, so that the surface thereof is planarized. In addition, after polishing using a CMP method, ultraviolet light irradiation, oxygen plasma treatment, or the like may be performed on the surface of the first electrode layer 185.

Heat treatment may be performed after the first electrode layer 185 is formed. By the heat treatment, moisture contained in the first electrode layer 185 is discharged. Accordingly, degasification or the like is not caused in the first electrode layer 185. Thus, even when a light-emitting material that is easily deteriorated by moisture is formed over the first electrode layer, the light-emitting material is not deteriorated; therefore, a highly reliable display device can be manufactured.

Next, an insulating layer 186 (also referred to as a partition wall or a barrier) is formed to cover the edge of the first electrode layer 185 and the source electrode layer or drain electrode layer.

The insulating layer 186 can be formed using silicon oxide, silicon nitride, silicon oxynitride, silicon nitride oxide, or the like, and may have a single layer structure or a stacked layer structure including two or three layers. In addition, as other materials for the insulating layer 186, a material of aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, or other substances containing an inorganic insulating material can be used. A material containing siloxane may also be used. Further, a photosensitive or non-photosensitive organic insulating material such as polyimide, acrylic, polyamide, polyimide amide, resist, benzocyclobutene, or polysilazane, can also be used. In addition, an oxazole resin can be used, and for example, photo-curable type polybenzoxazole or the like can be used.

The insulating layer 186 can be formed by a sputtering method, a PVD (Physical Vapor deposition) method, a CVD method such as a low-pressure CVD (LPCVD) method or a plasma CVD method, a droplet discharging method by which a pattern can be selectively formed, a printing method by which a pattern can be transferred or drawn (a method for forming a pattern such as screen printing or offset printing), a dispenser method, a coating method such as a spin coating method, or a dipping method.

An etching process for forming a desired shape may employ either plasma etching (dry etching) or wet etching. In the case where a large substrate is processed, plasma etching is more suitable. As an etching gas, a fluorine based gas such as $CF_4$ or $NF_3$, or a chlorine based gas such as $Cl_2$, or $BCl_3$ is used, to which an inert gas such as He or Ar may be appropriately added. When an etching process using atmospheric discharge plasma is employed, a local discharging process is also possible, and the mask layer does not need to be formed over the entire surface of the substrate.

As shown in FIG. 15A, in a connection region 205, a wiring layer formed of the same material and through the same step as those of a second electrode layer is electrically connected to a wiring layer formed of the same material and through the same step as those of the gate electrode layer.

A light-emitting layer 188 is formed over the first electrode layer 185. Although only one pixel is shown in FIG. 15B, electroluminescent layers corresponding to R (red), G (green) and B (blue) are formed in this embodiment mode.

Then, a second electrode layer 189 formed of a conductive film is provided over the light-emitting layer 188. As the second electrode layer 189, Al, Ag, Li, Ca, or an alloy or a compound thereof such as MgAg, MgIn, AlLi, or $CaF_2$, or calcium nitride may be used. In this manner, a light-emitting element 190 including the first electrode layer 185, the light-emitting layer 188, and the second electrode layer 189 is formed (refer to FIG. 15B).

In the display device of this embodiment mode shown in FIGS. 15A and 15B, light from the light-emitting element 190 is emitted from the first electrode layer 185 side to be transmitted in a direction indicated by an arrow in FIG. 15B.

In this embodiment mode, an insulating layer may be provided as a passivation film (protective film) over the second electrode layer 189. It is effective to provide a passivation film so as to cover the second electrode layer 189 as described above. The passivation film may be formed using an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon, and a single layer or a stacked layer of the insulating films can be used. Alternatively, a siloxane resin may also be used.

At this time, it is preferable to form the passivation film using a film by which favorable coverage is provided, and it is effective to use a carbon film, particularly, a DLC film for the passivation film. A DLC film can be formed in the temperature range from room temperature to less than or equal to 100° C.; therefore, it can also be formed easily over the light-emitting layer 188 with low heat resistance. A DLC film can be formed by a plasma CVD method (typically, an RF plasma CVD method, a microwave CVD method, an electron cyclotron resonance (ECR) CVD method, a heat filament CVD method, or the like), a combustion method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge, and the ions are accelerated to impact against a cathode to which negative self-bias voltage is applied. Further, a CN film may be formed with the use of a $C_2H_4$ gas and a $N_2$ gas as a reaction gas. A DLC film has high blocking effect against oxygen; therefore, oxidization of the light-emitting layer 188 can be suppressed. Accordingly, a problem such as oxidation of the light-emitting layer 188 during a sealing step which is performed later can be prevented.

The substrate 150 over which the light-emitting element 190 is formed and a sealing substrate 195 are firmly attached to each other with a sealing material 192, whereby the light-emitting element is sealed (refer to FIGS. 15A and 15B). As the sealing material 192, typically, a visible light curable resin, an ultraviolet light curable resin, or a thermosetting resin is preferably used. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine-based resin, a heterocyclic epoxy resin, a modified epoxy resin, or the like can be used. It is to be noted that a region surrounded by the sealing material may be filled with a filler 193, and the region may include nitrogen or the like by performing the filling and the sealing in a nitrogen atmosphere. Since a bottom emission type is employed in this embodiment mode, the filler 193 does not need to transmit light. However, in a case where light is extracted through the filler 193, the filler needs to transmit light. Typically, a visible light curable epoxy resin, an ultraviolet light curable epoxy resin, or a thermosetting epoxy resin may be used. Through the aforementioned steps, a display device having a display function using the light-emitting element of this embodiment mode is completed. Further, the filler may be dripped in a liquid state to fill the display device. Through the use of a hygroscopic substance like a drying agent as the filler, further moisture absorbing effect can be obtained, whereby the element can be prevented from deteriorating.

A drying agent is provided in an EL display panel to prevent deterioration due to moisture in the element. In this embodiment mode, the drying agent is provided in a concave portion that is formed so as to surround the pixel region on the sealing substrate, whereby a thin design is not hindered. Further, when the drying agent is also formed in a region corresponding to a gate wiring layer so that a moisture absorbing area becomes wide, moisture can be effectively absorbed. In addition, when the drying agent is formed over a gate wiring layer which does not emit light from itself, light extraction efficiency is not decreased, either.

The light-emitting element is sealed by a glass substrate in this embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet light curable resin, and a method for sealing the light-emitting element by a thin film having a high barrier property such as a metal oxide film or a metal nitride film is used. As the cover material, glass, ceramics, plastics, or metal can be used, and a material which transmits light is necessary to be used in the case where light is emitted to the cover material side. The cover material and the substrate over which the light-emitting element is formed are attached to each other with a sealing material such as a thermosetting resin or an ultraviolet light curable resin, and a sealed space is formed through curing of the resin by heat treatment or ultraviolet light irradiation treatment. It is also effective to provide a moisture absorbing material typified by barium oxide in this sealed space. This moisture absorbing material may be provided on and in contact with the sealing material, or over or in the periphery of the partition wall so as not to shield light from the light-emitting element. Further, the space between the cover material and the substrate over which the light-emitting element is formed can be filled with a thermosetting resin or an ultraviolet light curable resin. In this case, it is effective to add a moisture absorbing material typified by barium oxide in the thermosetting resin or the ultraviolet light curable resin.

In addition, the source electrode layer or drain electrode layer and the first electrode layer do not need to be directly in contact with each other to be electrically connected, but may be connected to each other through a wiring layer.

In this embodiment mode, the terminal electrode layer 178 is connected to an FPC 194 through an anisotropic conductive layer 196 in the external terminal connection region 202, and electrically connected to an external portion. In addition, as shown in FIG. 15A that is a top view of the display device, the display device manufactured in this embodiment mode includes a peripheral driver circuit region 207 and a peripheral driver circuit region 208 each including a scanning line driver circuit in addition to the peripheral driver circuit region 204 and the peripheral driver circuit region 209 each including a signal line driver circuit.

The circuit as described above is used in this embodiment mode; however, the present invention is not limited thereto. An IC chip may be mounted by the aforementioned COG method or TAB method as the peripheral driver circuit. Further, single or plural gate line driver circuits and source line driver circuits may be provided.

In the display device of the present invention, a driving method for image display is not particularly limited, and for example, a dot sequential driving method, a line sequential driving method, an area sequential driving method, or the like may be used. Typically, a line sequential driving method may be used, and a time division gray scale driving method and an area gray scale driving method may be appropriately used. Further, a video signal input to the source line of the display device may be an analog signal or a digital signal. The driver circuit and the like may be appropriately designed in accordance with the video signal.

This embodiment mode can be appropriately combined with Embodiment Mode 1 or 2.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 5

A thin film transistor can be formed by employing the present invention, and a display device can be formed by using the thin film transistor. When a light-emitting element is used and a transistor for driving the light-emitting element is to be an n-channel transistor, light is emitted from the light-emitting element in the following manner: bottom-emission, top-emission, or dual-emission. Here, a stacked layer structure of the light-emitting element in each case will be described with reference to FIGS. 17A to 17C.

In this embodiment mode, channel protective thin film transistors 461, 471, and 481 to which the present invention is applied are used. The thin film transistor 481 is provided over a light-transmitting substrate 480 and includes a gate electrode layer 493, a gate insulating film 497, a semiconductor layer 494, an n-type semiconductor layer 495a, an n-type semiconductor layer 495b, a source electrode layer or drain electrode layer 487a, a source electrode layer or drain electrode layer 487b, and a channel protective layer 496. The gate electrode layer, the semiconductor layer, the source electrode layer, the drain electrode layer, or the like can be processed using a mask layer formed selectively and precisely by a droplet discharge method or the like. Therefore, the process can be simplified, and loss of materials and the cost can be reduced.

In this embodiment mode, an amorphous semiconductor layer is used as the semiconductor layer. However, the present invention is not limited to this embodiment mode, and a crystalline semiconductor layer can be used as the semiconductor layer, and an n-type semiconductor layer can be used as the semiconductor layer having one conductivity type. Instead of formation of the n-type semiconductor layer, conductivity may be imparted to the semiconductor layer by plasma treatment with a $PH_3$ gas. When a crystalline semiconductor layer like polysilicon is used, the semiconductor layer having one conductivity type is not formed, and an impurity region having one conductivity type may be formed by introduction (addition) of an impurity to the crystalline semiconductor layer. In addition, an organic semiconductor such as pentacene can also be used. When the organic semiconductor is selectively formed by a droplet discharging method or the like, the process can be simplified.

A case where a crystalline semiconductor layer is used as the semiconductor layer will be described. First, an amorphous semiconductor layer is crystallized to form a crystalline semiconductor layer. In a crystallization step in which an amorphous semiconductor layer is crystallized to form a crystalline semiconductor layer, an element which promotes crystallization (also referred to as a catalytic element or a metal element) is added to the amorphous semiconductor layer, and crystallization is performed by heat treatment (at 550 to 750° C. for 3 minutes to 24 hours). As a metal element which promotes crystallization of silicon, one or a plurality of kinds of metal such as iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed to be in contact with the crystalline semiconductor layer and is made to function as a gettering sink. As the impurity element, an impurity element imparting n-type conductivity, an impurity element imparting p-type conductivity, a rare gas element, or the like can be used. For example, one or a plurality of kinds of elements such as phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed to be in contact with the crystalline semiconductor layer containing the element which promotes crystallization, and heat treatment (at temperatures of 550 to 750° C. for 3 minutes to 24 hours) is performed. The element which promotes crystallization contained in the crystalline semiconductor layer moves into the n-type semiconductor layer, and the element which promotes crystallization contained in the crystalline semiconductor layer is removed or reduced, whereby the semiconductor layer is formed. Alternatively, this n-type semiconductor layer becomes an n-type semiconductor layer containing a metal element which promotes crystallization, which is later formed into a desired shape to be an n-type semiconductor layer. In this manner, the n-type semiconductor layer functions as a gettering sink of the semiconductor layer, and also as a source region or a drain region.

The crystallization step and the gettering step of the semiconductor layer are performed by a plurality of heat treatment. In addition, the crystallization step and the gettering step can also be performed by one heat treatment. In this case, heat treatment may be performed after formation of an amorphous semiconductor layer, addition of an element which promotes crystallization, and formation of a semiconductor layer which functions as a gettering sink.

In this embodiment mode, the gate insulating layer is formed by stacking a plurality of layers, and a silicon nitride oxide film and a silicon oxynitride film are stacked on the gate electrode layer 493 side, as the gate insulating film 497 having a two-layer structure. The stacked insulating layers are preferably formed by successive formation of the layers at the same temperature in the same chamber while changing reaction gases with a vacuum state maintained. When the films are successively formed while maintaining the vacuum state, interface between the stacked films can be prevented from being contaminated.

The channel protective layer 496 may be formed by a droplet discharging method using polyimide, polyvinyl alcohol, or the like. As a result, a light exposure step can be omitted. The channel protective layer can be formed using one or a plurality of kinds of an inorganic material (such as silicon oxide, silicon nitride, silicon oxynitride, or silicon nitride oxide), a photosensitive or non-photosensitive organic material (such as an organic resin material, e.g. polyimide, acrylic, polyamide, polyimide amide, resist, or benzocyclobutene), a low-dielectric constant material, and the like, or a stacked layer structure thereof. In addition, a siloxane material may also be used. As a manufacturing method, a vapor deposition method such as a plasma CVD method or a thermal CVD method, or a sputtering method can be used. A droplet discharging method, a dispenser method, or a printing method (a method for forming a pattern, such as screen printing or offset printing) can also be used. An SOG film obtained by a coating method or the like can also be used.

Figure 17A:
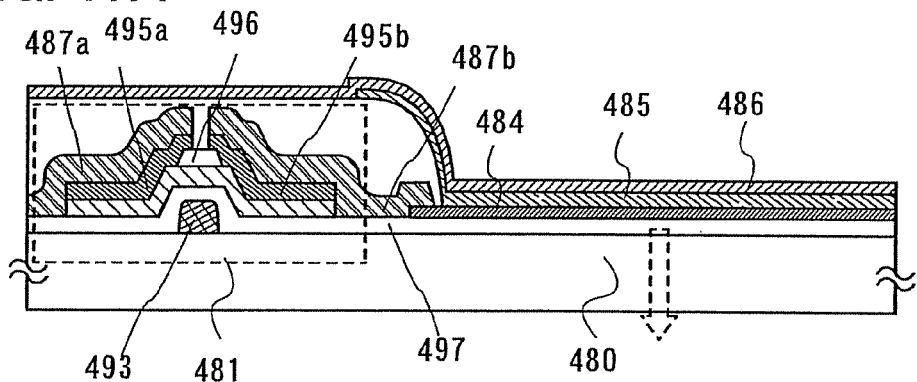
FIGS. 17A to 17C are explanatory views of a display device of the present invention.

First, a case where light is emitted from the substrate 480 side, that is, a case of bottom emission will be described with reference to FIG. 17A. In this case, a first electrode layer 484 is in contact with the source electrode layer or drain electrode layer 487b so as to be electrically connected to the thin film transistor 481. The first electrode layer 484, an electroluminescent layer 485, and a second electrode layer 486 are stacked sequentially. The substrate 480 through which light is transmitted is necessary to have at least a light-transmitting property of visible light.

Figure 17B:
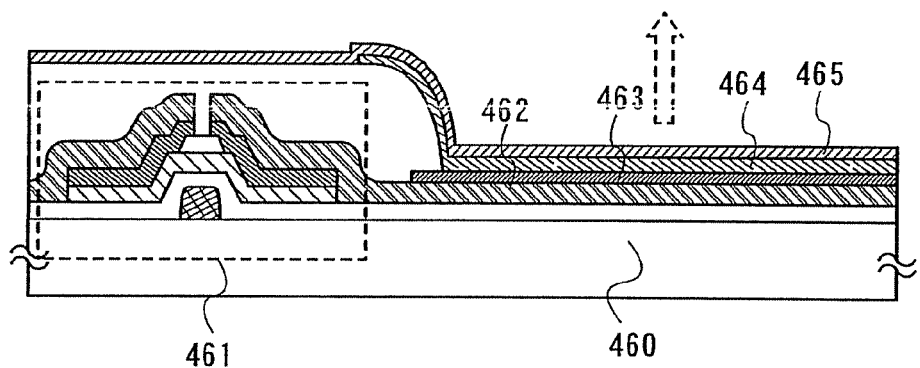

A case where light is emitted to the side opposite to a substrate 460, that is, a case of top-emission will be described with reference to FIG. 17B. The thin film transistor 461 can be formed similarly to the above thin film transistor. A source electrode layer or drain electrode layer 462 that is electrically connected to the thin film transistor 461 is in contact with a first electrode layer 463 to be electrically connected. The first electrode layer 463, an electroluminescent layer 464, and a second electrode layer 465 are sequentially stacked. The source electrode layer or drain electrode layer 462 is a metal layer having reflectivity, and reflects light which is emitted from the light-emitting element, upward as denoted by an arrow. The source electrode layer or drain electrode layer 462 and the first electrode layer 463 are stacked, and therefore, even when the first electrode layer 463 is formed of a material having a light-transmitting property and transmits light, the light is reflected on the source electrode or drain electrode layer 462 and then is emitted in the direction opposite to the substrate 460. Of course, the first electrode layer 463 may also be formed using a metal film having reflectivity. Since light from the light-emitting element is emitted through the second electrode layer 465, the second electrode layer 465 is formed using a material having at least a light-transmitting property of visible light.

Figure 17C:
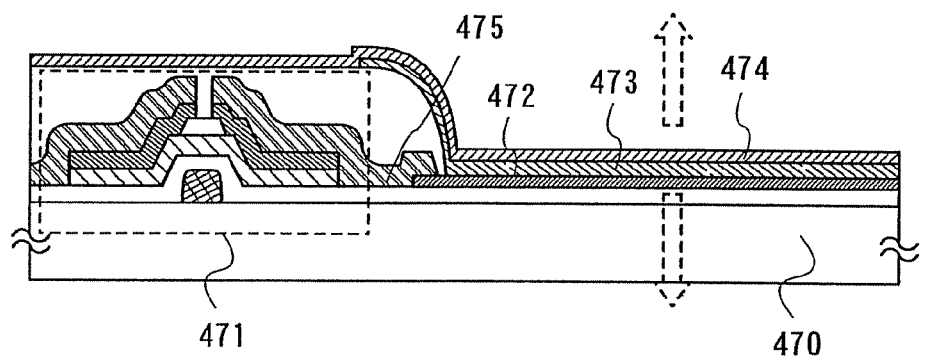

A case where light is emitted to the substrate 470 side and to the side opposite to the substrate 470 side, that is, a case of dual-emission will be described with reference to FIG. 17C. The thin film transistor 471 is also a channel protective thin film transistor. A source electrode or drain electrode layer 475 that is electrically connected to a semiconductor layer of the thin film transistor 471 is electrically connected to a first electrode layer 472. The first electrode layer 472, an electroluminescent layer 473, and a second electrode layer 474 are sequentially stacked. At this time, if the first electrode layer 472 and the second electrode layer 474 are both formed using a material having at least a light-transmitting property of visible light or are both formed to have thicknesses that can transmit light, dual-emission is realized. In this case, the insulating layer and the substrate 470 through which light is transmitted are also need to have at least a light-transmitting property of visible light.

This embodiment mode can be appropriately combined with Embodiment Modes 1 to 4.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 6

In this embodiment mode, an example of a highly reliable display device which is manufactured through a simplified process at low cost will be described. More specifically, a light-emitting display device using a light-emitting element as a display element will be described.

In this embodiment mode, a structure of a light-emitting element which can be applied as a display element of a display device of the present invention will be described with reference to FIGS. 22A to 22D.

FIGS. 22A to 22D each show an element structure of a light-emitting element, which is a light-emitting element where an electroluminescent layer 860 formed by mixing an organic compound and an inorganic compound is interposed between a first electrode layer 870 and a second electrode layer 850. As shown in the drawings, the electroluminescent layer 860 includes a first layer 804, a second layer 803, and a third layer 802, and there is a great feature especially in the first layer 804 and the third layer 802.

First, the first layer 804 is a layer which has a function of transporting holes to the second layer 803, and includes at least a first organic compound and a first inorganic compound showing an electron-accepting property to the first organic compound. It is important that the first organic compound and the first inorganic compound are not only simply mixed but also the first inorganic compound has an electron-accepting property with respect to the first organic compound. This structure generates many hole-carriers in the first organic compound which has originally almost no inherent carriers, and a hole-injecting and a hole-transporting property which are highly excellent can be obtained.

Therefore, as for the first layer 804, not only advantageous effect that is considered to be obtained by mixing an inorganic compound (such as improvement in heat resistance) but also excellent conductivity (in particular, a hole-injecting property and a hole-transporting property in the first layer 804) can also be obtained. This excellent conductivity is advantageous effect, which cannot be obtained in a conventional hole-transporting layer in which an organic compound and an inorganic compound that do not electronically interact with each other are simply mixed. This advantageous effect can make a drive voltage lower than conventionally. In addition, since the first layer 804 can be made thick without causing increase in a drive voltage, a short circuit of the element due to dusts or the like can be suppressed.

It is preferable to use a hole-transporting organic compound as the first organic compound because hole-carriers are generated in the first organic compound as described above. Examples of the hole-transporting organic compound include phthalocyanine (abbreviation: $H_2Pc$), copper phthalocyanine (abbreviation: CuPc), vanadyl phthalocyanine nine (abbreviation: VOPc), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4''-tris(N-carbazolyl)triphenylamine (abbreviation: TCTA), and the like. However, the present invention is not limited to these examples. In addition, among the compounds described above, aromatic amine compounds typified by TDATA, MTDATA, m-MTDAB, TPD, NPB, DNTPD, and TCTA can easily generate hole-carriers, and are suitable compound groups for the first organic compound.

On the other hand, the first inorganic compound may be any material as long as the material can easily accept electrons from the first organic compound, and various kinds of metal oxides and metal nitrides can be used. Any of transition metal oxides that belong to Groups 4 to 12 of the periodic table is preferable because an electron-accepting property is easily provided. Specifically, titanium oxide, zirconium oxide, vanadium oxide, molybdenum oxide, tungsten oxide, rhenium oxide, ruthenium oxide, zinc oxide, and the like can be given. In addition, among the metal oxides described above, any of transition metal oxides that belong to Groups 4 to 8 of the periodic table mostly has a high electron-accepting property, which is a preferable group. In particular, vanadium oxide, molybdenum oxide, tungsten oxide, and rhenium oxide are preferable because they can be formed by vacuum evaporation and can be easily used.

It is to be noted that the first layer 804 may be formed by stacking a plurality of layers each including a combination of the organic compound and the inorganic compound as described above, or may further include another organic compound or inorganic compound.

Next, the third layer 802 will be described. The third layer 802 is a layer which has a function of transporting electrons to the second layer 803, and includes at least a third organic compound and a third inorganic compound showing an electron-donating property to the third organic compound. It is important that the third organic compound and the third inorganic compound are not only simply mixed but also the third inorganic compound has an electron-denoting property with respect to the third organic compound. This structure generates many electron-carriers in the third organic compound which has originally almost no inherent carriers, and an electron-injecting and an electron-transporting property which are highly excellent can be obtained.

Therefore, as for the third layer 802, not only advantageous effect that is considered to be obtained by mixing an inorganic compound (such as improvement in heat resistance) but also excellent conductivity (in particular, an electron-injecting property and an electron-transporting property in the third layer 802) can also be obtained. This excellent conductivity is advantageous effect, which cannot be obtained in a conventional electron-transporting layer in which an organic compound and an inorganic compound that do not electronically interact with each other are simply mixed. This advantageous effect can make a drive voltage lower than conventionally. In addition, since the third layer 802 can be made thick without causing increase in a drive voltage, a short circuit of the element due to dusts or the like can be suppressed.

It is preferable to use an electron-transporting organic compound as the third organic compound because electron-carriers are generated in the third organic compound as described above. Examples of the electron-transporting organic compound include tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis [2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the present invention is not limited to these examples. In addition, among the compounds mentioned above, chelate metal complexes having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron-carriers, and are suitable compound groups for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be formed by vacuum evaporation and can be easily used.

It is to be noted that the third layer 802 may be formed by stacking a plurality of layers each including a combination of the organic compound and the inorganic compound as described above, or may further include another organic compound or inorganic compound.

Then, the second layer 803 will be described. The second layer 803 is a layer which has a function of emitting light, and includes a second organic compound that has a light-emitting property. A second inorganic compound may also be included. The second layer 803 can be formed using various light-emitting organic compounds and inorganic compounds. However, since it is believed to be hard to flow a current through the second layer 803 compared to the first layer 804 or the third layer 802, the thickness of the second layer 803 is preferably approximately 10 to 100 nm.

There are no particular limitations on the second organic compound as long as it is a light-emitting organic compound.

Examples of the second organic compound include, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. In addition, it is also possible to use a compound capable of emitting phosphorescence such as bis[2-(4',6'-difluorophenyl)pyridinato-N,$C^{2'}$]iridium(picolinate) (abbreviation: FIrpic), bis{2-[3',5'-bis(trifluoromethyl)phenyl]pyridinato-N,$C^{2'}$}iridium(picolinate) (abbreviation: Ir(CF$_3$ppy)$_2$(pic)), tris(2-phenylpyridinato-N,$C^{2'}$)iridium (abbreviation: Ir(ppy)$_3$), bis(2-phenylpyridinato-N,$C^{2'}$)iridium (acetylacetonate) (abbreviation: Ir(ppy)$_2$(acac)), bis[2-(2'-thienyl)pyridinato-N, $C^{3'}$]iridium(acetylacetonate) (abbreviation: Ir(thp)$_2$(acac)), bis(2-phenylquinolinato-N, $C^{2'}$)iridium(acetylacetonate) (abbreviation: Ir(pq)$_2$(acac)), or bis[2-(2'-benzothienyl)pyridinato-N,$C^{3'}$]iridium(acetylacetonate) (abbreviation: Ir(btp)$_2$(acac)).

Further, a triplet excitation light-emitting material containing a metal complex or the like may be used for the second layer 803 in addition to a singlet excitation light-emitting material. For example, among pixels emitting light of red, green, and blue, a pixel emitting light of red whose luminance is reduced by half in a relatively short time is formed by using a triplet excitation light-emitting material and the other pixels are formed by using a singlet excitation light-emitting material. A triplet excitation light-emitting material has a feature of favorable light-emitting efficiency and less power consumption to obtain the same luminance. In other words, when a triplet excitation light-emitting material is used for a red pixel, only a small amount of current needs to be applied to a light-emitting element; thus, reliability can be improved. A pixel emitting light of red and a pixel emitting light of green may be formed by using a triplet excitation light-emitting material and a pixel emitting light of blue may be formed by using a singlet excitation light-emitting material to achieve low power consumption as well. Low power consumption can be further achieved by formation of a light-emitting element emitting light of green that has high visibility for human eyes with the use of a triplet excitation light-emitting material.

The second layer 803 may include not only the second organic compound as described above, which produces light-emission, but also another organic compound which is added thereto. Examples of organic compounds that can be added include TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited to these examples. It is preferable that the organic compound, which is added in addition to the second organic compound, have larger excitation energy than that of the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure to perform color display by providing each pixel with a light-emitting layer having a different emission wavelength range. Typically, a light-emitting layer corresponding to each color of R (red), G (green), and B (blue) is formed. Also in this case, color purity can be improved and a pixel portion can be prevented from having a mirror surface (reflection) by providing the light-emission side of the pixel with a filter which transmits light of an emission wavelength range of the light. By provision of a filter, a circularly polarizing plate or the like that has been conventionally considered to be necessary can be omitted, and further, the loss of light emitted from the light-emitting layer can be eliminated. Further, change in a color tone, which occurs when a pixel portion (display screen) is obliquely seen, can be reduced.

Either a low-molecular organic light-emitting material or a high-molecular organic light-emitting material may be used for a material of the second layer 803. A high-molecular organic light-emitting material is physically stronger compared to a low-molecular material and is superior in durability of the element. In addition, a high-molecular organic light-emitting material can be formed by coating; therefore, the element can be relatively easily manufactured.

The emission color is determined depending on a material forming the light-emitting layer; therefore, a light-emitting element which exhibits desired light-emission can be formed by selecting an appropriate material for the light-emitting layer. As a high-molecular electroluminescent material which can be used for forming a light-emitting layer, a polyparaphenylene-vinylene-based material, a polyparaphenylene-based material, a polythiophene-based material, or a polyfluorene-based material, and the like can be used.

As the polyparaphenylene-vinylene-based material, a derivative of poly(paraphenylenevinylene) [PPV] such as poly(2,5-dialkoxy-1,4-phenylenevinylene) [RO-PPV], poly(2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be given. As the polyfluorene-based, material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light-emission of the second organic compound is not easily quenched by the inorganic compound, and various kinds of metal oxide and metal nitride can be used. In particular, a metal oxide having a metal that belongs to Group 13 or 14 of the periodic table is preferable because light-emission of the second organic compound is not easily quenched, and specifically, aluminum oxide, gallium oxide, silicon oxide, and germanium oxide are preferable. However, the second inorganic compound is not limited thereto.

It is to be noted that the second layer 803 may be formed by stacking a plurality of layers each including a combination of the organic compound and the inorganic compound as described above, or may further include another organic compound or inorganic compound. A layer structure of the light-emitting layer can be changed, and an electrode layer for injecting electrons may be provided or a light-emitting material may be dispersed, instead of providing no specific electron-injecting region or light-emitting region. Such a change can be permitted unless it departs from the spirit of the present invention.

A light-emitting element formed by using the above materials emits light by being forwardly biased. A pixel of a display device which is formed by using a light-emitting element can be driven by a simple matrix (passive matrix) mode or an active matrix mode. In any case, each pixel emits light by application of a forward bias voltage thereto at a specific timing; however, the pixel is in a non-emitting state for a certain period. Reliability of a light-emitting element can be improved by application of a reverse bias voltage in the non-emitting time. In a light-emitting element, there is a deterioration mode in which emission intensity is decreased under constant driving conditions or a deterioration mode in which a non-light-emitting region is enlarged in the pixel and luminance is apparently decreased. However, progression of deterioration can be slowed down by alternating current driving where a bias voltage is applied forwardly and reversely; thus, reliability of a light-emitting display device can be improved. In addition, either digital driving or analog driving can be applied.

A color filter (colored layer) may be formed over a sealing substrate. The color filter (colored layer) can be formed by an evaporation method or a droplet discharging method. High-resolution display can be performed with the use of the color filter (colored layer). This is because a broad peak can be modified to be sharp in an emission spectrum of each of R, G, and B by the color filter (colored layer).

Full color display can be performed by the steps of forming a material emitting light of a single color and combining with a color filter or a color conversion layer. Preferably, the color filter (colored layer) or the color conversion layer is formed over, for example, a sealing substrate and attached to an element substrate.

Of course, display of a single color emission may also be performed. For example, an area color type display device may be manufactured by using single color emission. The area color type is suitable for a passive matrix display portion, and can mainly display characters and symbols.

Figure 22A:
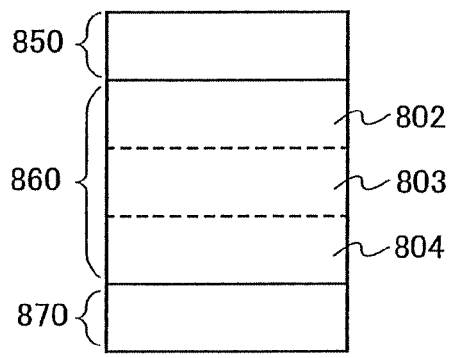
FIGS. 22A to 22D are explanatory views of a structure of a light-emitting element which can be applied to the present invention.
Figure 22B:
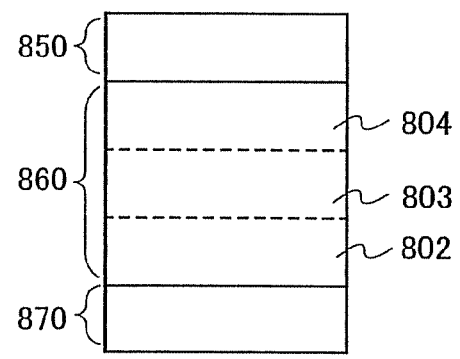

Materials for the first electrode layer 870 and the second electrode layer 850 are necessary to be selected considering the work function. The first electrode layer 870 and the second electrode layer 850 can be either an anode or a cathode depending on the pixel structure. In a case where the polarity of a driving thin film transistor is a p-channel type, the first electrode layer 870 preferably serves as an anode and the second electrode layer 850 preferably serves as a cathode as shown in FIG. 22A. In a case where the polarity of the driving thin film transistor is an n-channel type, the first electrode layer 870 preferably serves as a cathode and the second electrode layer 850 preferably serves as an anode as shown in FIG. 22B. Materials that can be used for the first electrode layer 870 and the second electrode layer 850 will be described. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is superior in a hole-injecting property and a hole-transporting property and the third layer 802 is superior in an electron-injecting property and an electron transporting property, both the first electrode layer 870 and the second electrode layer 850 are scarcely restricted by a work function, and various materials can be used.

The light-emitting elements shown in FIGS. 22A and 22B have a structure where light is extracted from the first electrode layer 870; thus, the second electrode layer 850 does not need to have a light-transmitting property. The second electrode layer 850 may be formed from a film mainly containing an element of Ti, Ni, W, Cr, Pt, Zn, Sn, In, Ta, Al, Cu, Au, Ag, Mg, Ca, Li and Mo, or an alloy material or a compound material containing the element as its main component such as TiN, $TiSi_xN_y$, $WSi_x$, $WN_x$, $WSi_xN_y$, or NbN; or a stacked film thereof with a total film thickness of 100 to 800 nm.

The second electrode layer 850 can be formed by an evaporation method, a sputtering method, a CVD method, a printing method, a dispenser method, a droplet discharging method, or the like.

In addition, when the second electrode layer 850 is formed using a light-transmitting conductive material similarly to the material used for the first electrode layer 870, light can also be extracted from the second electrode layer 850, and a dual emission structure can be obtained, in which light emitted from the light-emitting element is emitted from both the first electrode layer 870 and the second electrode layer 850.

It is to be noted that the light-emitting element of the present invention can have variations by changing types of the first electrode layer 870 and the second electrode layer 850.

FIG. 22B shows a case where the third layer 802, the second layer 803, and the first layer 804 are sequentially provided from the first electrode layer 870 side in the electroluminescent layer 860.

As described above, in the light-emitting element of the present invention, the layer interposed between the first electrode layer 870 and the second electrode layer 850 is formed using the electroluminescent layer 860 including a layer in which an organic compound and an inorganic compound are combined. The light-emitting element is an organic-inorganic composite light-emitting element provided with layers (that is, the first layer 804 and the third layer 802) that provide functions, a high carrier-injecting property and carrier-transporting property, by mixing an organic compound and an inorganic compound. Such functions as high carrier-injecting property and carrier-transporting property are not obtainable from only either one of the organic compound or the inorganic compound. In addition, the first layer 804 and the third layer 802 particularly need to be layers in which an organic compound and an inorganic compound are combined when provided on the first electrode layer 870 side, and may also contain only one of an organic compound and an inorganic compound when provided on the second electrode layer 850 side.

Further, various methods can be used as a method for forming the electroluminescent layer 860, which is a layer in which an organic compound and an inorganic compound are mixed. For example, the methods include a co-evaporation method for evaporating both an organic compound and an inorganic compound by resistance heating. Besides, for co-evaporation, an inorganic compound may be evaporated by an electron beam (EB) while evaporating an organic compound by resistance heating. Moreover, the methods also include a method for sputtering an inorganic compound while evaporating an organic compound by resistance heating to deposit the both at the same time. In addition, the electroluminescent layer may also be formed by a wet method.

In the same manner, for the first electrode layer 870 and the second electrode layer 850, evaporation by resistance heating, EB evaporation, sputtering, a wet method, or the like can be used.

Figure 22C:
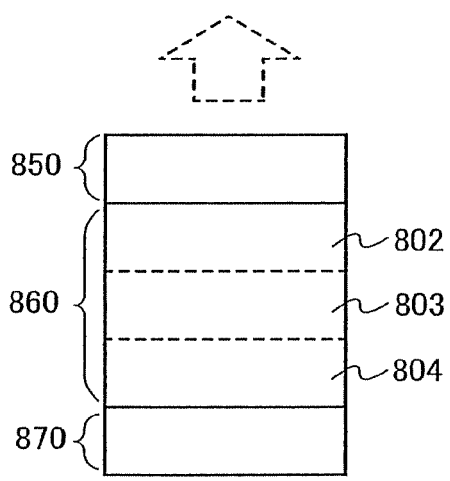
Figure 22D:
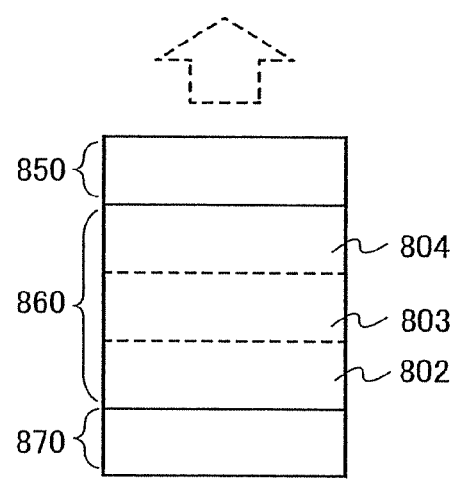

In FIG. 22C, an electrode layer having reflectivity is used for the first electrode layer 870, and an electrode layer having a light-transmitting property is used for the second electrode layer 850 in the structure of FIG. 22A. Light emitted from the light-emitting element is reflected on the first electrode layer 870, transmitted through the second electrode layer 850, and is emitted to an external portion. In the same manner, in FIG. 22D, an electrode layer having reflectivity is used for the first electrode layer 870, and an electrode layer having a light-transmitting property is used for the second electrode layer 850 in the structure of FIG. 22B. Light emitted from the light-emitting element is reflected on the first electrode layer 870, transmitted through the second electrode layer 850, and is emitted to an external portion.

This embodiment mode can be appropriately combined with other embodiment modes describing a display device having a light-emitting element. This embodiment mode may be appropriately combined with each of Embodiment Modes 1 to 5.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 7

In this embodiment mode, an example of a highly reliable display device which is manufactured through a simplified process at low cost will be described. More specifically, a light-emitting display device using a light-emitting element as a display element will be described. In this embodiment mode, a structure of a light-emitting element which can be applied as a display element of a display device of the present invention will be described with reference to FIGS. 23A to 23C and FIGS. 24A to 24C.

A light-emitting element utilizing electroluminescence is distinguished by whether a light-emitting material is an organic compound or an inorganic compound. In general, the former is called an organic EL element, and the latter is called an inorganic EL element.

The inorganic EL element is classified into a dispersion type inorganic EL element and a thin-film type inorganic EL element, depending on its element structure. The former and the latter are different in that the former has an electroluminescent layer where particles of a light-emitting material are dispersed in a binder whereas the latter has an electroluminescent layer formed of a thin film of a light-emitting material. However, the former and the latter have in common that electrons accelerated by a high electric field are necessary. It is to be noted that, as a mechanism of light-emission that is obtained, there are donor-acceptor recombination type light-emission, that utilizes a donor level and an acceptor level, and localized type light-emission that utilizes inner-shell electron transition of a metal ion. In general, in many cases, a dispersion type inorganic EL element has donor-acceptor recombination type light-emission, and a thin-film type inorganic EL element has localized type light-emission.

The light-emitting material that can be used in the present invention includes a base material and an impurity element to be a light-emission center. By changing an impurity element that is contained, light-emission of various colors can be obtained. As a method for forming the light-emitting material, various methods such as a solid phase method and a liquid phase method (a coprecipitation method) can be used. Further, an evaporative decomposition method, a double decomposition method, a method by heat decomposition reaction of a precursor, a reversed micelle method, a method in which such a method is combined with high-temperature baking, a liquid phase method such as a lyophilization method, or the like can also be used.

A solid phase method is a method in which a base material, and an impurity element or a compound containing an impurity element are weighed, mixed in a mortar, heated in an electric furnace, and baked to be reacted, whereby the impurity element is contained in the base material. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state. Although the baking needs to be performed at relatively high temperature, the solid phase method is easy; thus, the solid phase method has high productivity and is suitable for mass production.

A liquid phase method (coprecipitation method) is a method in which a base material or a compound containing a base material is reacted with an impurity element or a compound containing an impurity element in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. As sulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used. Further, zinc selenide (ZnSe), zinc telluride (ZnTe), or the like can also be used, and a ternary mixed crystal such as calcium-gallium sulfide ($CaGa_2S_4$), strontium-gallium sulfide ($SrGa_2S_4$), or barium-gallium sulfide ($BaGa_2S_4$) may also be used.

As a light-emission center of localized type light-emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added. A halogen element can be used as charge compensation.

On the other hand, as a light-emission center of donor-acceptor recombination type light-emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In a case where the light-emitting material of donor-acceptor recombination type light-emission is synthesized by a solid phase method, a base material, the first impurity element or a compound containing the first impurity element, and the second impurity element or a compound containing the second impurity element are each weighed, mixed in a mortar, heated in an electric furnace, and baked. As the base material, any of the above described base materials can be used. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. It is to be noted that although the baking may be performed in a powder state, it is preferable to perform the baking in a pellet state.

As the impurity element in the case of utilizing solid reaction, the compounds containing the first impurity element and the second impurity element may be combined. In this case, since the impurity element is easily diffused and solid reaction progresses easily, a uniform light-emitting material can be obtained. Further, since an unnecessary impurity element does not enter, a light-emitting material having high purity can be obtained. As the compounds containing the first impurity element and the second impurity element, for example, copper chloride (CuCl), silver chloride (AgCl), or the like can be used.

It is to be noted that the concentration of these impurity elements may be 0.01 to 10 atomic % with respect to the base material, and is preferably 0.05 to 5 atomic %.

In the case of a thin-film type inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 23A:
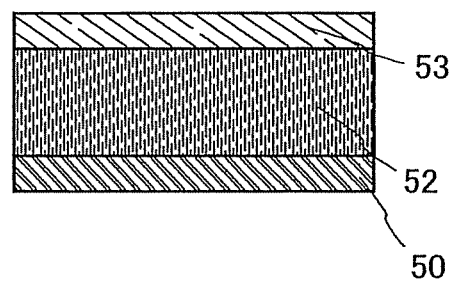
FIGS. 23A to 23C are explanatory views of a structure of a light-emitting element which can be applied to the present invention.
Figure 23B:
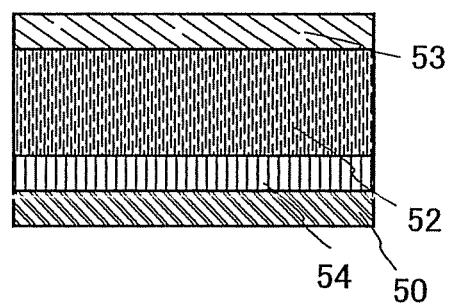
Figure 23C:
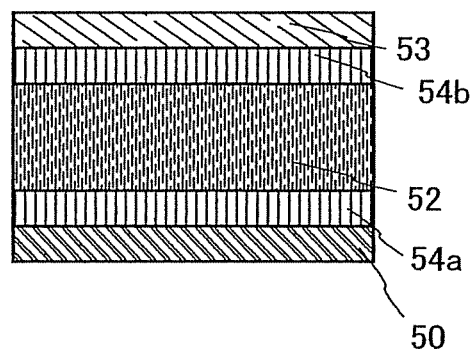

FIGS. 23A to 23C each show an example of a thin-film type inorganic EL element that can be used as a light-emitting element. In FIGS. 23A to 23C, each light-emitting element includes a first electrode layer 50, an electroluminescent layer 52, and a second electrode layer 53

The light-emitting elements shown in FIGS. 23B and 23C each have a structure where an insulating layer is provided between the electrode layer and the electroluminescent layer of the light-emitting element of FIG. 23A. The light-emitting element shown in FIG. 23B has an insulating layer 54 between the first electrode layer 50 and the electroluminescent layer 52. The light-emitting element shown in FIG. 23C includes an insulating layer 54a between the first electrode layer 50 and the electroluminescent layer 52, and an insulating layer 54b between the second electrode layer 53 and the electroluminescent layer 52. In this manner, the insulating layer may be provided between the electroluminescent layer and one of the electrode layers that sandwiches the electroluminescent layer, or the insulating layer may be provided between the electroluminescent layer and the first electrode layer and between the electroluminescent layer and the second electrode layer. Moreover, the insulating layer may be a single layer or a stacked layer including a plurality of layers.

In addition, although the insulating layer 54 is provided so as to be in contact with the first electrode layer 50 in FIG. 23B, the insulating layer 54 may be provided so as to be in contact with the second electrode layer 53 by reversing the order of the insulating layer and the electroluminescent layer.

In the case of a dispersion type inorganic EL element, an electroluminescent layer film where particles of a light-emitting material are dispersed in a binder is formed. When particles with desired grain sizes cannot be obtained by a manufacturing method of a light-emitting material, a light-emitting material may be processed into a particle state by being crushed in a mortar or the like. The binder refers to a substance for fixing particles of a light-emitting material in a dispersed state to keep a shape of an electroluminescent layer. The light-emitting material is uniformly dispersed and fixed in the electroluminescent layer by the binder.

In the case of a dispersion type inorganic EL element, as a formation method of an electroluminescent layer, a droplet discharging method which can selectively form an electroluminescent layer, a printing method (such as screen printing or offset printing), a coating method such as a spin coating method, a dipping method, a dispenser method, or the like can be used. There are no particular limitations on the thickness of the light-emitting layer; however, a thickness of 10 to 1000 nm is preferable. In addition, in the electroluminescent layer containing a light-emitting material and a binder, a ratio of the light-emitting material is preferably set to be greater than or equal to 50 wt % and less than or equal to 80 wt %.

Figure 24A:
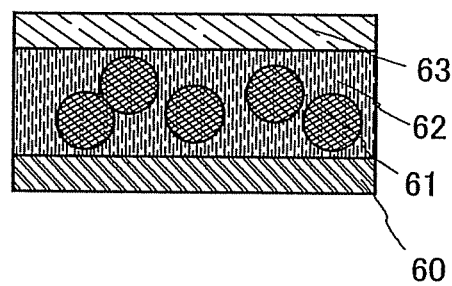
FIGS. 24A to 24C are explanatory views of a structure of a light-emitting element which can be applied to the present invention.
Figure 24B:
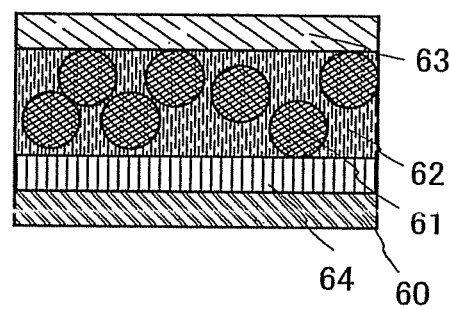
Figure 24C:
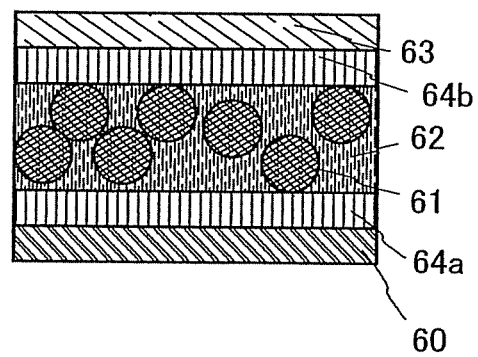

FIGS. 24A to 24C each show an example of a dispersion type inorganic EL element that can be used as a light-emitting element. In FIG. 24A, the light-emitting element has a stacked layer structure of a first electrode layer 60, an electroluminescent layer 62, and a second electrode layer 63, where a light-emitting material 61 held by a binder is contained in the electroluminescent layer 62.

As the binder that can be used in this embodiment mode, an organic material or an inorganic material can be used, or a mixed material of an organic material and an inorganic material may also be used. As the organic material, a resin such as a polymer having a relatively high dielectric constant like a cyanoethyl cellulose-based resin, polyethylene, polypropylene, a polystyrene-based resin, a silicone resin, an epoxy resin, or vinylidene fluoride can be used. In addition, a heat-resistant high molecular material such as aromatic polyamide or polybenzimidazole, or a siloxane resin may be used. A siloxane resin corresponds to a resin containing a Si—O—Si bond. Siloxane is composed of a skeleton structure formed by the bond of silicon (Si) and oxygen (O). As a substituent thereof, an organic group containing at least hydrogen (such as an alkyl group or aryl group) is used. In addition, a fluoro group may be used as the substituent. Further, a fluoro group and an organic group containing at least hydrogen may be used as the substituent. Moreover, a resin material such as a vinyl resin, e.g. polyvinyl alcohol or polyvinyl butyral, a phenol resin, a novolac resin, an acrylic resin, a melamine resin, a urethane resin, or an oxazole resin (polybenzoxazole) may also be used. A dielectric constant can also be controlled by mixing these resins with high-dielectric constant microparticles of barium titanate ($BaTiO_3$), strontium titanate ($SrTiO_3$), or the like as appropriate.

As the inorganic material contained in the binder, a material such as silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other substances containing an inorganic material can be used. By mixing the organic material with a high-dielectric constant inorganic material (by addition or the like), a dielectric constant of an electroluminescent layer containing a light-emitting material and a binder can be better controlled and further increased. When a mixed layer of an inorganic material and an organic material is used for the binder to have a high dielectric constant, larger electric charge can be induced by the light-emitting material.

In a manufacturing process, the light-emitting material is dispersed in a solution containing a binder. As a solvent of the solution containing a binder that can be used in this embodiment mode, it is preferable to select such a solvent that allows a binder material to dissolve and can make a solution with the viscosity which is appropriate for a method for forming the electroluminescent layer (various wet processes) and a desired film thickness. An organic solvent or the like can be used, and for example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used.

The light-emitting elements shown in FIGS. 24B and 24C each have a structure in which an insulating layer is provided between the electrode layer and the electroluminescent layer of the light-emitting element of FIG. 24A. The light-emitting element shown in FIG. 24B has an insulating layer 64 between a first electrode layer 60 and an electroluminescent layer 62. The light-emitting element shown in FIG. 24C has an insulating layer 64a between the first electrode layer 60 and the electroluminescent layer 62, and an insulating layer 64b between the second electrode layer 63 and the electroluminescent layer 62. In this manner, the insulating layer may be provided between the electroluminescent layer and one of the electrode layers that sandwiches the electroluminescent layer, or the insulating layer may be provided between the electroluminescent layer and the first electrode layer and between the electroluminescent layer and the second electrode layer. Moreover, the insulating layer may be a single layer or a stacked layer including a plurality of layers.

In addition, although the insulating layer 64 is provided so as to be in contact with the first electrode layer 60 in FIG. 24B, the insulating layer 64 may be provided so as to be in contact with the second electrode layer 63 by reversing the order of the insulating layer and the electroluminescent layer.

Although the insulating layers 54 and 64 in FIGS. 23B, 23C, 24B and 24C are not particularly limited, such insulating layers preferably have high dielectric strength and dense film qualities, and more preferably have a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked layer film of two or more kinds thereof can be used. These insulating films can be formed by sputtering, evaporation, CVD, or the like. In addition, the insulating layers may be formed by dispersing particles of these insulating materials in the binder. The binder material may be formed with the same material and by the same method as the binder contained in the electroluminescent layer. A thickness of such an insulating layer is not particularly limited, and a film thickness of 10 to 1000 nm is preferable.

The light-emitting element shown in this embodiment mode can emit light when a voltage is applied between the pair of electrodes which sandwiches the electroluminescent layer, and can be operated by direct current driving or alternating current driving.

In accordance with the present invention, a component such as a wiring included in a display device or the like can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

This embodiment mode can be appropriately combined with Embodiment Modes 1 to 5.

Embodiment Mode 8

In this embodiment mode, an example of a highly reliable display device which is manufactured through a simplified process at low cost will be described. More specifically, a liquid crystal display device using a liquid crystal display element as a display element will be described.

Figure 19A:
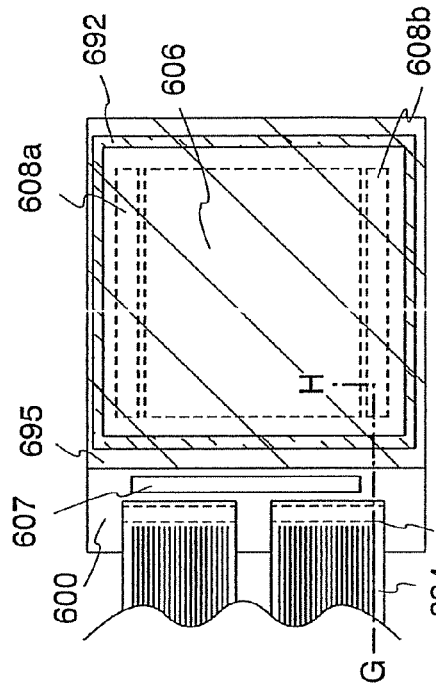
FIGS. 19A and 19B are explanatory views of a method for manufacturing a display device of the present invention.
Figure 19B:
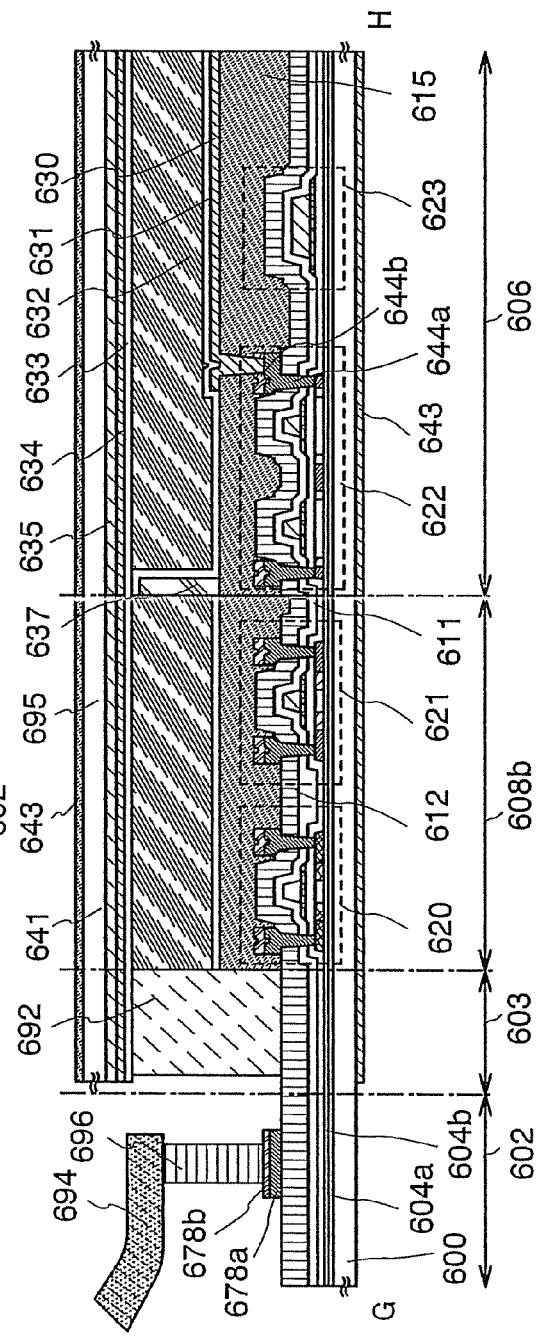

FIG. 19A is a top view of a liquid crystal display device, and FIG. 19B is a cross-sectional view taken along a line G-H of FIG. 19A.

As shown in FIG. 19A, a pixel region 606, a driving circuit region 608a which is a scanning line driving circuit, and a driving circuit region 608b which is a scanning line driving circuit are sealed between a substrate 600 and a counter substrate 695 with a sealing material 692. A driving circuit region 607 which is a signal line driver circuit formed with an IC driver is provided over the substrate 600. A transistor 622 and a capacitor 623 are provided in the pixel region 606. A driver circuit having transistors 620 and 621 is provided in the driving circuit region 608b. An insulating substrate can be used as the substrate 600 as in the above embodiment modes. Although there is a concern that a substrate formed of a synthetic resin generally has a lower temperature limit compared to another substrate, the substrate formed of a synthetic resin can be used when a manufacturing process is carried out using a substrate with high heat resistance and then the substrate formed of a synthetic resin displaces the substrate with high heat resistance.

In the pixel region 606, the transistor 622 which is to be a switching element is provided over the substrate 600, with base films 604a and 604b interposed therebetween. In this embodiment mode, a multi-gate thin film transistor (TFT) is used as the transistor 622, which includes a semiconductor layer having impurity regions serving as a source region and a drain region, a gate insulating layer, a gate electrode layer having a stacked layer structure including two layers, a source electrode layer, and a drain electrode layer. The source electrode or drain electrode layer is in contact with and electrically connected to an impurity region of the semiconductor layer and a pixel electrode layer 630.

The source electrode or drain electrode layers have a stacked layer structure, and the source electrode or drain electrode layers 644a and 644b are electrically connected to the pixel electrode layer 630 in an opening formed in an insulating layer 615. The opening formed in the insulating layer 615 can be formed by irradiation with a laser beam as shown in Embodiment Mode 2. In this embodiment mode, the source electrode or drain electrode layer 644b is formed using a low-melting point metal that is relatively easily evaporated (chromium in this embodiment mode), and the source electrode or drain electrode layer 644a is formed using refractory metal that is not easily evaporated compared to the source electrode or drain electrode layer 644b (tungsten in this embodiment mode). The source electrode or drain electrode layers 644a and 644b are selectively irradiated with a laser beam from the insulating layer 615 side, whereby an irradiated region of the source electrode or drain electrode layer 644b is evaporated by irradiation energy. The insulating layer 615 over the irradiated region of the source electrode or drain electrode layer 644b is removed, and the opening can be formed. The pixel electrode layer 630 is formed in the opening where the source electrode or drain electrode layers 644a or 644b are exposed, and the source electrode or drain electrode layers 644a and 644b and the pixel electrode layer 630 can be electrically connected to each other.

The thin film transistor can be manufactured by various methods. For example, a crystalline semiconductor film is used as an active layer, a gate electrode is formed over the crystalline semiconductor film with a gate insulating film interposed therebetween, and an impurity element is added to the active layer with use of the gate electrode. In such a manner, when the gate electrode is used for adding the impurity element, a mask for adding the impurity element does not need to be formed. The gate electrode can have a single layer or stacked layer structure. The impurity region can be a high-concentration impurity region or a low-concentration impurity region with its concentration being controlled. A structure of a thin film transistor having a low-concentration impurity region is called an LDD (Light Doped Drain) structure. Alternatively, the low-concentration impurity region may be overlapped with the gate electrode and a structure of such a thin film transistor is called a GOLD (Gate Overlapped LDD) structure. The polarity of the thin film transistor becomes n-type when phosphorus (P) or the like is added to the impurity region. The polarity of the thin film transistor becomes p-type when boron (B) or the like is added. After that, insulating films 611 and 612 covering the gate electrode and the like are formed. A dangling bond of the crystalline semiconductor film can be terminated by a hydrogen element mixed into the insulating film 611 (and the insulating 612).

In order to further improve planarity, the insulating layer 615 may be formed as an interlayer insulating layer. For the insulating layer 615, an organic material, an inorganic material, or a stacked layer structure thereof can be used. For example, a material such as silicon oxide, silicon nitride, silicon oxynitride, silicon nitride oxide, aluminum nitride, aluminum oxynitride, aluminum nitride oxide containing more nitrogen than oxygen, aluminum oxide, diamond-like carbon (DLC), polysilazane, nitrogen-containing carbon (CN), PSG (phosphosilicate glass), BPSG (borophosphosilicate glass), alumina, or a substance containing other inorganic insulating materials can be used. Alternatively, an organic insulating material may be used. As the organic material, either a photosensitive or nonphotosensitive material can be used, and polyimide, acrylic, polyamide, polyimide amide, resist, benzocyclobutene, a siloxane resin, or the like can be used. It is to be noted that a siloxane resin is a resin containing a Si—O—Si bond. The skeletal structure of siloxane is formed of a bond of silicon (Si) and oxygen (O). As a substituent, an organic group including at least hydrogen (such as an alkyl group or an aryl group) is used. As the substituent, a fluoro group may also be used. Alternatively, a fluoro group and an organic group containing at least hydrogen may be used as the substituent.

The pixel region and the driver circuit region can be formed over one substrate when the crystalline semiconductor film is used. In this case, a transistor in the pixel portion and a transistor in the driver circuit region 608b are formed at the same time. The transistor used in the driver circuit region 608b forms a CMOS circuit. A thin film transistor included in the CMOS circuit has a GOLD structure, but it may have an LDD structure like the transistor 622.

A structure of the thin film transistor in the pixel region is not limited to those referred to in this embodiment mode and the thin film transistor in the pixel region may have a single gate structure in which one channel formation region is formed, a double gate structure in which two channel formation regions are formed, or a triple gate structure in which three channel formation regions are formed. A thin film transistor in a peripheral driver circuit region may also have a single gate structure, a double gate structure, or a triple gate structure.

It is to be noted that a manufacturing method of a thin film transistor is not limited to those shown in this embodiment mode. The thin film transistor may have a top gate structure (such as a staggered type), a bottom gate structure (such as a reverse staggered type), a dual gate structure in which two gate electrode layers are arranged above or below a channel formation region, each with a gate insulating film interposed therebetween, or another structure.

Then, an insulating layer 631 called an alignment film is formed by a printing method or a droplet discharging method to cover the pixel electrode layer 630. It is to be noted that the insulating layer 631 can be selectively formed by a screen printing method or an off-set printing method. Thereafter, rubbing treatment is performed. This rubbing treatment does not need to be performed when a liquid crystal mode is, for example, a VA mode. An insulating layer 633 serving as an alignment film is similar to the insulating layer 631. Then, the sealing material 692 is formed in a peripheral region of the pixels by a droplet discharging method.

After that, the counter substrate 695 provided with the insulating layer 633 serving as the alignment film, a conductive layer 634 serving as a counter electrode, a colored layer 635 serving as a color filter, a polarizer 641 (also referred to as a polarizing plate), and a polarizer 642 is attached to the substrate 600 which is a TFT substrate, with a spacer 637 interposed therebetween. A liquid crystal layer 632 is provided in a space therebetween. Then, a polarizer (polarizing plate) 643 is also provided on a side of the substrate 600, which is opposite to a side where an element is formed since the liquid crystal display device of this embodiment mode is a transmissive type. The polarizer can be provided on the substrate with the use of an adhesive layer. A filler may be mixed into the sealing material, and a shielding film (black matrix) or the like may be formed on the counter substrate 695. It is to be noted that a color filter or the like may be formed of materials which exhibit red (R), green (G), and blue (B) when the liquid crystal display device is a full-color display; and the colored layer may be omitted or may be formed of a material which exhibits at least one color, when the liquid crystal display device is a single-color display.

It is to be noted that when RGB light-emitting diodes (LEDs) or the like are located in a backlight and a field sequential method which conducts color display by time division is employed, there is a case where a color filter is not provided. The black matrix may be provided so as to overlap with the transistor and the CMOS circuit since the black matrix reduces the reflection of external light by the wiring in the transistor and the CMOS circuit. Alternatively, the black matrix may be provided to overlap with the capacitor. It is because the black matrix can prevent reflection due to a metal film included in the capacitor.

As a method for forming the liquid crystal layer, a dispenser method (dripping method) or an injection method in which the substrate 600 provided with an element and the counter substrate 695 are attached and a liquid crystal is injected with the use of capillary phenomenon can be used. A dripping method may be employed when a large substrate to which an injection method is difficult to be applied is used.

A spacer may be provided by a method in which particles each having a size of several μm are sprayed. In this embodiment mode, a method in which a resin film is formed over the entire surface of the substrate and then etched is employed. A material for the spacer is applied by a spinner and then, light exposure and developing treatment are carried out so as to form a predetermined pattern. Further, the material is heated at 150 to 200° C. in a clean oven or the like to be hardened. The spacer manufactured in such a manner can have various shapes depending on the conditions of light exposure and the developing treatment. It is preferable that the spacer have a columnar shape with a flat top so that mechanical strength of the liquid crystal display device can be secured when the counter substrate is attached. The shape of the spacer is not particularly limited and may be conic, pyramidal, or the like.

Then, in an external terminal connection region 602 which is adjacent to a wiring region 603, an FPC 694, which is a wiring board for connection is provided over terminal electrode layers 678a and 678b electrically connected to the pixel region, with an anisotropic conductive layer 696 interposed therebetween. The FPC 694 transmits a signal and potential from an external portion. Through the foregoing steps, a liquid crystal display device having a display function can be manufactured.

For the wiring, the gate electrode layer, the pixel electrode layer 630, and the conductive layer 634 serving as the counter electrode layer in the transistor can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide, or the like. Alternatively, a material such as a metal, e.g. tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such metals; or metal nitride thereof can be used.

A retardation plate may be provided between the polarizing plate and the liquid crystal layer.

In this embodiment mode, a TN liquid crystal panel is shown; however, the above process can be similarly applied to liquid crystal panels of other modes. For example, this embodiment mode can be applied to a liquid crystal panel of a horizontal electric field mode in which liquid crystals are aligned parallel to the glass substrate by application of an electric filed. Further, this embodiment mode can also be applied to a VA (Vertical Alignment) mode liquid crystal panel.

Figure 36:
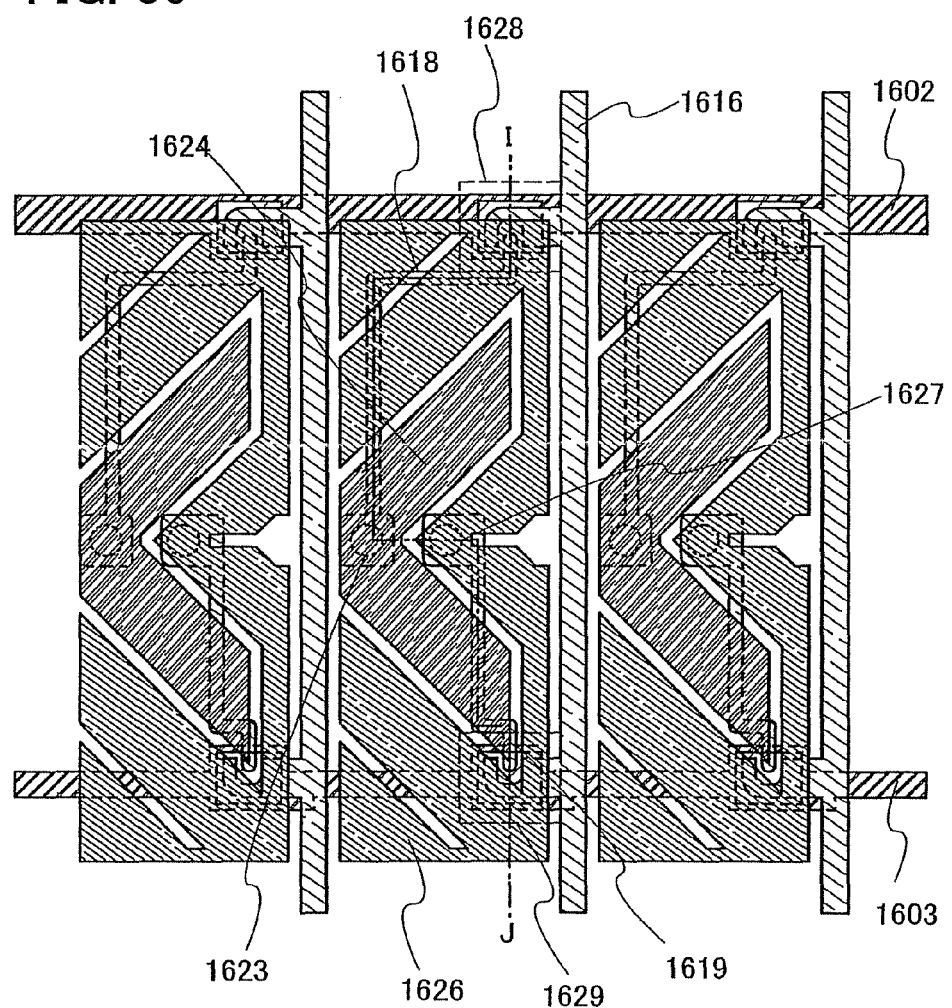
FIG. 36 is an explanatory view of a method for manufacturing a display device of the present invention.
Figure 37:
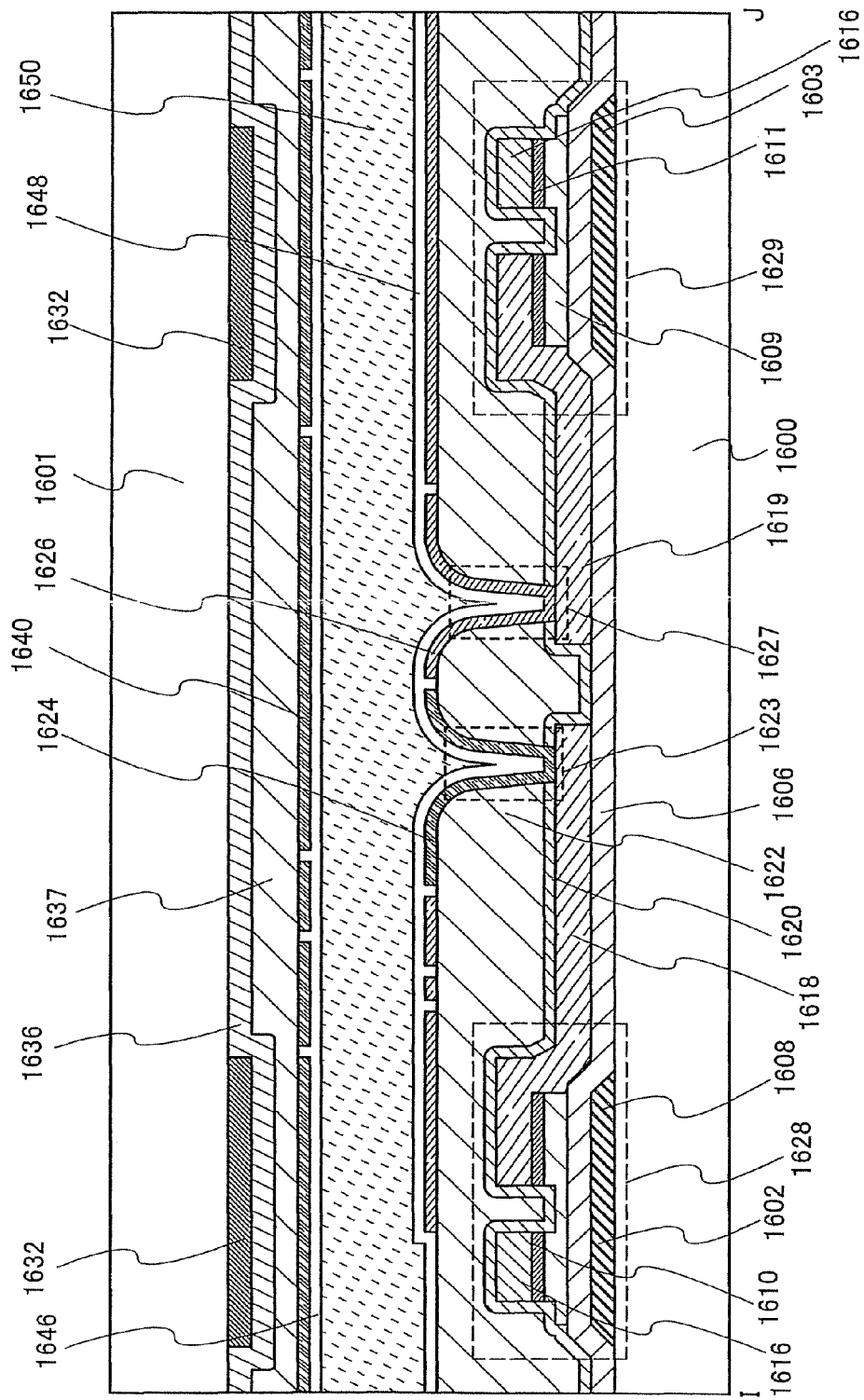
FIG. 37 is an explanatory view of a method for manufacturing a display device of the present invention.

FIGS. 36 and 37 each show a pixel structure of a VA mode liquid crystal panel. FIG. 36 is a top view, and a cross-sectional structure taken along a line I-J is shown in FIG. 37. In the following description, both of these drawings are used.

In this pixel structure, a plurality of pixel electrodes are provided in one pixel, and each pixel electrode is connected to a TFT. Each TFT is constituted so as to be driven by a different gate signal. In other words, a multi-domain pixel has a structure in which a signal applied to each pixel electrode is independently controlled.

A pixel electrode layer 1624 is connected to a TFT 1628 with a wiring layer 1618 through an opening (contact hole) 1623. In addition, a pixel electrode layer 1626 is connected to a TFT 1629 with a wiring layer 1619 through an opening (contact hole) 1627. A gate wiring layer 1602 of the TFT 1628 and a gate electrode layer 1603 of the TFT 1629 are separated so as to be able to receive different gate signals. On the other hand, a wiring layer 1616 functioning as a data line is used by both the TFTs 1628 and 1629.

The pixel electrode layers 1624 and 1626 are formed as in Embodiment Mode 1 by a droplet discharging step including two steps in manufacturing a mask layer. Specifically, a conductive film is formed, a first composition containing a mask-layer-forming material is discharged along a contour of a pattern of the pixel electrode layer by a first droplet discharging step, and thus, a first mask layer having a frame shape is formed. A second composition containing a mask-layer-forming material is discharged so as to fill inside the frame formed of the first mask layer by a second droplet discharging step, and a second mask layer is formed. The conductive film is processed using the first and second mask layers, whereby the pixel electrode layers 1624 and 1626 can be formed. As described above, since the process can be simplified and loss of materials can be prevented by the present invention, a display device can be manufactured at low cost with high productivity.

Figure 38:
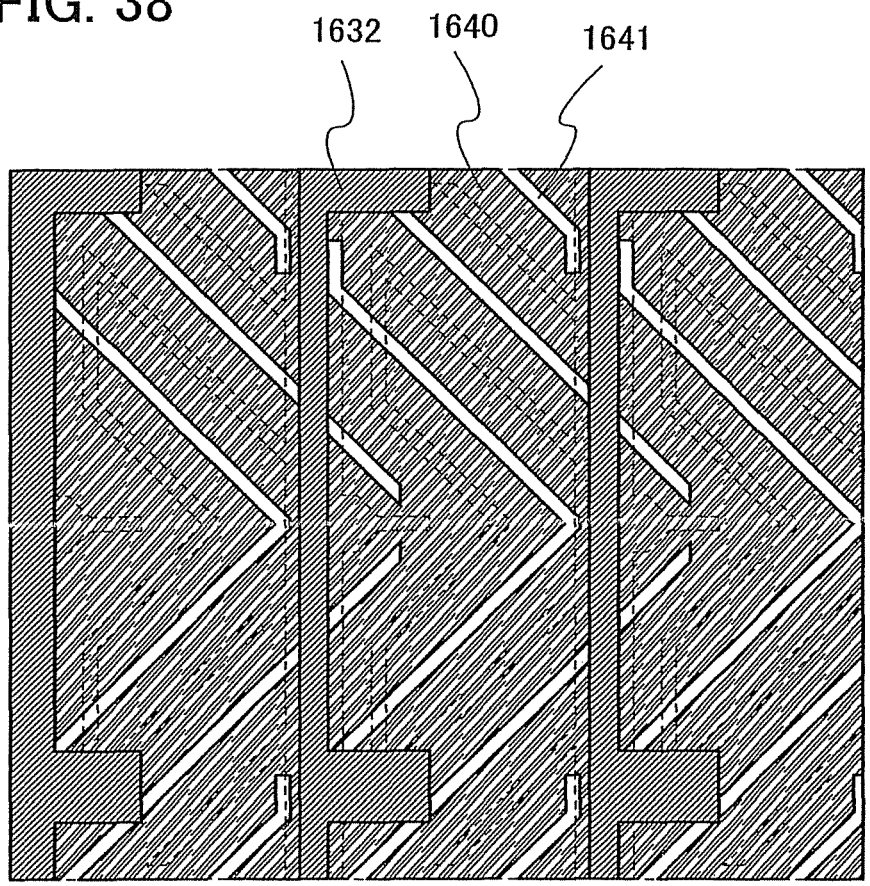
FIG. 38 is an explanatory view of a method for manufacturing a display device of the present invention.

The shapes of the pixel electrode layers 1624 and 1626 are different, and the pixel electrode layers 1624 and 1626 are separated by a slit 1625. The pixel electrode layer 1626 is formed so as to surround the pixel electrode layer 1624 that is extended into a V-shape. Timings of application of voltage to the pixel electrode layers 1624 and 1626 are made different in the TFTs 1628 and 1629, whereby alignment of liquid crystals are controlled. The TFT 1628 includes the gate wiring layer 1602, a gate insulating layer 1606, a semiconductor layer 1608, a semiconductor layer 1610 having one conductivity type, a wiring layer 1617 and a wiring layer 1618 over the substrate 1600. The TFT 1629 includes the gate wiring layer 1603, the gate insulating layer 1606, a semiconductor layer 1609, a semiconductor layer 1611 having one conductivity type, a wiring layer 1616 and a wiring layer 1619 over the substrate 1600. An insulating layer 1620 and an insulating layer 1622 are formed over the wiring layers 1616, 1617, 1618 and 1619. A light-shielding film 1632, a colored layer 1636, and a counter electrode layer 1640 are formed on a counter substrate 1601. A planarizing film 1637 is formed between the colored layer 1636 and the counter electrode layer 1640 so that disordered alignment of liquid crystals of a liquid crystal layer 1650 is prevented. FIG. 38 shows a structure on the counter substrate side. The counter electrode layer 1640 is used by different pixels in common, and a slit 1641 is formed. The slit 1641 and the slit 1625 on the side of the pixel electrode layers 1624 and 1626 are arranged so as to be alternately engaged with each other, and thus, an oblique electric field can be effectively generated and alignment of liquid crystals can be controlled. Accordingly, an alignment direction of the liquid crystals is made varied depending on the place; therefore, the viewing angle can be widened. An alignment film 1648 is formed on the pixel electrode layer 1626 and an alignment film 1646 is formed on the counter electrode layer 1640.

As described above, a liquid crystal panel can be manufactured by using a composite material, in which an organic compound and an inorganic compound are mixed, as a pixel electrode layer. With the use of such a pixel electrode layer, it is not necessary to use a transparent conductive film containing indium as its main component, and bottleneck of materials can be overcome.

This embodiment mode can be appropriately combined with Embodiment Mode 1 or 2.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 9

In this embodiment mode, an example of a highly reliable display device which is manufactured through a simplified process at low cost will be described. More specifically, a liquid crystal display device using a liquid crystal display element as a display element will be described.

Figure 18:
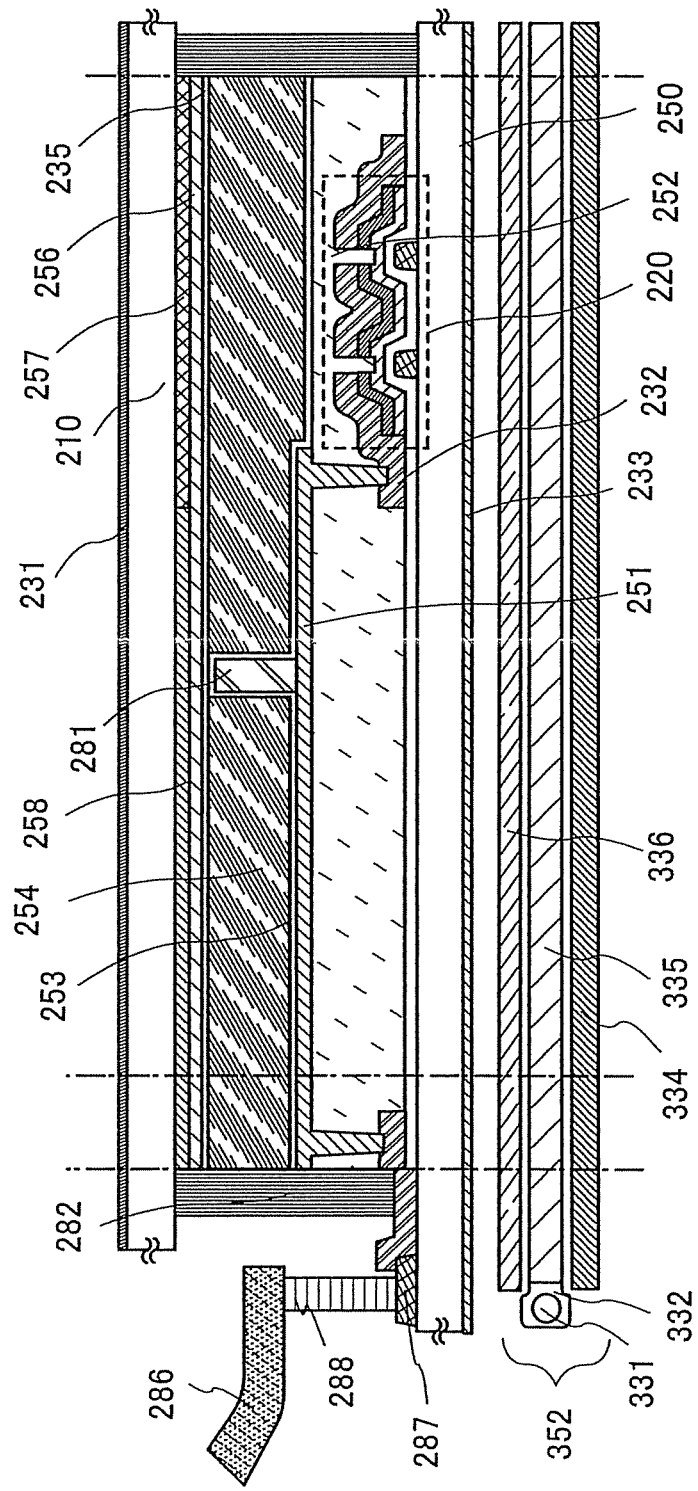
FIG. 18 is an explanatory view of a display device of the present invention.

In the display device shown in FIG. 18, over a substrate 250, in a pixel region, a transistor 220 which is a reverse staggered thin film transistor, a pixel electrode layer 251, an insulating layer 252, an insulating layer 253, a liquid crystal layer 254, a spacer 281, an insulating layer 235, a counter electrode layer 256, a color filter 258, a black matrix 257, a counter substrate 210, a polarizing plate (polarizer) 231, and a polarizing plate (polarizer) 233 are provided; and in a sealing region, a sealing material 282, a terminal electrode layer 287, an anisotropic conductive layer 288, and an FPC 286 are provided.

A gate electrode layer, a source electrode layer, a drain electrode layer, and the pixel electrode layer 251 of the transistor 220 which is a reverse staggered thin film transistor formed in this embodiment mode are formed using a mask layer that is formed by a droplet discharging method as shown in Embodiment Mode 1. Specifically, a conductive film is formed, a first composition containing a mask-layer-forming material is discharged along a contour of a pattern of the pixel electrode layer by a first droplet discharging step, and thus, a first mask layer having a frame shape is formed. A second composition containing a mask-layer-forming material is discharged so as to fill inside the frame formed of the first mask layer by a second droplet discharging step, and a second mask layer is formed. The conductive film is processed using the first and second mask layers, whereby the gate electrode layer, the source electrode layer, and the drain electrode layer can be formed. By using the present invention as described above, the process can be simplified, and loss of materials can be prevented; therefore, a display device can be manufactured at low cost with high productivity.

In this embodiment mode, an amorphous semiconductor is used as a semiconductor layer, and a semiconductor layer having one conductivity type may be formed as needed. In this embodiment mode, a semiconductor layer and an amorphous n-type semiconductor layer as a semiconductor layer having one conductivity type are stacked. Further, an NMOS structure of an n-channel thin film transistor in which an n-type semiconductor layer is formed, a PMOS structure of a p-channel thin film transistor in which a p-type semiconductor layer is formed, or a CMOS structure of an n-channel thin film transistor and a p-channel thin film transistor can be manufactured.

Moreover, in order to impart conductivity, an element imparting conductivity is added by doping and an impurity region is formed in the semiconductor layer; therefore, an n-channel thin film transistor and a p-channel thin film transistor can be formed. Instead of formation of an n-type semiconductor layer, conductivity may be imparted to the semiconductor layer by plasma treatment with a $PH_3$ gas.

In this embodiment mode, the transistor 220 is an n-channel reverse staggered thin film transistor. In addition, a channel protective type reverse staggered thin film transistor in which a protective layer is provided over the channel region of the semiconductor layer can also be used.

Next, a structure of a backlight unit 352 will be described. The backlight unit 352 includes a cold cathode tube, a hot cathode tube, a light-emitting diode, an inorganic EL element, or an organic EL element as a light source 331 which emits light, a lamp reflector 332 to effectively lead light to a light guide plate 335, the light guide plate 335 by which light is totally reflected and led to the entire surface, a diffusing plate 336 for reducing variations in brightness, and a reflective plate 334 for reusing light leaked under the light guide plate 335.

A control circuit for adjusting the luminance of the light source 331 is connected to the backlight unit 352. The luminance of the light source 331 can be controlled by a signal supplied from the control circuit.

A source electrode or drain electrode layer 232 of the transistor 220 is electrically connected to the pixel electrode layer 251 in the opening formed in the insulating layer 252. The opening formed in the insulating layer 252 can be formed by irradiation with a laser beam as shown in Embodiment Mode 2. In this embodiment mode, the source electrode or drain electrode layer is formed using a low-melting point metal that is relatively easily evaporated (chromium in this embodiment mode). The source electrode or drain electrode layer is selectively irradiated with a laser beam from the insulating layer 252 side, whereby part of an irradiated region of the source electrode or drain electrode layer is evaporated by irradiation energy. The insulating layer 252 over the irradiated region of the source electrode or drain electrode layer is removed, and the opening can be formed. The pixel electrode layer 251 is formed in the opening where the source electrode or drain electrode layer is exposed, and the source electrode or drain electrode layer and the pixel electrode layer 251 can be electrically connected to each other.

This embodiment mode can be appropriately combined with Embodiment Mode 1 or 2.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 10

In this embodiment mode, an example of a highly reliable display device which is manufactured through a simplified process at low cost will be described.

Figure 21:
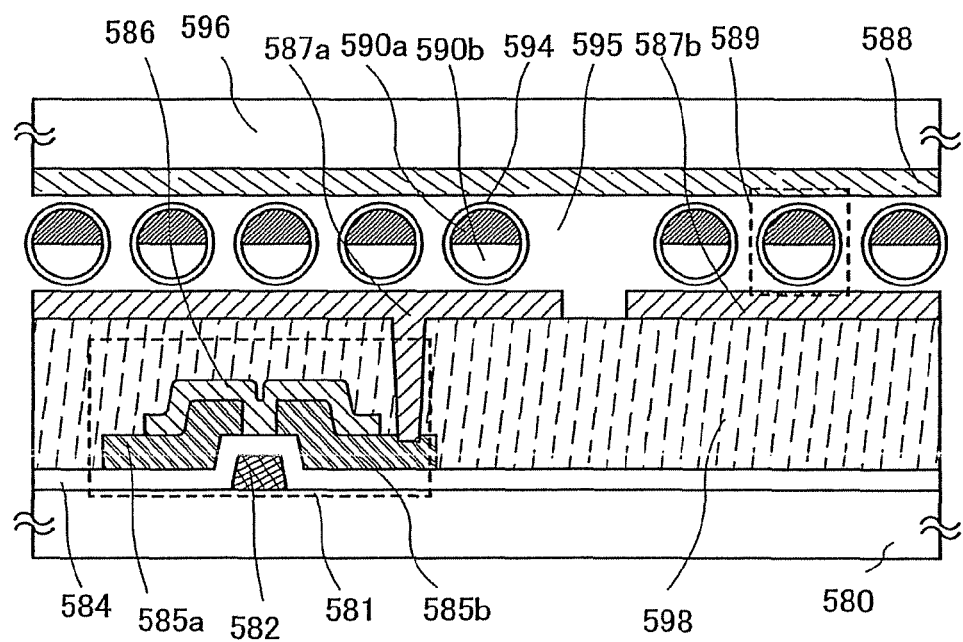
FIG. 21 is an explanatory view of a display device of the present invention.

FIG. 21 shows an active matrix type electronic paper to which the present invention is applied. Although FIG. 21 shows an active matrix type one, the present invention can also be applied to a passive matrix type one.

A twist ball display system may be used for the electronic paper. A twist ball display system means a method in which spherical particles each colored in black and white are arranged between a first electrode layer and a second electrode layer, and a potential difference is generated between the first electrode layer and the second electrode layer so as to control directions of the spherical particles, so that display is performed.

A transistor 581 over a substrate 580 is a reverse coplanar type thin film transistor, and includes a gate electrode layer 582, a gate insulating layer 584, wiring layers 585a and 585b, and a semiconductor layer 586. In addition, the wiring layer 585b is in contact with and electrically connected to first electrode layers 587a and 587b through an opening formed in an insulating layer 598. Between the first electrode layers 587*a* and 587*b*, and a second electrode layer 588 on a counter substrate 596, spherical particles 589 each including a black region 590*a* and a white region 590*b* are provided, and on the periphery thereof, a cavity 594 which is filled with liquid, is provided. The circumference of the spherical particle 589 is filled with a filler 595 such as resin or the like (refer to FIG. 21).

In this embodiment mode, a gate electrode layer, a semiconductor layer, a source electrode layer, a drain electrode layer, an electrode layer, and the like can be processed using a mask layer which is formed selectively and precisely in a plurality of steps by a droplet discharge method or the like as shown in Embodiment Mode 1. Accordingly, the process can be simplified, loss of materials can be prevented, and the cost can be reduced.

The wiring layer 585*b* is electrically connected to the first electrode layer 587*a* in the opening formed in the insulating layer 598. The opening formed in the insulating layer 598 can be formed by irradiation with a laser beam as shown in Embodiment Mode 2. In this embodiment mode, the wiring layer 585*b* is formed using a low-melting point metal that is relatively easily evaporated (chromium in this embodiment mode). The wiring layer 585*b* is selectively irradiated with a laser beam from the insulating layer 598 side, whereby part of an irradiated region of the wiring layer 585*b* is evaporated by irradiation energy. The insulating layer 598 over the irradiated region of the wiring layer 585*b* is removed, and the opening can be formed. The first electrode layer 587*a* is formed in the opening where the wiring layer 585*b* is exposed, and the wiring layer 585*b* and the first electrode layer 587*a* can be electrically connected to each other.

Further, instead of the twist ball, an electrophoretic element can also be used. A microcapsule having a diameter of 10 to 20 µm which is filled with transparent liquid, positively charged white microparticles, and negatively charged black microparticles and sealed, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is called an electronic paper in general. The electrophoretic display element has higher reflectivity than a liquid crystal display element, and thus, an assistant light is unnecessary, power consumption is low, and a display portion can be recognized also in a dusky place. Even when electric power is not supplied to the display portion, an image which has been displayed once can be stored. Thus, a displayed image can be stored even if a display device having a display function is distanced from a source of an electronic wave.

The transistor may have any structure as long as the transistor can serve as a switching element. As a semiconductor layer, various semiconductors such as an amorphous semiconductor, a crystalline semiconductor, a polycrystalline semiconductor, and a microcrystal semiconductor can be used, or an organic transistor may be formed using an organic compound.

In this embodiment mode, specifically, a case where a structure of a display device is an active matrix type is shown; however, of course, the present invention can also be applied to a passive matrix display device. Also in a passive matrix display device, when a wiring layer, an electrode layer, an insulating layer, and the like are processed into a desired pattern, a mask layer may be selectively manufactured by a droplet discharge method or the like as described in the present invention.

This embodiment mode can be appropriately combined with Embodiment Mode 1 or 2.

In accordance with the present invention, a component such as a wiring included in a display device can be formed into a desired shape. In addition, since complicated photolithography steps can be reduced and a display device can be manufactured through a simplified process, loss of materials and the cost can be reduced. Therefore, a high-performance and highly reliable display device can be manufactured with a high yield.

Embodiment Mode 11

Next, a mode of mounting a driver circuit on a display panel manufactured in accordance with Embodiment Modes 3 to 10 will be described.

First, a display device employing a COG method will be described with reference to FIG. 26A. A pixel portion 2701 for displaying information of characters, images, or the like and a protective circuit 2713 are provided over a substrate 2700. A substrate provided with a plurality of driver circuits is divided into rectangles, and a driver circuit 2751 after division (also referred to as a driver IC) is mounted on the substrate 2700. FIG. 26A shows a mode of mounting a plurality of driver ICs 2751 and FPCs 2750 on the ends of driver ICs 2751. In addition, the size obtained by division may be made almost the same as the length of a side of the pixel portion on a signal line side, and a tape may be mounted on the end of the single driver IC.

Alternatively, a TAB method may be employed. In that case, a plurality of tapes may be attached, and driver ICs may be mounted on the tapes as shown in FIG. 26B. Similarly to the case of a COG method, a single driver IC may be mounted on a single tape. In this case, a metal piece or the like for fixing the driver IC may be attached together in terms of the strength.

A plurality of driver ICs to be mounted on the display panel are preferably formed over a rectangular substrate having a side of 300 to 1000 mm or a side longer than 1000 mm for improvement in productivity.

In other words, a plurality of circuit patterns each including a driver circuit portion and an input-output terminal as a unit may be formed over a substrate and may be divided to be used. In consideration of the side length of the pixel portion or the pixel pitch, the driver IC may be formed to be a rectangle having a long side of 15 to 80 mm and a short side of 1 to 6 mm. Alternatively, the driver IC may be formed to have the side length that is the same as that of the pixel portion, or the length obtained by adding a side length of the pixel portion and a side length of each driver circuit.

An advantage of the external dimension of the driver IC over an IC chip is the length of the long side. When the driver IC having a long side length of 15 to 80 mm is used, the number of the driver ICs necessary for being mounted in accordance with the pixel portion is smaller than that in the case of using an IC chip. Therefore, a yield in manufacturing can be improved. When a driver IC is formed over a glass substrate, there is no limitation on the shape of the substrate used as a base; therefore, productivity is not decreased. This is a great advantage compared to the case where IC chips are taken out of a circular silicon wafer.

When a scanning line driver circuit 3702 is formed to be integrated over a substrate as shown in FIG. 25B, a driver IC provided with a signal line driver circuit is mounted on a region on the outer side of a pixel portion 3701. The driver IC is a signal line driver circuit. In order to form a pixel portion corresponding to RGB full color, 3072 signal lines are necessary for an XGA class and 4800 signal lines are necessary for a UXGA class. The signal lines formed in such a number are divided into several blocks at the end portion of the pixel portion 3701, and leading lines are formed. The signal lines are gathered corresponding to the pitches of output terminals of the driver ICs.

The driver IC is preferably formed using a crystalline semiconductor formed over a substrate. The crystalline semiconductor is preferably formed by being irradiated with a continuous wave laser beam. Therefore, a continuous wave solid-state or gas laser is used for an oscillator for generating the laser beam. There are few crystal defects when a continuous wave laser is used, and as a result, a transistor can be manufactured using a polycrystalline semiconductor layer having a large grain size. In addition, high-speed driving is possible since mobility and response speed are favorable, and it is possible to further improve an operating frequency of an element than that of the conventional element. Therefore, high reliability can be obtained since there is little variation in characteristics. It is to be noted that a channel length direction of the transistor and a moving direction of a laser beam over the substrate are preferably arranged in the same direction in order to further improve the operating frequency. This is because the highest mobility can be obtained when a channel length direction of a transistor and a moving direction of a laser beam over a substrate are almost parallel to each other (preferably, −30° to 30°) in a step of laser crystallization with a continuous wave laser. It is to be noted that the channel length direction corresponds to a current-flowing direction, in other words, a direction in which electric charge moves in a channel formation region. The thus manufactured transistor has an active layer including a polycrystalline semiconductor layer in which crystal grains are extended in the channel length direction, and this means that crystal grain boundaries are formed almost along the channel length direction.

In order to perform laser crystallization, it is preferable to significantly narrow the laser beam, and the shape of the laser beam (beam spot) preferably has the width that is the same as a short side of the driver ICs, which is greater than or equal to 1 mm and less than or equal to 3 mm. In addition, in order to secure an enough and effective energy density for an object to be irradiated, an irradiated region with the laser beam preferably has a linear shape. The term "linear" used herein refers to not a line in a strict sense but a rectangle or an oblong with a large aspect ratio. For example, the linear shape refers to a rectangle or an oblong with an aspect ratio of greater than or equal to 2 (preferably greater than or equal to 10 and less than or equal to 10000). Thus, by making a width of the laser beam shape (beam spot) the same length as a short side of the driver ICs, a method for manufacturing a display device, of which productivity is improved, can be provided.

As shown in FIGS. 26A and 26B, driver ICs may be mounted as both the scanning line driver circuit and the signal line driver circuit. In this case, it is preferable to use the driver ICs having different specifications for the scanning line driver circuit and the signal line driver circuit.

In the pixel portion, the signal line and the scanning line intersect to form a matrix; and a transistor is arranged at a portion corresponding to each intersection. One feature of the present invention is that TFTs having an amorphous semiconductor or a semi-amorphous semiconductor as a channel portion are used as the transistors arranged in the pixel portion. The amorphous semiconductor is formed by a method such as a plasma CVD method or a sputtering method. The semi-amorphous semiconductor can be formed by a plasma CVD method at temperatures of less than or equal to 300° C. A film thickness enough to form the transistor is formed in a short time even in the case of using, for example, a non-alkaline glass substrate having an external size of 550 mm×650 mm. The feature of such a manufacturing technique is effective in manufacturing a large-sized display device. In addition, a semi-amorphous TFT can obtain field effect mobility of 2 to 10 cm$^2$/V·sec by formation of a channel formation region using a SAS. When the present invention is applied, a minute wiring can be stably formed without a defect such as a short circuit since a pattern can be formed into a desired shape with high controllability. Thus, a display panel in which system-on-panel is realized can be manufactured.

The scanning line driver circuit can also be formed to be integrated over the substrate with the use of a TFT having a semiconductor layer formed of a SAS. When a TFT having a semiconductor layer formed of an AS is used, the driver ICs may be mounted as both the scanning line driver circuit and the signal line driver circuit.

In that case, it is preferable to use the driver ICs having different specifications for the scanning line driver circuit and the signal line driver circuit. For example, a transistor included in the scanning line driver IC is required to withstand a voltage of approximately 30 V; however, since a drive frequency is less than or equal to 100 kHz, high-speed operation is not required relatively. Therefore, it is preferable to set a channel length (L) of the transistor included in the scanning line driver sufficiently long. On the other hand, a transistor of the signal line driver IC is required to withstand a voltage of only approximately 12 V; however, since a drive frequency is around 65 MHz at 3 V, high-speed operation is required. Therefore, it is preferable to set a channel length or the like of the transistor included in a driver on a micron rule.

A method for mounting the driver IC is not particularly limited, and a COG method, a wire bonding method, or a TAB method can be employed.

When the thicknesses of the driver IC and the counter substrate are set equal to each other, the heights of the driver IC and the counter substrate are almost equal, which contributes to thinning of a display device as a whole. When both substrates are formed from the same material, thermal stress is not generated and characteristics of a circuit formed from a TFT are not damaged even when a temperature change is caused in the display device. Furthermore, the number of the driver ICs to be mounted for one pixel portion can be reduced by mounting driver ICs having a longer side than IC chips as driver circuits as shown in this embodiment mode.

As described above, a driver circuit can be incorporated into a display panel.

Embodiment Mode 12

The following will describe an example of a display panel (an EL display panel or a liquid crystal display panel) manufactured in accordance with Embodiment Modes 3 to 10, in which a semiconductor layer is formed using an amorphous semiconductor or SAS and a scanning line driver circuit is formed over a substrate.

Figure 32:
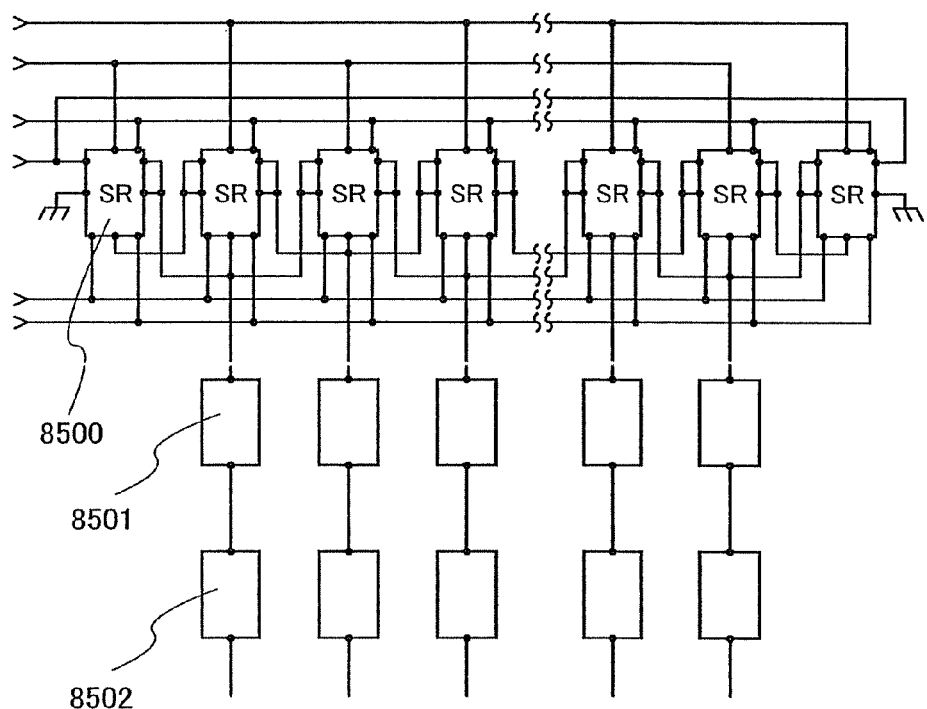
FIG. 32 is an explanatory diagram of a circuit configuration in a case where a scanning line driver circuit is formed using a TFT in a display panel of the present invention.

FIG. 32 is a block diagram of a scanning line driver circuit formed using an n-channel TFT that uses an SAS with an electron field-effect mobility of 1 to 15 cm$^2$/V·sec.

In FIG. 32, a block 8500 corresponds to a pulse output circuit outputting sampling pulses for one stage. A shift register includes n number of pulse output circuits. Reference numeral 8501 denotes a buffer circuit and a pixel 8502 is connected to the buffer circuit.

Figure 33:
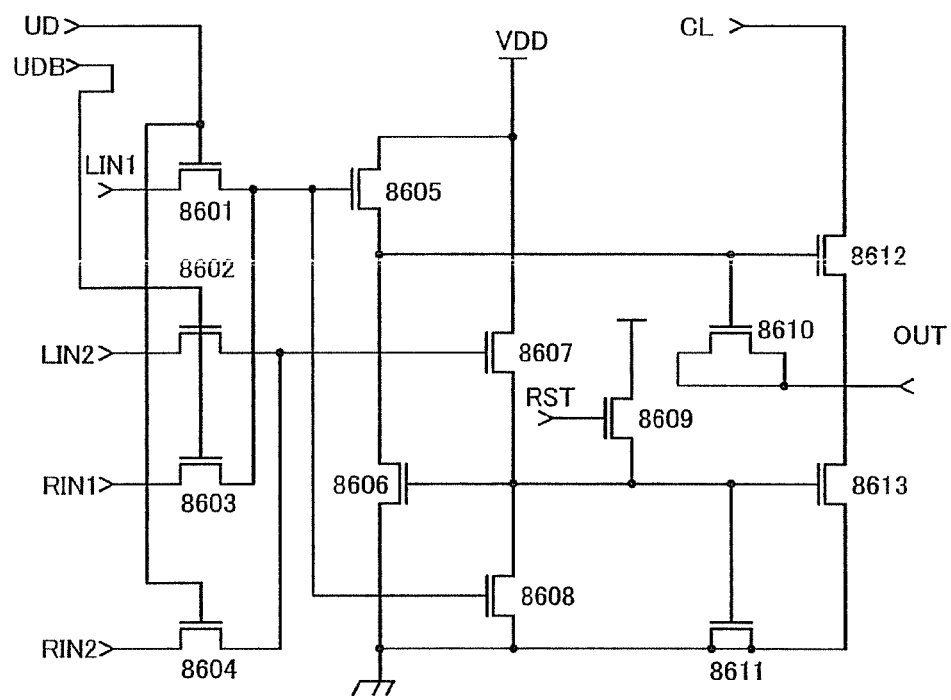
FIG. 33 is an explanatory diagram of a circuit configuration (shift register circuit) in a case where a scanning line driver circuit is formed using a TFT in a display panel of the present invention.

FIG. 33 shows a specific configuration of the pulse output circuit 8500, where the circuit includes n-channel TFTs 8601 to 8613. In this case, the sizes of the TFT's may be determined in consideration of operation characteristics of the n-channel TFTs using an SAS. For example, when the channel length is set to be 8 μm, the channel width can be set to be in the range of 10 to 80 μm.

Figure 34:
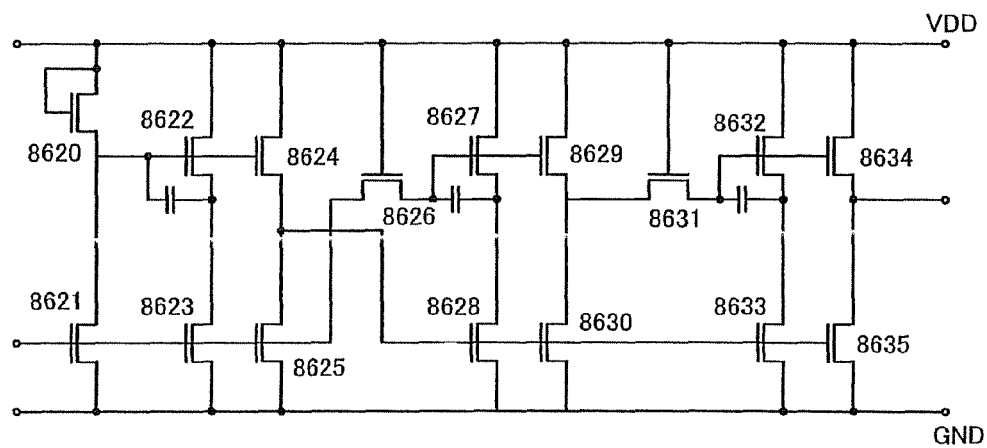
FIG. 34 is an explanatory diagram of a circuit configuration (buffer circuit) in a case where a scanning line driver circuit is formed using a TFT in a display panel of the present invention.

Further, a specific configuration of the buffer circuit 8501 is shown in FIG. 34. Similarly, the buffer circuit includes n-channel TFTs 8620 to 8635. In this case, the sizes of the TFTs may be determined in consideration of operation characteristics of the n-channel TFTs using an SAS. For example, when the channel length is set to be 10 μm, the channel width can be set to be in the range of 10 to 1800 μm.

In order to realize such a circuit, TFTs are necessary to be connected to one another with a wiring.

As described above, a driver circuit can be incorporated into a display panel.

Embodiment Mode 13

Figure 16:
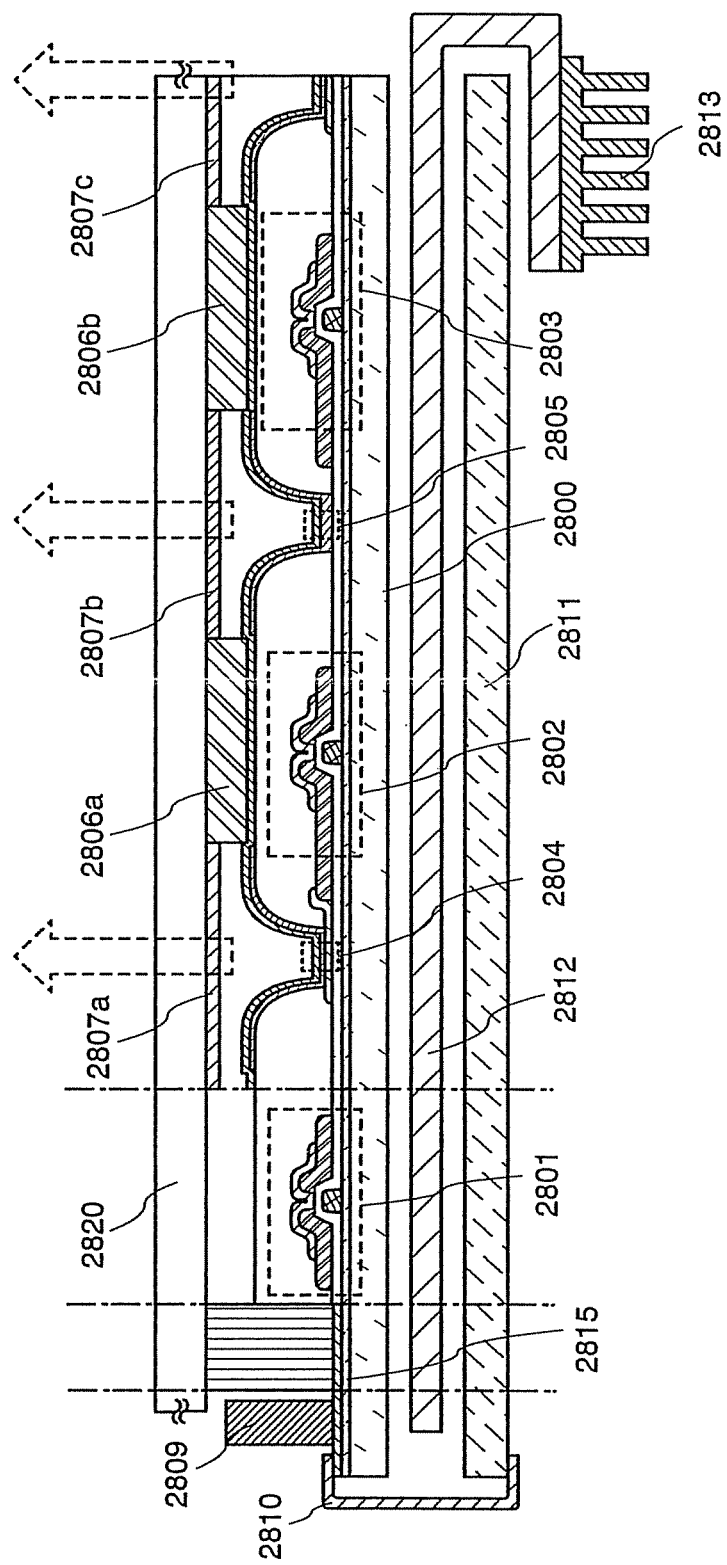
FIG. 16 is an explanatory cross-sectional view of a structural example of a display module of the present invention.

This embodiment mode will be described with reference to FIG. 16. FIG. 16 shows an example in which an EL display module is formed using a TFT substrate 2800 which is manufactured by the present invention. In FIG. 16, a pixel portion including pixels is formed over the TFT substrate 2800.

In FIG. 16, outside the pixel portion, a protective circuit portion 2801 is provided between a driver circuit and the pixel. The protective circuit portion 2801 may be provided with a TFT similar to that formed in a pixel. Alternatively, the protective circuit portion 2801 may operate similarly to a diode by connecting a gate and a source or a drain of such a TFT. A driver IC formed using a single crystalline semiconductor, a stick driver IC formed using a polycrystalline semiconductor film over a glass substrate, a driver circuit formed using an SAS, or the like is applied to a driver circuit 2809.

The TFT substrate 2800 is attached firmly to a sealing substrate 2820 with spacers 2806*a* and 2806*b* formed by a droplet discharging method interposed therebetween. The spacers are preferably provided to keep a distance between two substrates constant even when the substrate is thin or an area of the pixel portion is enlarged. A space between the TFT substrate 2800 and the sealing substrate 2820 over light-emitting elements 2804 and 2805 connected to TFTs 2802 and 2803, respectively, may be filled with a resin material having at least a light-transmitting property of visible light, and the resin material may be solidified. Alternatively, the space may be filled with anhydrous nitrogen or an inert gas.

FIG. 16 shows a case where the light-emitting elements 2804 and 2805 are of top emission type, which emit light in the direction of arrows shown in the drawing. Multicolor display can be performed by making each pixel to emit light of a different color of red, green, or blue. At this time, color purity of light emitted to an external portion can be improved by formation of colored layers 2807*a*, 2807*b*, and 2807*c* corresponding to respective colors on the sealing substrate 2820 side. Moreover, pixels which emit white light may be used and combined with the colored layers 2807*a*, 2807*b*, and 2807*c*.

The driver circuit 2809 which is an external circuit is connected to a scanning line connection terminal or a signal line connection terminal which is provided at one end of an external circuit board 2811 through a wiring board 2810. In addition, a heat pipe 2813 which is a highly efficient thermal conductive device with a pipe shape and a heat sink 2812, which are used for radiating heat to the external portion of the device, may be provided in contact with or adjacent to the TFT substrate 2800 to increase a heat radiation effect.

It is to be noted that FIG. 16 shows the top emission EL module; however, a bottom emission module may be employed by changing the structure of the light-emitting element or the arrangement of the external circuit board. Of course, a dual emission module in which light is emitted from both sides of the top and bottom surfaces may be used. In the case of top emission, an insulating layer serving as a partition wall may be colored and used as a black matrix. This partition wall can be formed by a droplet discharging method, and it may be formed by mixing a black resin of a pigment material, carbon black, or the like into a resin material such as polyimide. A stacked layer thereof may also be used.

In addition, in an EL display module, reflected light of light entering from an external portion may be blocked with the use of a retardation plate or a polarizing plate. In a top emission display device, an insulating layer serving as a partition wall may be colored and used as a black matrix. This partition wall can be formed by a droplet discharging method or the like. Carbon black or the like may be mixed into a black resin of a pigment material or a resin material such as polyimide to be used, and a stacked layer thereof may also be used. By a droplet discharging method, different materials may be discharged to the same region plural times to form the partition wall. A quarter wave plate or a half wave plate may be used as the retardation plate and may be designed to be able to control light. As the structure, the light-emitting element, the sealing substrate (sealing material), the retardation plate (quarter wave plate or half wave plate), and the polarizing plate are sequentially formed over a TFT element substrate, and light emitted from the light-emitting element is transmitted therethrough and emitted to an external portion from the polarizing plate side. The retardation plate or polarizing plate may be provided on a side to which light is emitted or may be provided on both sides in the case of a dual emission display device in which light is emitted from the both surfaces. In addition, an anti-reflective film may be provided on the outer side of the polarizing plate. Accordingly, higher-definition and precise images can be displayed.

As for the TFT substrate 2800, a sealing structure may be formed by attaching a resin film to the side where the pixel portion is formed, with the use of a sealing material or an adhesive resin. Although glass sealing using a glass substrate is shown in this embodiment mode, various sealing methods such as resin sealing using a resin, plastic sealing using plastics, and film sealing using a film can be adopted. A gas barrier film which prevents water vapor from penetrating the resin film is preferably provided over the surface of the resin film. By employing a film sealing structure, further reduction in thickness and weight can be achieved.

This embodiment mode can be combined with any of Embodiment Modes 1 to 7, 11, and 12.

Embodiment Mode 14

Figure 20A:
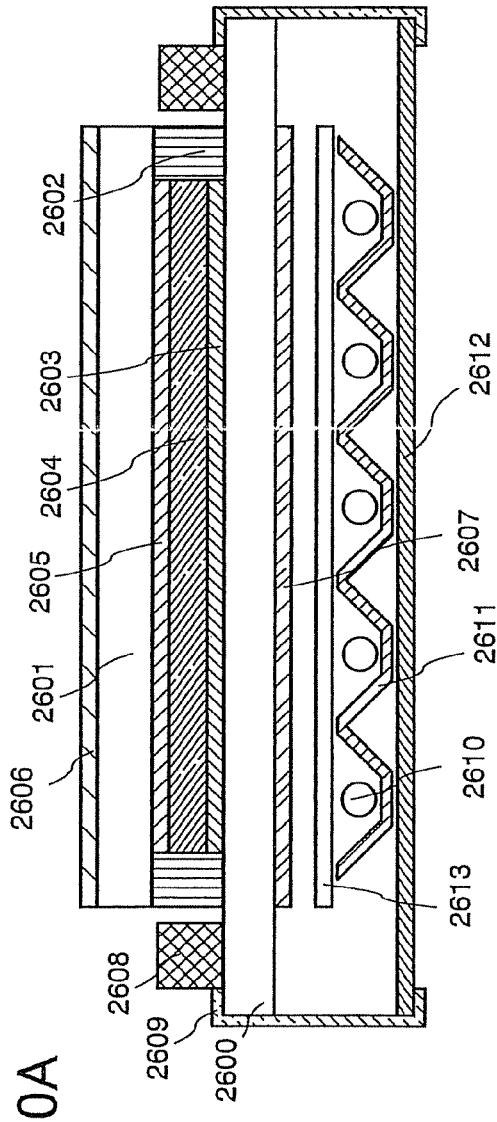
FIGS. 20A and 20B are explanatory cross-sectional views of a structural example of a display module of the present invention.
Figure 20B:
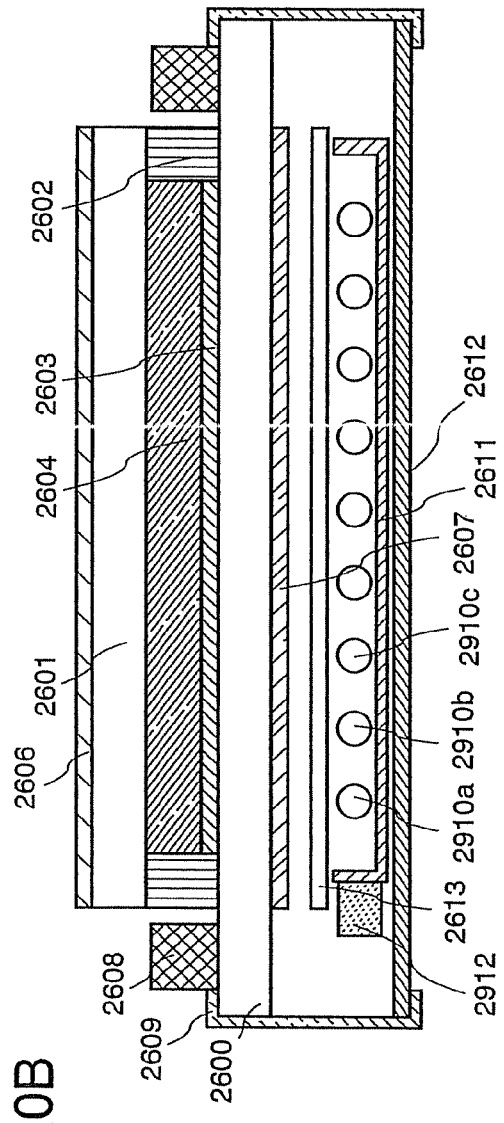

This embodiment mode will be described with reference to FIGS. 20A and 20B. FIGS. 20A and 20B show an example in which a liquid crystal display module is formed using a TFT substrate 2600 manufactured in accordance with the present invention.

FIG. 20A is an example of a liquid crystal display module. The TFT substrate 2600 and a counter substrate 2601 are firmly attached to each other with a sealing material 2602, and a pixel portion 2603 and a liquid crystal layer 2604 are provided therebetween, whereby a display region is formed. A colored layer 2605 is necessary for performing color display, and colored layers corresponding to red, green, and blue are provided for each pixel in the case of RGB mode. A polarizing plate 2606 is provided outside the counter substrate 2601, and a polarizing plate 2607 and a diffusing plate 2613 are provided outside the TFT substrate 2600. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit and a power source circuit. In addition, a retardation plate may be stacked between the polarizing plate and the liquid crystal layer.

For the liquid crystal display module, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti-Ferroelectric Liquid Crystal), or the like can be used.

FIG. 20B shows an example of an FS-LCD (Field Sequential-LCD) in which an OCB mode is applied to the liquid crystal display module of FIG. 20A. The FS-LCD emits light of red, green, and blue during one frame period and can perform color display by combining images using time division. Since light of each color is emitted by a light-emitting diode, a cold cathode tube, or the like, a color filter is not necessary. Thus, it is not necessary to arrange color filters of three primary colors and restrict the display region of each color, and display of all three colors can be performed in any region. Meanwhile, since light of three colors is emitted during one frame period, high-speed response is required for a liquid crystal. By employing an FLC mode liquid crystal layer, an OCB mode liquid crystal layer, or the like using an FS method to a display device of the present invention, a display device or a liquid crystal television set with high performance and high image quality can be completed.

A liquid crystal layer of an OCB mode has a so-called π-cell structure. In the π-cell structure, liquid crystal molecules are aligned so that their pretilt angles are plane-symmetric along a center plane between an active matrix substrate and a counter substrate. An orientation state of a liquid crystal of a π-cell structure is splay-orientation when a voltage is not applied between the substrates, and then shifts to bend-orientation when a voltage is applied therebetween. In this bend orientation state, white display is obtained. When a voltage is applied further, liquid crystal molecules of bend-orientation get orientated perpendicular to the both substrates so that light is not transmitted. With the OCB mode, response with about 10-times-higher speed than a conventional TN mode can be achieved.

Moreover, as a mode for the FS method, an HV (Half-V)-FLC or an SS (Surface stabilized)-FLC using a ferroelectric liquid crystal (FLC) capable of high-speed operation, or the like can also be used. The OCB mode uses a nematic liquid crystal having relatively low viscosity, while the HV-FLC or the SS-FLC uses a smectic liquid crystal having a ferroelectric phase.

Moreover, optical response speed of a liquid crystal display module gets higher by narrowing the cell gap of the liquid crystal display module. In addition, the optical response speed can also get higher by decreasing the viscosity of the liquid crystal material. The increase in response speed is particularly advantageous when a pixel pitch in a pixel portion of a TN mode liquid crystal display module is less than or equal to 30 μm. Also, further increase in response speed is possible by an overdrive method in which applied voltage is increased (or decreased) for a moment.

FIG. 20B shows a transmissive liquid crystal display module, in which a red light source 2910a, a green light source 2910b, and a blue light source 2910c are provided as light sources. The light sources are provided with a control portion 2912 in order to switch on or off the red light source 2910a, the green light source 2910b, and the blue light source 2910c. The control portion 2912 controls light emission of each color, light enters the liquid crystal, and images are combined with the use of time division, whereby color display is performed.

As described above, a high definition and highly reliable liquid crystal display module can be manufactured with the use of the present invention.

This embodiment mode can be combined with any of Embodiment Modes 1, 2, 8, 9, 11, and 12.

Embodiment Mode 15

Figure 27:
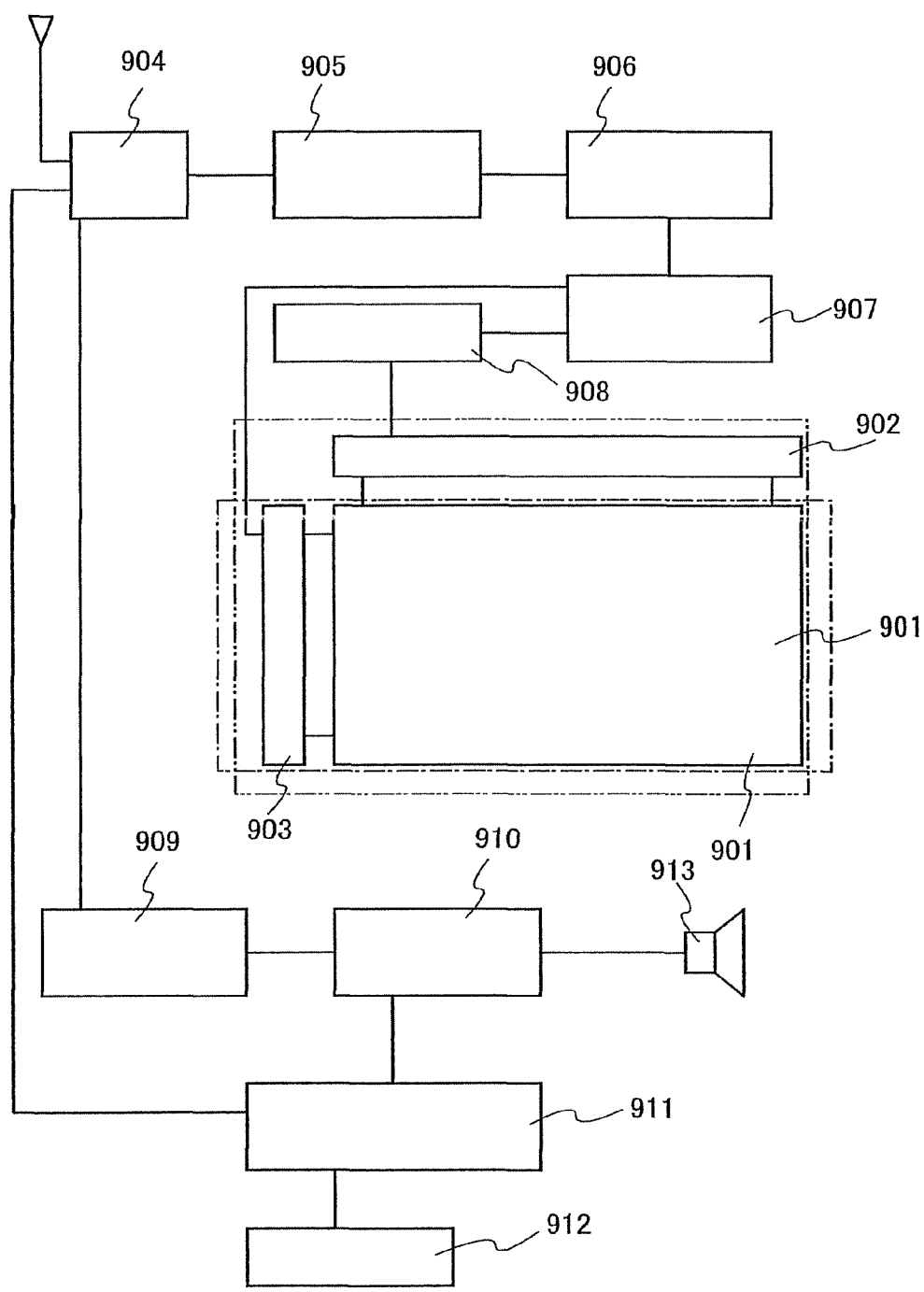
FIG. 27 is a block diagram showing a main structure of an electronic device to which the present invention is applied.

A television set (also referred to as simply a TV or a television receiver) can be completed using a display device formed in accordance with the present invention. FIG. 27 is a block diagram showing a main structure of a television set.

FIG. 25A is a top view showing a structure of a display panel in accordance with the present invention. A pixel portion 2701 in which pixels 2702 are arranged in matrix, a scanning line input terminal 2703, and a signal line input terminal 2704 are formed over a substrate 2700 having an insulating surface. The number of pixels may be determined in accordance with various standards. In the case of XGA of RGB full color display, the number of pixels may be 1024×768×3 (RGB). In the case of UXGA of RGB full color display, the number of pixels may be 1600×1200×3 (RGB), and in the case of full-spec high-definition RGB full color display, the number of pixels may be 1920×1080×3 (RGB).

The pixels 2702 are formed in a matrix by intersections of scanning lines extended from the scanning line input terminal 2703 and signal lines extended from the signal line input terminal 2704. Each pixel 2702 in the pixel portion 2701 is provided with a switching element and a pixel electrode layer connected to the switching element. A typical example of the switching element is a TFT. The gate electrode layer side of the TFT is connected to a scanning line, and a source or drain side of the TFT is connected to a signal line, which enables each pixel to be independently controlled by a signal input from an external portion.

FIG. 25A shows a structure of a display panel in which a signal to be input to a scanning line and a signal line is controlled by an external driver circuit. Alternatively, a driver IC 2751 may be mounted on the substrate 2700 by a COG (Chip on Glass) method as shown in FIG. 26A. As another mounting mode, a TAB (Tape Automated Bonding) method may also be used as shown in FIG. 26B. The driver IC may be formed over a single crystal semiconductor substrate or may be formed with a TFT over a glass substrate. In FIGS. 26A and 26B, the driver IC 2751 is connected to an FPC (flexible printed circuit) 2750.

When a TFT provided in a pixel is formed from a semiconductor having crystallinity, a scanning line driver circuit 3702 can be formed over a substrate 3700 as shown in FIG. 25B. In FIG. 25B, a pixel portion 3701 is controlled by an external driver circuit connected to a signal line input terminal 3704 as in FIG. 25A. When a TFT in a pixel is formed from a poly-crystalline (microcrystalline) semiconductor, a single crystal semiconductor, or the like having high mobility, a pixel portion 4701, a scanning line driver circuit 4702, and a signal line driver circuit 4704 can be formed to be integrated over a glass substrate 4700 as shown in FIG. 25C.

In FIG. 27, a display panel can be formed in any mode as follows: as the structure shown in FIG. 25A, only a pixel portion 901 is formed, and a scanning line driver circuit 903 and a signal line driver circuit 902 are mounted by a TAB method as shown in FIG. 26B or by a COG method as shown in FIG. 26A; a TFT is formed, and a pixel portion 901 and a scanning line driver circuit 903 are formed to be integrated over a substrate, and a signal line driver circuit 902 is separately mounted as a driver IC as shown in FIG. 25B; a pixel portion 901, a signal line driver circuit 902, and a scanning line driver circuit 903 are formed to be integrated over the substrate as shown in FIG. 25C; and the like.

In FIG. 27, as a structure of other external circuits, a video signal amplifier circuit 905 that amplifies a video signal among signals received by a tuner 904, a video signal processing circuit 906 that converts the signals output from the video signal amplifier circuit 905 into chrominance signals corresponding to each color of red, green, and blue, a control circuit 907 that converts the video signal so as to be input to a driver IC, and the like are provided on an input side of the video signal. The control circuit 907 outputs signals to both a scanning line side and a signal line side. In the case of digital driving, a signal dividing circuit 908 may be provided on the signal line side and an input digital signal may be divided into m pieces to be supplied.

Among signals received by the tuner 904, an audio signal is transmitted to an audio signal amplifier circuit 909, and the output thereof is supplied to a speaker 913 through an audio signal processing circuit 910. A control circuit 911 receives control information on a receiving station (a receiving frequency) or sound volume from an input portion 912 and transmits the signal to the tuner 904 or the audio signal processing circuit 910.

Figure 28A:
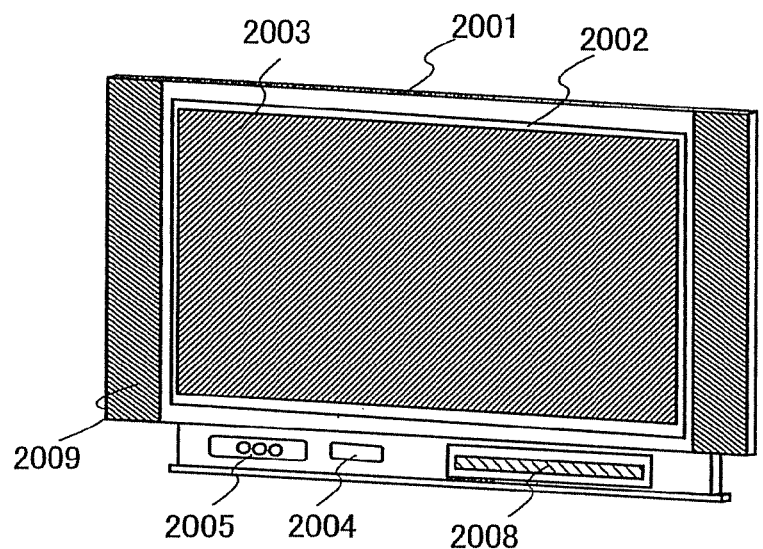
FIGS. 28A and 28B are views showing electronic devices to which the present invention is applied.
Figure 28B:
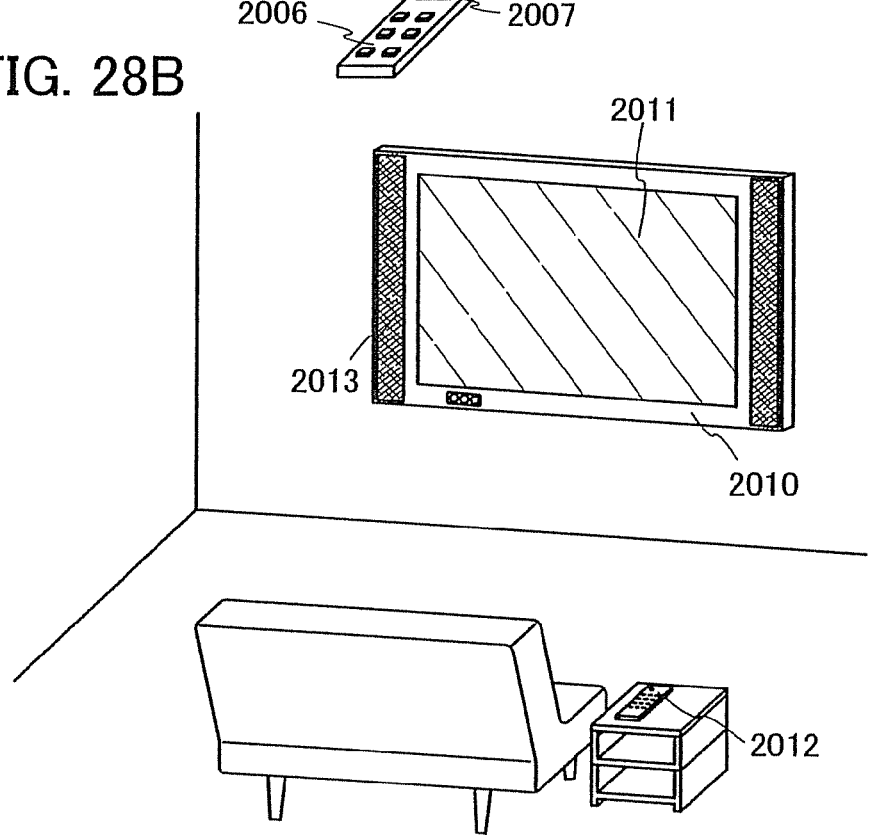

A television set can be completed by incorporating the display module into a chassis as shown in FIGS. 28A and 28B. When a liquid crystal display module is used as a display module, a liquid crystal television set can be manufactured. When an EL display module is used, an EL television set can be manufactured. Alternatively, a plasma television, electronic paper, or the like can be manufactured. In FIG. 28A, a main screen 2003 is formed by using the display module, and a speaker portion 2009, an operation switch, and the like are provided as its accessory equipment. Thus, a television set can be completed in accordance with the present invention.

A display panel 2002 is incorporated into a chassis 2001. With the use of a receiver 2005, in addition to reception of general TV broadcast, information communication can also be carried out in one way (from a transmitter to a receiver) or in two ways (between a transmitter and a receiver or between receivers) by connection to a communication network by a fixed line or wirelessly through a modem 2004. The operation of the television set can be carried out by switches incorporated in the chassis or by a remote control device 2006, which is separated from the main body. A display portion 2007 that displays information to be output may also be provided in this remote control device.

In addition, in the television set, a structure for displaying a channel, sound volume, or the like may be additionally provided by formation of a sub-screen 2008 with a second display panel in addition to the main screen 2003. In this structure, the main screen 2003 and the sub-screen 2008 can be formed using a liquid crystal display panel of the present invention. Alternatively, the main screen 2003 may be formed using an EL display panel superior in viewing angle, and the sub-screen 2008 may be formed using a liquid crystal display panel capable of display with low power consumption. In order to prioritize low power consumption, a structure in which the main screen 2003 is formed using a liquid crystal display panel, the sub-screen 2008 is formed using an EL display panel, and the sub-screen is able to flash on and off may also be employed. In accordance with the present invention, a highly reliable display device can be manufactured even by using such a large substrate with many TFTs and electronic parts.

FIG. 28B shows a television set having a large display portion, e.g. 20-inch to 80-inch display portion, which includes a chassis 2010, a display portion 2011, a remote control device 2012 which is an operation portion, a speaker portion 2013, and the like. The present invention is applied to manufacture the display portion 2011. The television set shown in FIG. 28B is a wall-hanging type, and does not require a wide space.

Of course, the present invention is not limited to the television set and is also applicable to various usages such as display mediums having a large area, for example, a monitor of a personal computer, an information display board at a train station, an airport, or the like, or an advertisement display board on the street.

This embodiment mode can be appropriately combined with any of Embodiment Modes 1 to 14.

Embodiment Mode 16

Electronic devices of the present invention include: television sets (also simply referred to as TVs or television receivers), cameras such as digital cameras and digital video cameras, mobile phone sets (also simply referred to as cellular phone sets or cellular phones), portable information terminals such as a PDA, portable game machines, monitors for computers, computers, audio reproducing devices such as car audio sets, image reproducing devices provided with a recording medium such as home-use game machines, and the like. Specific examples thereof will be described with reference to FIGS. 29A to 29E.

Figure 29A:
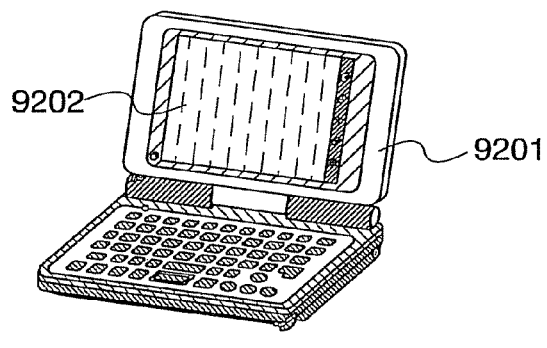
FIGS. 29A to 29E are views showing electronic devices to which the present invention is applied.

A portable information terminal shown in FIG. 29A includes a main body 9201, a display portion 9202, and the like. The display device of the present invention can be applied to the display portion 9202. As a result, since the display device of the present invention can be manufactured through a simplified process at low cost, a portable information terminal which is highly reliable can be provided at low cost.

Figure 29B:
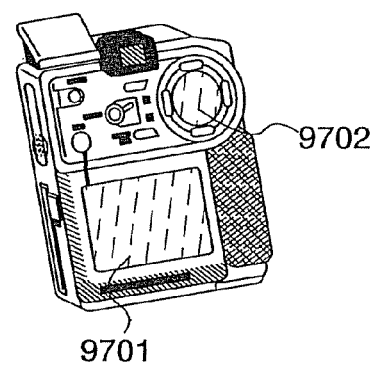

A digital video camera shown in FIG. 29B includes a display portion 9701, a display portion 9702, and the like. The display device of the present invention can be applied to the display portion 9701. As a result, since the display device of the present invention can be manufactured through a simplified process at low cost, a digital video camera which is highly reliable can be provided at low cost.

Figure 29C:
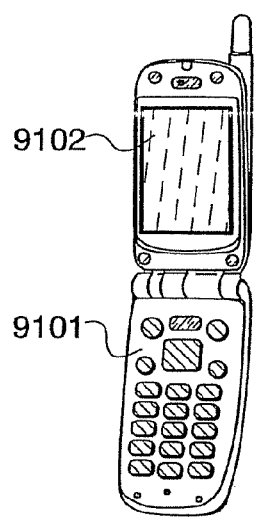

A cellular phone set shown in FIG. 29C includes a main body 9101, a display portion 9102, and the like. The display device of the present invention can be applied to the display portion 9102. As a result, since the display device of the present invention can be manufactured through a simplified process at low cost, a cellular phone set which is highly reliable can be provided at low cost.

Figure 29D:
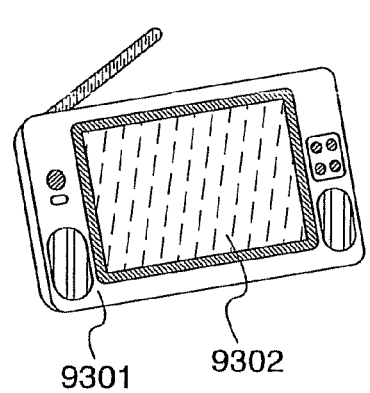

A portable television set shown in FIG. 29D includes a main body 9301, a display portion 9302, and the like. The display device of the present invention can be applied to display portion 9302. As a result, since the display device of the present invention can be manufactured through a simplified process at low cost, a portable television set which is highly reliable can be provided at low cost. The display device of the present invention can be applied to various types of television sets including a small-sized television mounted on a portable terminal such as a cellular phone set, a medium-sized television that is portable, and a large-sized television (for example, 40 inches or more in size).

Figure 29E:
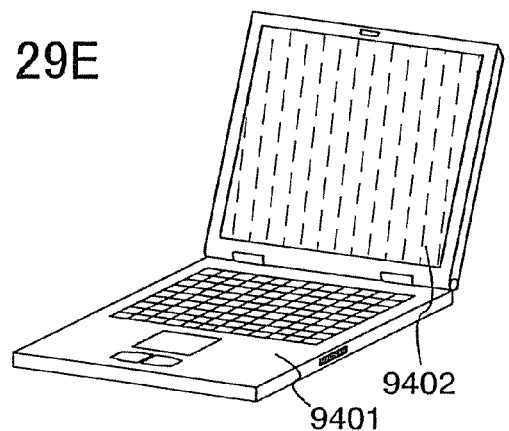

A portable computer shown in FIG. 29E includes a main body 9401, a display portion 9402, and the like. The display device of the present invention can be applied to the display portion 9402. As a result, since the display device of the present invention can be manufactured through a simplified process at low cost, a portable computer which is highly reliable can be provided at low cost.

As described above, with the use of the display device of the present invention, high-performance electronic devices that can display an image with high quality and excellent visibility can be provided.

This embodiment mode can be appropriately combined with any of Embodiment Modes 1 to 15.

This application is based on Japanese Patent Application serial no. 2006-184713 filed in Japan Patent Office on Jul. 4, 2006, the entire contents of which are hereby incorporated by reference.

What is claimed is:

1. A method for manufacturing a semiconductor device, comprising:
    forming a conductive layer;
    forming an insulating layer over the conductive layer;
    forming an opening in the conductive layer and the insulating layer by selectively irradiating the conductive layer and the insulating layer with a laser beam; and
    forming a conductive film in the opening so as to be in contact with the conductive layer,
    wherein, in the step of the formation of the opening, an irradiated region of the conductive layer is evaporated by the laser beam, and a part of the insulating layer is subsequently removed by the evaporation of the irradiated region of the conductive layer.

2. A method for manufacturing a semiconductor device according to claim 1, wherein the conductive layer comprises at least one of chromium, molybdenum, nickel, titanium, cobalt, copper, and aluminum.

3. A method for manufacturing a semiconductor device according to claim 1, wherein the laser beam is transmitted through the insulating layer.

4. A method for manufacturing a semiconductor device according to claim 1, wherein the insulating layer comprises an organic resin.

5. A method for manufacturing a semiconductor device according to claim 1, wherein the semiconductor device is incorporated into one selected from the group consisting of a television set, an information terminal, a video camera, a cellular phone and a computer.

6. A method for manufacturing a semiconductor device, comprising:
    forming a first conductive layer;
    forming a second conductive layer over the first conductive layer;
    forming an insulating layer over the first conductive layer and the second conductive layer;
    forming an opening in the second conductive layer and the insulating layer by selectively irradiating the first conductive layer, the second conductive layer, and the insulating layer with a laser beam; and
    forming a conductive film in the opening so as to be in contact with the first conductive layer and the second conductive layer,
    wherein, in the step of the formation of the opening, an irradiated region of the second conductive layer is evaporated by the laser beam, and a part of the insulating layer is subsequently removed by the evaporation of the irradiated region of the second conductive layer.

7. A method for manufacturing a semiconductor device according to claim 6, wherein the second conductive layer comprises at least one of chromium, molybdenum, nickel, titanium, cobalt, copper, and aluminum.

8. A method for manufacturing a semiconductor device according to claim 6, wherein the laser beam is transmitted through the insulating layer.

9. A method for manufacturing a semiconductor device according to claim 6, wherein the insulating layer comprises an organic resin.

10. A method for manufacturing a semiconductor device according to claim 6, wherein the semiconductor device is incorporated into one selected from the group consisting of a television set, an information terminal, a video camera, a cellular phone and a computer.

11. A method for manufacturing a semiconductor device, comprising:
    forming a conductive layer;
    forming an insulating layer over the conductive layer;
    forming an opening in the conductive layer and the insulating layer by selectively irradiating the conductive layer and the insulating layer with a laser beam; and
    forming a conductive film in the opening so as to be in contact with remained portions of the conductive layer,
    wherein, in the step of the formation of the opening, an irradiated region of the conductive layer is evaporated by the laser beam, and a part of the insulating layer is subsequently removed by the evaporation of the irradiated region of the conductive layer.

12. A method for manufacturing a semiconductor device according to claim 11, wherein the conductive layer comprises at least one of chromium, molybdenum, nickel, titanium, cobalt, copper, and aluminum.

13. A method for manufacturing a semiconductor device according to claim 11, wherein the laser beam is transmitted through the insulating layer.

14. A method for manufacturing a semiconductor device according to claim 11, wherein the insulating layer comprises an organic resin.

15. A method for manufacturing a semiconductor device according to claim 11, wherein the semiconductor device is incorporated into one selected from the group consisting of a television set, an information terminal, a video camera, a cellular phone and a computer.

16. A method for manufacturing a semiconductor device, comprising:
    forming a first conductive layer;
    forming a second conductive layer over the first conductive layer;
    forming an insulating layer over the first conductive layer and the second conductive layer;
    forming an opening in the second conductive layer and the insulating layer by selectively irradiating the first conductive layer, the second conductive layer, and the insulating layer with a laser beam; and
    forming a conductive film in the opening so as to be in contact with remained portions of the second conductive layer,
    wherein, in the step of the formation of the opening, an irradiated region of the second conductive layer is evaporated by the laser beam, and a part of the insulating layer is subsequently removed by the evaporation of the irradiated region of the second conductive layer.

17. A method for manufacturing a semiconductor device according to claim 16, wherein the second conductive layer comprises at least one of chromium, molybdenum, nickel, titanium, cobalt, copper, and aluminum.

18. A method for manufacturing a semiconductor device according to claim 16, wherein the laser beam is transmitted through the insulating layer.

19. A method for manufacturing a semiconductor device according to claim 16, wherein the insulating layer comprises an organic resin.

20. A method for manufacturing a semiconductor device according to claim 16, wherein the semiconductor device is incorporated into one selected from the group consisting of a television set, an information terminal, a video camera, a cellular phone and a computer.

* * * * *